(12) United States Patent
Fuji et al.

(10) Patent No.: US 8,111,488 B2
(45) Date of Patent: Feb. 7, 2012

(54) MAGNETIC MULTILAYERED FILM CURRENT ELEMENT

(75) Inventors: Yoshihiko Fuji, Kawasaki (JP); Hideaki Fukuzawa, Kawasaki (JP); Hiromi Yuasa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 910 days.

(21) Appl. No.: 12/155,924

(22) Filed: Jun. 11, 2008

(65) Prior Publication Data
US 2008/0311431 A1 Dec. 18, 2008

(30) Foreign Application Priority Data

Jun. 13, 2007 (JP) ................................ P2007-156848

(51) Int. Cl.
*G11B 5/39* (2006.01)
(52) U.S. Cl. ....................................................... 360/324
(58) Field of Classification Search .................. 360/320, 360/322, 324, 324.1, 324.11, 324.2
See application file for complete search history.

(56) References Cited

U.S. PATENT DOCUMENTS

| | | | |
|---|---|---|---|
| 5,304,975 A | 4/1994 | Saito et al. | |
| 5,313,186 A | 5/1994 | Schuhl et al. | |
| 5,448,515 A | 9/1995 | Fukami et al. | |
| 5,459,687 A | 10/1995 | Sakakima et al. | |
| 5,549,978 A | 8/1996 | Iwasaki et al. | |
| 5,768,181 A | 6/1998 | Zhu et al. | |
| 5,768,183 A | 6/1998 | Zhu et al. | |
| 6,002,553 A | 12/1999 | Stearns et al. | |
| 6,069,820 A * | 5/2000 | Inomata et al. | 365/171 |
| 6,205,008 B1 | 3/2001 | Gijs et al. | |
| 6,400,537 B2 | 6/2002 | Sakakima et al. | |
| 6,522,507 B1 | 2/2003 | Horng et al. | |
| 6,560,077 B2 * | 5/2003 | Fujiwara et al. | 360/324.1 |
| 6,603,642 B1 | 8/2003 | Araki et al. | |
| 6,636,391 B2 | 10/2003 | Watanabe et al. | |
| 6,686,068 B2 * | 2/2004 | Carey et al. | 428/811.3 |
| 6,784,509 B2 | 8/2004 | Yuasa et al. | |
| 6,905,780 B2 | 6/2005 | Yuasa et al. | |

(Continued)

FOREIGN PATENT DOCUMENTS

CN 1431651 7/2003

(Continued)

OTHER PUBLICATIONS

Zhu et al., "Microwave Assisted Magnetic Recording", *IEEE Transactions on Magnetics*, vol. 44, No. 1, Jan. 2008, pp. 125-131.

(Continued)

*Primary Examiner* — Angel A. Castro
(74) *Attorney, Agent, or Firm* — Nixon & Vanderhye, P.C.

(57) ABSTRACT

A magnetic multilayered film current element includes: at least one magnetic layer; at least one film structure containing a first insulating layer where a first opening is formed, a second insulating layer where a second opening is formed and a conductor disposed between the first insulating layer and the second insulating layer under the condition that a distance "A" between the first insulating layer and a portion of the second insulating layer at a position of the second opening is set larger than a closest distance "B" between the first insulating layer and the second insulating layer; and a pair of electrodes for flowing current to a magnetic multilayered film containing the at least one magnetic layer and the at least one film structure along a stacking direction of the magnetic multilayered film.

27 Claims, 27 Drawing Sheets

U.S. PATENT DOCUMENTS

| | | | |
|---|---|---|---|
| 6,930,864 B2* | 8/2005 | Santini | 360/322 |
| 6,937,446 B2 | 8/2005 | Kamiguchi et al. | |
| 7,002,781 B2* | 2/2006 | Sugawara | 360/324.11 |
| 7,050,276 B2* | 5/2006 | Nishiyama | 360/324.11 |
| 7,116,529 B2 | 10/2006 | Yoshikawa et al. | |
| 7,151,651 B1* | 12/2006 | Cross et al. | 360/319 |
| 7,190,558 B2 | 3/2007 | Iwasaki et al. | |
| 7,218,483 B2 | 5/2007 | Yuasa et al. | |
| 7,223,485 B2 | 5/2007 | Yuasa et al. | |
| 7,268,954 B2* | 9/2007 | Fujimoto | 359/676 |
| 7,280,321 B2* | 10/2007 | Watanabe et al. | 360/320 |
| 7,331,100 B2 | 2/2008 | Li et al. | |
| 7,390,529 B2 | 6/2008 | Li et al. | |
| 7,423,851 B2* | 9/2008 | Sbiaa | 360/324.2 |
| 7,428,127 B2* | 9/2008 | Nagasaka et al. | 360/324.1 |
| 7,514,117 B2 | 4/2009 | Fukuzawa et al. | |
| 2002/0048127 A1 | 4/2002 | Fukuzawa et al. | |
| 2002/0048128 A1 | 4/2002 | Kamiguchi et al. | |
| 2002/0051380 A1 | 5/2002 | Kamiguchi et al. | |
| 2002/0073785 A1 | 6/2002 | Prakash et al. | |
| 2003/0035256 A1 | 2/2003 | Hayashi et al. | |
| 2003/0123200 A1 | 7/2003 | Nagasaka et al. | |
| 2004/0021990 A1 | 2/2004 | Koui et al. | |
| 2004/0201929 A1 | 10/2004 | Hashimoto et al. | |
| 2006/0034022 A1 | 2/2006 | Fukuzawa et al. | |
| 2007/0172690 A1 | 7/2007 | Kim et al. | |

FOREIGN PATENT DOCUMENTS

| | | |
|---|---|---|
| JP | 2000-215414 | 8/2000 |
| JP | 2002-76473 | 3/2002 |
| JP | 2002-208744 | 7/2002 |
| JP | 2004-153248 | 5/2004 |

OTHER PUBLICATIONS

Zhu et al., "Microwave Assisted Magnetic Recording (MAMR)", *Data Storage Systems Center*, pp. 34 and 35 (B6).

S. Sanvito, et al., "Breakdown of the Resistor Model of CPP-GMR in Magnetic Multilayered Nanostructures", Physical Review B, vol. 61, No. 20, May 15, 2000, pp. 14225-14228.

Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317.

B. Dieny, et al., "Magnetotransport Properties of Magnetically Soft Spin-Value Structures (Invited)", J. Appl. Phys., vol. 69 (8), Apr. 15, 1991, pp. 4774-4779.

B. Dieny, et al., "Giant Magnetoresistance of Magnetically Soft Sandwiches: Dependence on Temperature and on Layer Thicknesses", Physical Review B., vol. 45, No. 2, Jan. 1, 1992, pp. 806-813.

D. Bozec, et al., "Comparative Study of the Magnetoresistance of MBS-Grown Multilayers: $[Fe/Cu/Co/Cu]_N$ and $[Fe/Cu]_N[Co/Cu]_N$", Physician Review B, vol. 60, No. 5, Aug. 1, 1999, pp. 3037-3039.

Hideaki Fukuzawa, et al. "MR Ratio Enhancement by NOL Current-Confined-Path Structures in CPP Spin Valves", IEEE Transactions on Magnetics, vol. 40, No. 4, pp., Jul. 2004, pp. 2236-2238.

Kamiguchi et al., U.S. Appl. No. 09/947,355, filed Sep. 7, 2001.

Fukuzawa et al., U.S. Appl. No. 11/199,448, filed Aug. 9, 2005.

* cited by examiner

FM/NM/FM/NM/FM 10,20 Film structure

Non-magnetic layer NM 10,20 Film structure

Non-magnetic layer NM 10,20 Film structure

Non-magnetic layer NM

Non-magnetic layer NM 10,20 Film structure 500a  500b  500c        500d 500a  500b  500c  500d  500e

MAGNETIC MULTILAYERED FILM CURRENT ELEMENT

CROSS-REFERENCE TO RELATED APPLICATIONS

This application is based upon and claims the benefit of priority from the prior Japanese Patent Application No. 2007-156848, filed on Jun. 13, 2007; the entire contents of which are incorporated herein by reference.

BACKGROUND OF THE INVENTION

1. Field of the Invention

The present invention relates to a magnetic multilayered film current element which is usable particularly as a magneto-resistance effect element.

2. Description of the Related Art

Recently, the miniaturization and the high density recording of a hard disk drive (HDD) is remarkably required and being progressed. The HDD of high density recording can be realized by narrowing the recording track width. However, the amplitude of the magnetization relating to the recording, that is, the recording signal may be lowered as the track width is narrowed, so that it is required that the reproducing sensitivity of the MR head for reproducing the medium signal is enhanced.

Recently, a GMR (Giant Magneto-Resistance effect) head with a high sensitive spin valve film using the GMR film is employed. The "spin valve" film has such a structure as sandwiching a non-magnetic metal spacer layer between two ferromagnetic layers. The stacking structure exhibiting the change in resistance may be called as a "spin dependent scattering unit". The magnetization of one ferromagnetic layer (often called as a "pinning layer" or "fixed magnetization layer) is fixed by the magnetization of an anti-ferromagnetic layer and the magnetization of the other ferromagnetic layer (often called as a "free layer" or "free magnetization layer") is rotated in accordance with an external magnetic field. With the spin valve film, the intended large magneto-resistance effect can be obtained when the relative angle in magnetization between the pinning layer and the free layer is changed.

A conventional spin valve film is formed as a CIP (Current In Plane)-GMR element, a CPP (Current Perpendicular to Plane)-GMR element and a TMR (Tunneling Magneto-Resistance) element. With the CIP-GMR element, a sense current is flowed along the film surface of the spin valve film. With the CPP-GMR element or the TMR element, a sense current is flowed in the direction perpendicular to the film surface thereof.

With the element which is utilized by flowing the sense current in the direction perpendicular to the film surface, the spacer layer is made of an insulating layer in the TMR element and of a metallic layer in the CPP-GMR element.

With the requirement of the much further miniaturization of the magneto-resistance effect element relating to the development of the magnetic head and the MRAM device as described above, it is required that the magneto-resistance effect element can exhibit a sufficient high MR ratio even though the magneto-resistance effect element is miniaturized.

BRIEF SUMMARY OF THE INVENTION

An aspect of the present invention relates to a magnetic multilayered film current element, including: at least one magnetic layer; at least one film structure containing a first insulating layer where a first opening is formed, a second insulating layer where a second opening is formed and a conductor disposed between the first insulating layer and the second insulating layer under the condition that a distance "A" between the first insulating layer and a portion of the second insulating layer is set larger than a distance "B" between the first insulating layer and the other portion of the second insulating layer; and a pair of electrodes for flowing current to a magnetic multilayered film containing the at least one magnetic layer and the at least one film structure along a stacking direction of the magnetic multilayered film.

An other aspect of the present invention relates to a magnetic multilayered film current element, including: at least one magnetic layer; at least one film structure containing a first insulating layer where a first opening is formed, a second insulating layer where a second opening is formed and a conductor disposed between the first insulating layer and the second insulating layer under the condition that the first insulating layer is partially connected with the second insulating layer and an area of the conductor in a direction parallel to a film surface thereof is set larger than areas of the first opening and the second opening.

DETAILED DESCRIPTION OF THE INVENTION

Hereinafter, the present invention will be described in detail with reference to the drawings. In embodiments, the composition of an alloy is designated by atomic %.

(Film Structure)

First of all, a film structure composing a magnetic multi-layered film current element will be described.

First Embodiment of Film Structure

Figure 1:
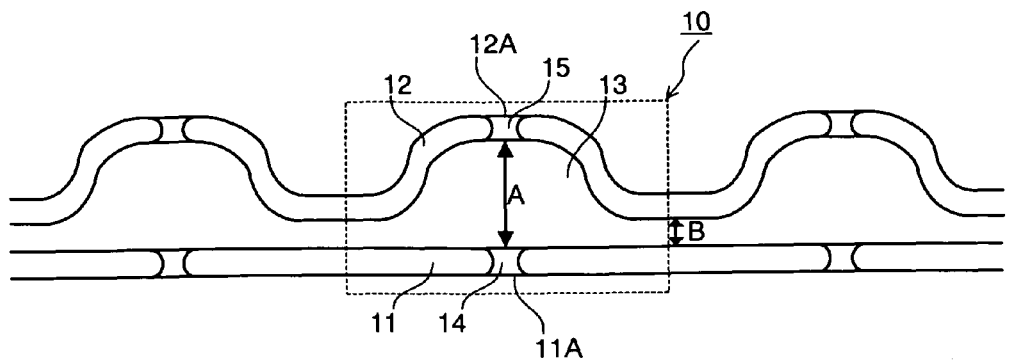
FIG. 1 is a cross sectional view showing a film structure according to a first embodiment.

FIG. 1 is a cross sectional view showing a film structure according to this embodiment. The drawings are schematically illustrated through FIG. 1 and the other figures, and the ratios of constituent films (layers) in the drawings may be different from the ratios of constituent films (layers) in a practical film structure.

A film structure 10 designated by the broken line in FIG. 1 includes a first insulating layer 11, a second insulating layer 12 and a first conducting layer 13 which is located between the first insulating layer 11 and the second insulating layer 12. Then, a first opening 11A and a second opening 12A are formed at the first insulating layer 11 and the second insulating layer 12, respectively, so that the first opening 11A is opposite to the second opening 12A. The distance "A" between the second insulating layer 12 and the first insulating layer 11 at the first opening 11A and the second opening 12A is set larger than the closest distance "B" between the first insulating layer 11 and the second insulating layer 12 so that the film structure 10 is shaped in barrel.

In this embodiment, a second conductor 14 and a third conductor 15 are formed in the first opening 11A and the second opening 12A, respectively. Therefore, the combination of the first insulating layer 11 and the second conductor 14 and the combination of the second insulating layer 12 and the third conductor 15 function as respective current confining layers when a current is flowed to the film structure 10 in the thickness direction thereof by applying a prescribed voltage to the film structure 10.

In FIG. 1, the plurality of barrel-shaped film structures 10 are arranged laterally, but the number of film structure may be determined on the sort of an intended magnetic multilayered film current element.

As described herein after, since the film structure 10 is formed as a minute structure in the order of nano-meter, the film structure 10 can exhibit various specific characteristics. For example, when a current is flowed to the film structure 10 in the thickness direction thereof, electrons are passed through the conductors 13 to 15, not through the first insulating layer 11 and the second insulating layer 12 so that a specific current characteristic in the film structure 10 utilizing the shape effect of nano-meter size can be expected.

The barrel shape is named by the inventors because the shape of the film structure 10 shown in FIG. 1 resembles a sake barrel.

Second Embodiment of Film Structure

Figure 2:
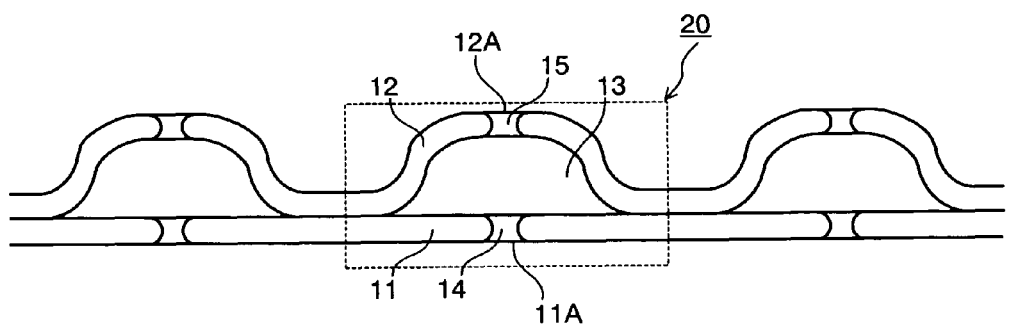
FIG. 2 is a cross sectional view showing a film structure according to a second embodiment.

FIG. 2 is a cross sectional view showing a film structure according to this embodiment. Like or corresponding constituent elements are designated by the same reference numerals.

A film structure 20 designated by the broken line in FIG. 2 includes the first insulating layer 11, the second insulating layer 12 and the first conducting layer 13 which is located between the first insulating layer 11 and the second insulating layer 12. Then, the first opening 11A and the second opening 12A are formed at the first insulating layer 11 and the second insulating layer 12, respectively, so that the first opening 11A is opposite to the second opening 12A. The distance "A" between the second insulating layer 12 and the first insulating layer 11 at the first opening 11A and the second opening 12A is set to an order of nano-meter as described in detail herein after. The first insulating layer 11 and the second insulating layer 12 are connected with one another at both sides of the first opening 11A and the second opening 12A.

Then, the area S of the first conductor 13 is set larger than the sizes (areas) of the first opening 11A and the second opening 12A.

In the film structure 20 in this embodiment, therefore, the first conductor 13 is enclosed by the first insulating layer 11 and the second insulating layer 12 so that the film structure 20 is shaped in barrel.

In this embodiment, the second conductor 14 and the third conductor 15 are formed in the first opening 11A and the second opening 12A, respectively. Therefore, the combination of the first insulating layer 11 and the second conductor 14 and the combination of the second insulating layer 12 and the third conductor 15 function as respective current confining layers when a current is flowed to the film structure 20 in the thickness direction thereof by applying a prescribed voltage to the film structure 20.

In FIG. 2, the plurality of barrel-shaped film structures 20 are arranged laterally, but the number of film structure may be determined on the sort of an intended magnetic multilayered film current element.

As described herein after, since the film structure 20 is formed as a minute structure in the order of nano-meter, the film structure 20 can exhibit various specific characteristics. For example, when a current is flowed to the film structure 20 in the thickness direction thereof, electrons are passed through the conductors 13 to 15, not through the first insulating layer 11 and the second insulating layer 12 so that a specific current characteristic in the film structure 20 utilizing the shape effect of nano-meter size can be expected.

The barrel shape is named by the inventors as in the above-described embodiment.

(Detail of Film Structure)

Then, the details of the film structure will be described. The details of the film structure are applicable for the film structures 10 and 20.

As described above, the combination of the first insulating layer 11 and the first conductor 14 and the combination of the second insulating layer 12 and the second conductor 15 function as a first current confining layer and a second current confining layer, respectively. In this point of view, the first current confining layer and the second current confining layer will be explained in detail herein after with the constituent components such as the first insulating layer 11 and the like.

The thicknesses of the first insulating layer 11 and the second insulating layer 12 composing the first current confining layer and the second current confining layer can be determined in view of three requirements as described below. The first requirement is an upper limited value in the formation of the current confining layers. If the thickness of the current confining layer is set beyond 4 nm, it becomes difficult to flow a current through the current confining layer in the thickness direction.

The second requirement is a magnetic coupling via the current confining layer. The magnetic coupling between the film structure 10 (20) and a layer adjacent to the film structure 10 (20) depends on the position of the film structure 10 (20) in an intended film such as a magneto-resistance effect film. In one case, the magnetic coupling between the first conductor 13 of the film structure 10 (20) and the adjacent layer is caused, and in another case, the magnetic coupling between the first conductor 13 of the film structure 10 (20) and the adjacent layer is shut down. The magnetic coupling between the first conductor 13 and the adjacent layer is caused via the second conductor 14 and the third conductor 15 through which electrons are passed. Therefore, when the second conductor 14 and the third conductor 15 are made of ferromagnetic material, the magnetic coupling can be easily caused even though the first insulating layer 11 and the second insulating layer 12 are formed thicker.

When the second conductor 14 and the third conductor 15 are made of non-magnetic material, the magnetic coupling is shut down if the first insulating layer 11 and the second insulating layer 12 are formed thicker. However, even though the first insulating layer 11 and the second insulating layer 12 are formed thicker, the magnetic coupling can be easily caused if the total thickness of the current confining layer is set thinner.

The third requirement is an insulating function in the insulating layers. When the current confining layer is formed thinner, the insulating layers composing the current confining layer can not exhibit the inherent insulating functions because the insulating layers are also formed thinner. In view of the sufficient insulating function of the insulating layer, it is required to set the thickness of the insulating layer to 0.5 nm or more.

In this way, the thicknesses of the first current confining layer and the second current confining layer are determined in view of the insulating functions of the insulating layers composing the first current confining layer and the second current confining layer and the presence or absence of the magnetic coupling of the film structure 10 (20). In the case that the first conductor 13 through the third conductor 15 are made of ferromagnetic material, the thicknesses of the first current confining layer and the second current confining layer can be set to 3.0 nm or less in view of the generation of the magnetic coupling and to 0.5 nm or more in view of the generation of the insulating functions of the insulating layers. Namely, it is desired that the thicknesses of the first current confining layer and the second current confining layer are set within a range of 0.5 to 3.0 nm.

In the case that the third conductor 15 is made of ferromagnetic material, and the first conductor 13 and the second conductor 14 are made of non-magnetic material, the thicknesses of the first current confining layer and the second current confining layer can be set to 1.5 nm or less in view of the generation of the magnetic coupling and to 0.5 nm or more in view of the generation of the insulating functions of the insulating layers. Namely, it is desired that the thicknesses of the first current confining layer and the second current confining layer are set within a range of 0.5 to 1.5 nm. In this case, when no magnetic coupling is caused, the thicknesses of the first current confining layer and the second current confining layer can be set thicker under the condition that the conductors can be formed through the insulating layers composing the first current confining layer and the second current confining layer. For example, it is desired that the thicknesses of the first current confining layer and the second current confining layer are set within a range of 1.5 to 4 nm.

The first insulating layer 11 and the second insulating layer 12 may be made of oxide, nitride or oxynitride containing at least one element selected from the group consisting of Al, Ta, Hf, Cr, Zr, Ti, Si, W, V, Mg, Mo, Fe, Ni and Co.

The preferable materials of the second conductor 14 and the third conductor 15 depend on the positions of the conductors 14 and 15 in an intended film such as a magneto-resistance effect film where the film structure 10 (20) is to be incorporated as described herein after. In the embodiments, the second conductor 14 and the third conductor 15 may be made of non-magnetic material or ferromagnetic material. As the non-magnetic material, Cu, Au, Ag, Rh, Ru, Mn, Cr, Re, Os, Ir and Pd may be exemplified. Among the exemplified materials, Cu, Au and Ag are desirable due to low oxidation energy and high electric conductivity. As the ferromagnetic material, Co, Fe and Ni may be exemplified. In the other embodiments, the second conductor 14 and the third conductor 15 may be made of semimetal or semiconductor. As the semimetal, Bi, Sb, As may be exemplified.

The function of the film structure 10 (20) depends on the sort of material of the first conductor 13. In the application of the film structure 10 (20) to a magneto-resistance effect film, for example, the preferable material of the first conductor 13 depends on the position of the film structure 10 (20) in the magneto-resistance effect film. In the case that the first conductor 13 is made of non-magnetic material, Cu, Au, Ag, Rh, Ru, Mn, Cr, Re, Os, Ir and Pd may be exemplified as the non-magnetic material. Among the exemplified materials, Cu, Au and Ag are desirable due to low oxidation energy and high electric conductivity. In the case that the first conductor 13 is made of ferromagnetic material, Co, Fe and Ni may be exemplified as the ferromagnetic material. In the other embodiments, the first conductor 13 may be made of semimetal or semiconductor. As the semimetal, Bi, Sb, As may be exemplified.

In the film structure 20 shown in FIG. 2, it is required that the area (diameter) of the second conductor 14 formed in the opening 11A of the first insulating layer 11 in the direction parallel to the film surface thereof and the area (diameter) of the third conductor 15 formed in the opening 12A of the second insulating layer 12 in the direction parallel to the film surface thereof are set sufficiently smaller than the maximum area (diameter) of the first conductor 12 in the direction parallel to the film surface thereof. If the requirement is not satisfied, the specific electric conduction, originated from the shape effect of nano-meter order, can not be exhibited. In fact, in the case that the areas of the second conductor 14 and the third conductor 15 are set too large, the electrons scattered in the film structure 20 are passed through the film structure 20 and thus, do not collide against the inner wall of the film structure 20 so as not to cause the specific electric conduction. As a result, when the film structure 20 is applied to a magneto-resistance effect film or the like, the magneto-resistance effect film can not exhibit high MR ratio. In this point of view, it is desired that the diameters of the second conductor 14 and the third conductor 15 are set to 5 nm or less.

In order to obtain the specific electric conduction originated from the shape effect of nano-meter order effectively and efficiently, it is desired that the first conductor 13 is enclosed by the insulating layers 11 and 12 in the direction parallel to the film surface thereof as shown in FIG. 2. Then, if the area of the first conductor 13 is set too large, the specific electric conduction using the shape effect of nano-meter order can not be exhibited. It is desired, therefore, that the diameter of the first conductor 13 is set to 10 nm or less while the above-described requirement relating to the enclosure by the insulating layers is satisfied.

Herein, since the areas of the second conductor 14 and the third conductor 15 are defined by the sizes (diameters) of the openings 1A and 12A, the above-requirements can be necessarily satisfied only if the film structure 20 shown in FIG. 2 is employed.

The above-described requirements relating to FIG. 2 are also required for the film structure 10 shown in FIG. 1. However, the film structure 10 is different from the film structure 20 in that the first insulating layer 11 and the second insulating layer 12 do not enclose the first conductor 13 and thus, separated from one another at both sides of the openings 11A and 12A. In this case, therefore, it is desired that the relation of A/2>B is satisfied when the distance between the first insulating layer 11 and the second insulating layer 12 at the openings 11A and 12A is designated by "A" and the distance between the first insulating layer 11 and the second insulating layer 12 at both sides of the openings 11A and 12A is designated by "B".

Moreover, the thickness of the first conductor 13 is preferably set to 5 nm or less. If the first conductor 13 is formed too thick, it becomes difficult to form the film structure 10 (20) of barrel shape satisfying the relation of A/2>B. In addition, the thickness of the first conductor 13 is preferably set to 1 nm or more. If the first conductor 13 is formed too thin, the diameter of the first conductor 13 is decreased. Since it is required that the areas (diameter) of the second conductor 14 and the third conductor 15 in the direction parallel to the film surfaces thereof are set smaller than the area (diameter) of the first conductor 13 in the direction parallel to the film surface thereof, it becomes difficult to form the second conductor 14 and the third conductor 15 so as to satisfy the above-described requirement if the area (diameter) of the first conductor 13 is set too small. In this point of view, it is desired that the thickness of the first conductor 13 is set to 1 nm or more.

If the relation of A/2>B is not satisfied, the electrons, taken from the second conductor 14 formed in the first opening 11A of the first insulating layer 11 into the first conductor 13 of the film structure 10, may be taken out via the third conductor 15 of the adjacent film structure, not via the inherent third conductor 15 formed in the same film structure 10 as the electron are taken into. In this case, therefore, the electrons scattered in the film structure 10 are passed through the film structure 10 and thus, do not collide against the inner wall of the film structure 10 so as not to cause the specific electric conduction. As a result, when the film structure 10 is applied to a magneto-resistance effect film or the like, the magneto-resistance effect film can not exhibit high MR ratio.

Then, the concrete structure of the film structures 10 and 20 will be described. In this case, explanation is centered on the first conductor 13. FIGS. 3 to 7 relate to the concrete arrangements including the film structures 10 and 20. FIG. 3 to 7 are directed at the film structure 20, but may be directed to the film structure 10.

Figure 3:
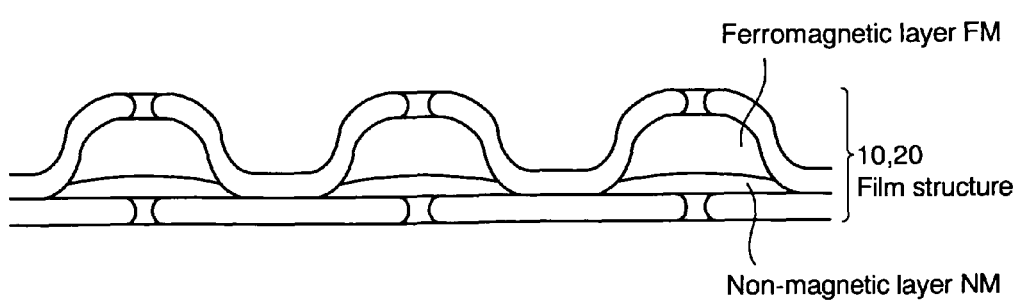
FIG. 3 is a cross sectional view showing a concrete film arrangement of the film structure according to the embodiment.

In FIG. 3, the first conductor 13 is formed as a multilayered structure. In the case that the film structure 20 (10) is applied to a magneto-resistance effect film as described below, for example, the film structure 20 (10) can be formed over the pinned layer and the spacer layer. The interface between the pinned layer and the spacer layer may be disposed in the first conductor 13 so that the first conductor 13 is made of the ferromagnetic layer FM of the pinned layer and the non-magnetic layer NM of the spacer layer.

Figure 4:
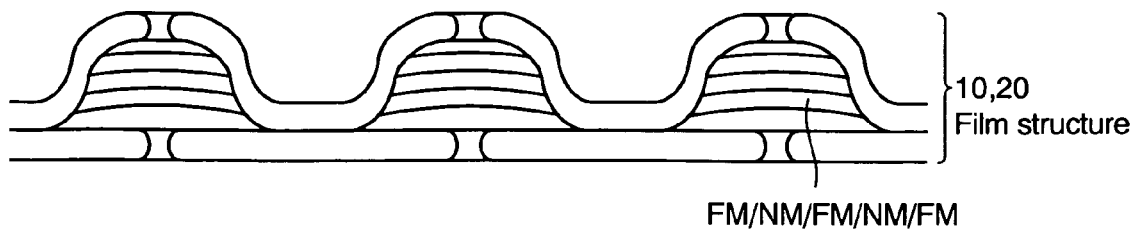
FIG. 4 is a cross sectional view showing another concrete film arrangement of the film structure according to the embodiment.

As shown in FIG. 4, the first conductor 13 may be formed as another multilayered structure containing three or more layers. In the case that the film structure 20 (10) is applied to a magneto-resistance effect film, for example, the film structure 20 (10) is disposed in the pinned layer or the free layer while the first conductor 13 is made of ferromagnetic material, so that the first conductor 13 is formed as the multilayered structure of (ferromagnetic layer FM/non-magnetic layer NM)×N/ferromagnetic layer FM. In this case, the non-magnetic layer NM is disposed between the adjacent ferromagnetic layers FM, the spin dependent bulk scattering of the ferromagnetic layer FM can be enhanced.

In the case that the film structure 20 (10) is disposed adjacent to the ferromagnetic layer FM, the non-magnetic layer NM may be disposed between the film structure 20 (10) and the ferromagnetic layer FM.

Figure 5:
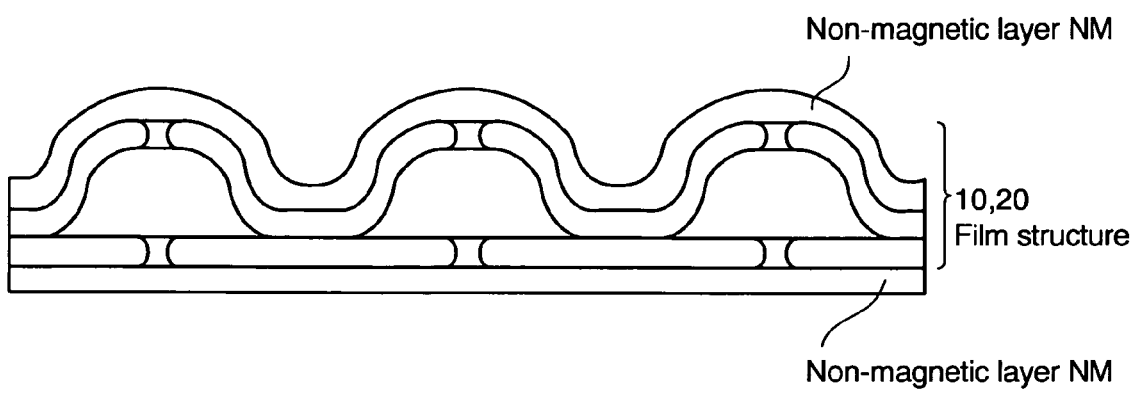
FIG. 5 is a cross sectional view showing still another concrete film arrangement of the film structure according to the embodiment.

In FIG. 5, the non-magnetic layers NM are formed on the top surface and the bottom surface of the film structure 20 (10). It is considered that the arrangement means the state where film structure 20 (10) is disposed in the ferromagnetic layer FM constituting the pinned layer P or the free layer F and the non-magnetic layers NM are formed on the top surface and the bottom surface of the ferromagnetic layer FM. The non-magnetic layers NM function as the respective barrier layers of the ferromagnetic layer FM against oxygen. Concretely, the portions of the ferromagnetic layer FM positioned above and below the film structure 20 (10) is protected against oxygen. The non-magnetic layer NM may be made of Cu, Au, Ag, Rh, Ru, Mn, Cr, Re, Os, Ir, Pd or the like. Among the exemplified materials, Cu, Au and Ag are desirable due to low oxidation energy and high electric conductivity.

Figure 6:
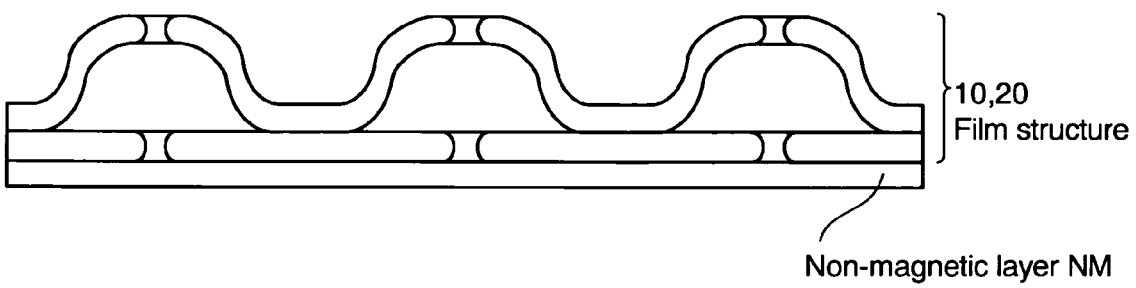
FIG. 6 is across sectional view showing a further concrete film arrangement of the film structure according to the embodiment.

In FIG. 6, the non-magnetic layer NM is formed on the bottom surface of the film structure 20 (10). It is considered that the arrangement means the state where film structure 20 (10) is disposed between the ferromagnetic layer FM constituting the pinned layer P or the free layer F and the non-magnetic layer NM constituting the spacer layer S. The non-magnetic layer NM functions as a barrier layer of the ferromagnetic layer FM against oxygen.

Figure 7:
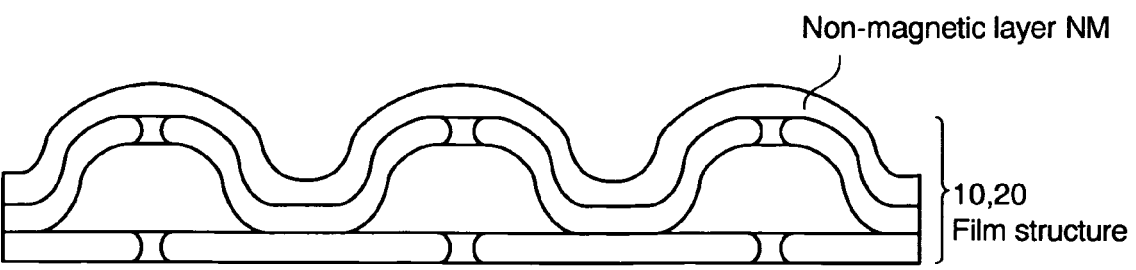
FIG. 7 is a cross sectional view showing a still further concrete film arrangement of the film structure according to the embodiment.

In FIG. 7, the non-magnetic layer NM is formed on the top surface of the film structure 20 (10). It is considered that the arrangement means the state where film structure 20 (10) is disposed between the ferromagnetic layer FM constituting the pinned layer P or the free layer F and the non-magnetic layer NM constituting the spacer layer S. The non-magnetic layer NM functions as a barrier layer of the ferromagnetic layer FM against oxygen.

(Magneto-Resistance Effect Film Containing Film Structure)

The film structures 10 and 20 can be applied for a magneto-resistance effect film. In these cases, the thus obtained magneto-resistance effect films can exhibit respective high MR ratios on the principle as described below.

Figure 8:
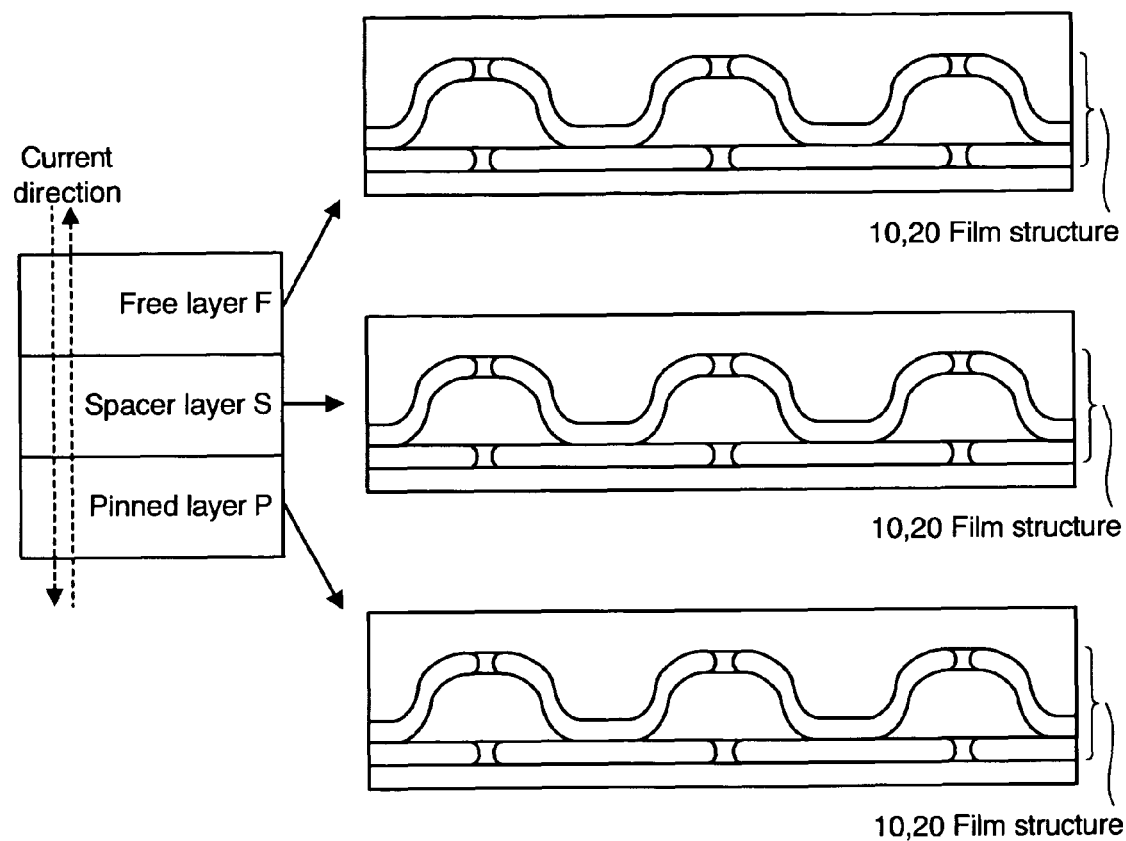
FIG. 8 is a structural view showing a state where the film structure is incorporated in a magneto-resistance effect film.

FIG. 8 is a structural view showing a state where the film structure 10 or 20 is incorporated in a magneto-resistance effect element. As shown in FIG. 8, the film structure 10 or 20 may be disposed in the spin dependent scattering unit made of the pinned layer P, the spacer layer S and the free layer F. In FIG. 8, the pinned layer S, the spacer layer S and the free layer F are provided with the respective film structures 10 or 20 therein. The pinned layer P may be provided with the plurality of film structures 10 or 20 therein. Also, the spacer layer S and the free layer F may be provided with the respective plurality of film structures 10 or 20.

The film structure 10 or 20 may be disposed over the pinned layer P and the spacer layer S so as to contain the interface between the pinned layer P and the spacer layer S. Also, the film structure 10 or 20 may be disposed over the spacer layer S and the free layer F so as to contain the interface between the spacer layer S and the free layer F. Moreover, the film structure 10 or 20 may be disposed over the pinned layer P, the spacer layer S and the free layer F so as to contain the interface between the pinned layer P and the spacer layer S and the interface between the spacer layer S and the free layer F. The concrete embodiments will be described herein after.

(Detail of Magneto-Resistance Effect Film Containing Film Structure)

Then, the detail of the film structure to be employed in a magneto-resistance effect film will be described. FIGS. 9 and 10 show the state where the film structure 10 or 20 is disposed in the pinned layer P or the free layer F. The concrete structure of the film structure 10 or 20 can configured as shown in FIGS. 1 to 7, but is not restricted.

In the case that the film structure 10 or 20 is disposed in the pinned layer P or the free layer F, the first conductor 13 is made of ferromagnetic material so as to function as the pinned layer P or the free layer F. Moreover, the first conductor 13 may be made of a multilayered structure of ferromagnetic layer/non-magnetic layer so as to enhance the spin dependent bulk scattering. The concrete structure of the multilayered structure may be set to (ferromagnetic layer/non-magnetic layer)×N/ferromagnetic layer, (non-magnetic layer/ferromagnetic layer)×N/ferromagnetic layer, (ferromagnetic layer/non-magnetic layer)×N or (non-magnetic layer/ferromagnetic layer)×N.

As an embodiment of the first conductor 13 when the film structure 10 or 20 is disposed in the pinned layer P or the free layer F, a multilayered structure of $Fe_{50}Co_{50}$ 1 nm/Cu 0.25 nm/$Fe_{50}Co_{50}$ 1 nm is provided.

The $Fe_{50}Co_{50}$ layer composing the first conductor 13 has a bcc structure. As a FeCo-based alloy, $Fe_XCo_{100-X}$ (X=30 to 100%) as occasion demands, containing an additive element can be exemplified. In this embodiment, the $Fe_{50}Co_{50}$ layer containing an extremely thin Cu layer is employed as the first conductor 13. Concretely, the $Fe_{50}Co_{50}$ layer is separated into two FeCo layer by the extremely thin Cu layer. The thickness of each FeCo layer is set to 1 nm, and the thickness of the Cu layer is set to 0.25 nm, and the total thickness of the $Fe_{50}Co_{50}$ is set to 2.25 nm.

The first conductor 13 may be made of $Co_{90}Fe_{10}$ alloy with fcc structure or $Co_{90}Fe_{10}$ alloy with hcp structure instead of the magnetic material with bcc structure as described above. The first conductor 13 may be made of metal such as Co, Fe, Ni or alloy thereof. The FeCo material with bcc structure, the cobalt alloy with 50% or more of Ni and the Ni alloy with 50% or more of Co are subsequently desirable for the first conductor 13 in view of the enhancement of the MR ratio.

In the case that the first conductor 13 is made of the multilayered structure of the FeCo layers and the thin Cu layer which are alternately stacked, the spin dependent bulk scattering in the magneto-resistance effect film can be enhanced by the thin Cu layer. In order to cause the spin dependent bulk scattering effectively and efficiently, the thickness of the thin Cu layer is set within 0.1 to 1 nm, preferably within 0.2 to 0.5 nm. Too thin Cu layer may not develop the spin dependent bulk scattering and too thick Cu layer may not also develop the spin dependent bulk scattering and weaken the magnetic coupling between the upper FeCo layer and the lower FeCo layer so that the first conductor 13 can not exhibit the inherent characteristic thereof. In this point of view, the thickness of the thin Cu layer is set to 0.25 nm.

In the multilayered structure of the first conductor 13, a Hf layer, a Zr layer and a Ti layer may be employed as the non-magnetic layer instead of the Cu layer. In the multilayered structure, the thickness of the ferromagnetic layer such as the FeCo layer is preferably set within 0.5 to 2 nm, more preferably within 1 to 1.5 nm.

The first conductor 13 may be made of an alloy layer of FeCo and Cu instead of the multilayered structure of the FeCo layers and the Cu layer. As the alloy layer, a $(Fe_XCo_{100-X})_{100-Y}Cu_Y$ (X=30 to 100%, Y=3 to 15%) layer may be exemplified, but another alloy layer will do. In the alloy layer, another element such as Hf, Zr, Ti may be employed instead of Cu.

The first conductor 13 may be made of a single layer of Co, Fe, Ni or an alloy thereof. For example, a $Co_{90}Fe_{10}$ layer may be employed as the first conductor 13 which is widely available up to now. An other element may be added to the $Co_{90}Fe_{10}$ layer as occasion demands.

The first conductor 13 may be made of an amorphous metal such as CoFeB, CoZrNb, FeZrN, FeAlSi instead of the crystallized metal as described above.

The first conductor 13 may be made of a vertical magnetization film such as FePt, CoPt, SmCo. An other element may be added to the vertical magnetization film.

Figure 9A:
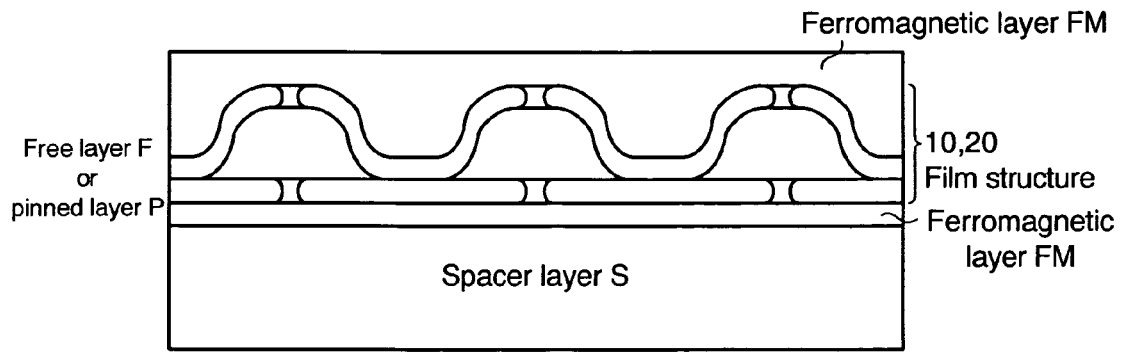
FIG. 9 relates to structural views showing concrete states where the film structures are incorporated in corresponding magneto-resistance effect films.
Figure 9B:
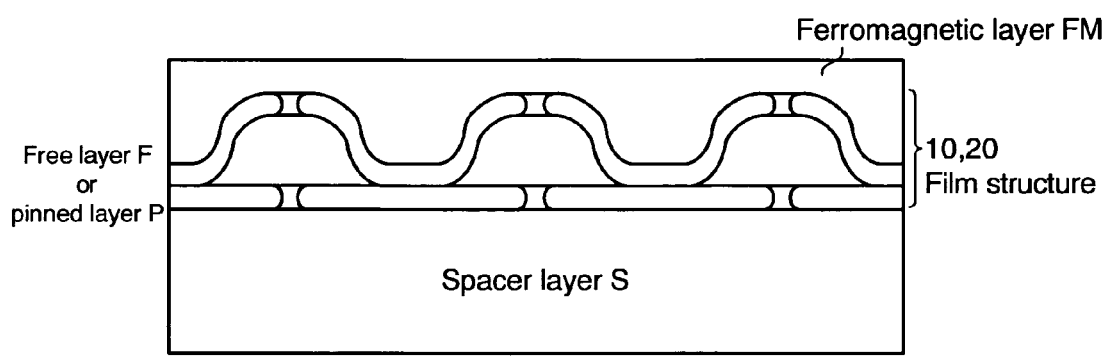
Figure 9C:
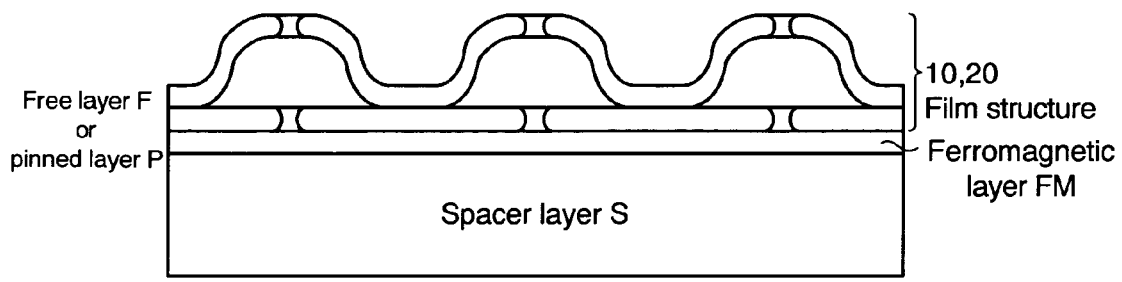
Figure 9D:
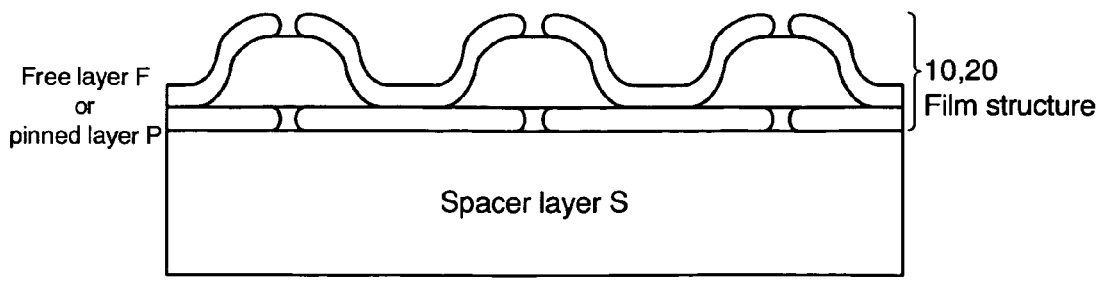

FIG. 9A is a schematic view showing the state where the pinned layer P or the free layer F is made of the ferromagnetic layer FM, the film structure 10 or 20 and the ferromagnetic layer FM. FIG. 9B is a schematic view showing the state where the pinned layer P or the free layer F is made of the film structure 10 or 20 and the ferromagnetic layer FM. FIG. 9C is a schematic view showing the state where the pinned layer P or the free layer F is made of the ferromagnetic layer FM and the film structure 10 or 20. FIG. 9D is a schematic view showing the state where the pinned layer P or the free layer F is made of the film structure 10 or 20.

FIGS. 10A to 10D correspond to FIGS. 9A to 9D, respectively. The positions of the spacer layer S and the pinned layer P or the free layer F in FIGS. 10A to 10D are reverse to the positions of the pinned layer P or the free layer F and the spacer layer S in FIGS. 9A to 9D, respectively.

In the case that the film structure 10 or 20 is disposed in the pinned layer P or the free layer F, the arrangement relating to the film structure 10 or 20 can be configured as shown in FIGS. 9A to 9D and FIGS. 10A to 10D.

FIG. 11 shows the arrangement relating to the film structure 10 or 20 when the film structure 10 or 20 is disposed in the spacer layer S. The concrete structure of the film structure 10 or 20 may be configured as shown in FIGS. 1 to 7, but is not restricted.

In the case that the film structure 10 or 20 is disposed in the spacer layer S, the first conductor 13, the second conductor 14 and the third conductor 15 are made of non-magnetic metal so as to impart the inherent function as a spacer layer to the spacer layer S. As the non-magnetic metal, Cu, Au, Ag, Rh, Ru, Mn, Cr, Re, Os may be exemplified. Among the exemplified materials, Cu, Au and Ag are desirable due to low oxidation energy and high electric conductivity.

In the case that the film structure 10 or 20 is disposed in the spacer layer S, the spacer layer S may be configured as a magnetic spacer layer. In this case, the first conductor 13, the second conductor 14 and the third conductor 15 may be made of metal such as Co, Fe, Ni or alloy containing at least one selected from the listed ones.

Figure 11A:
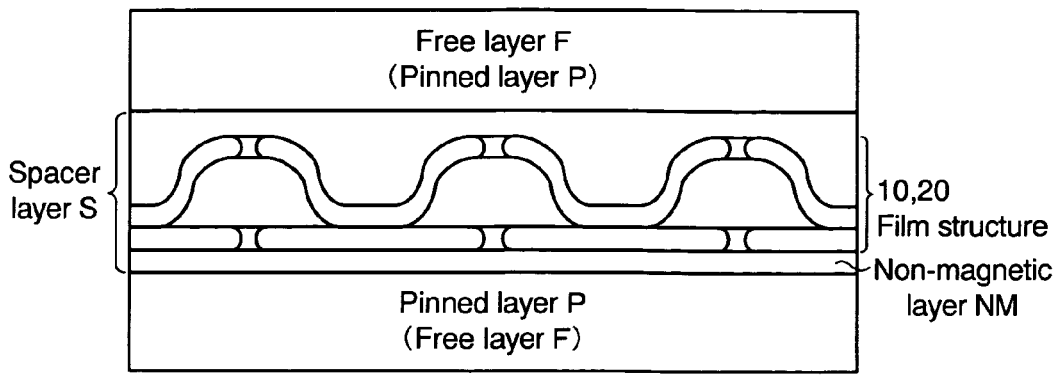
FIG. 11 also relates to structural views showing concrete states where the film structures are incorporated in corresponding magneto-resistance effect films.
Figure 11B:
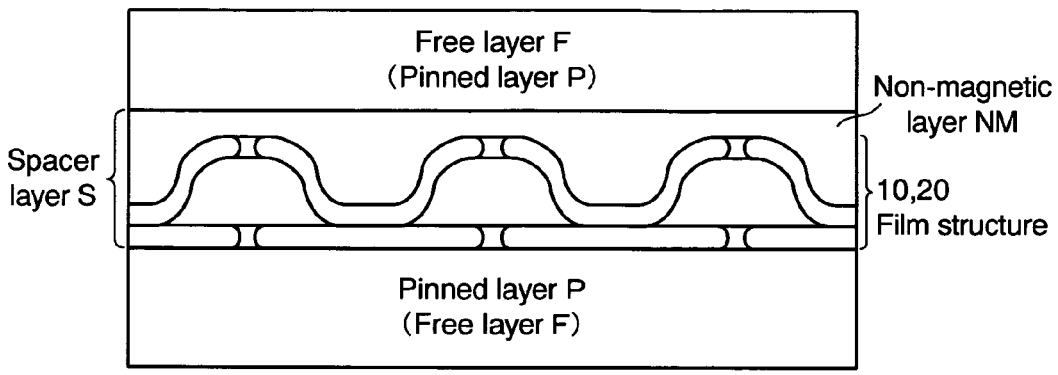
Figure 11C:
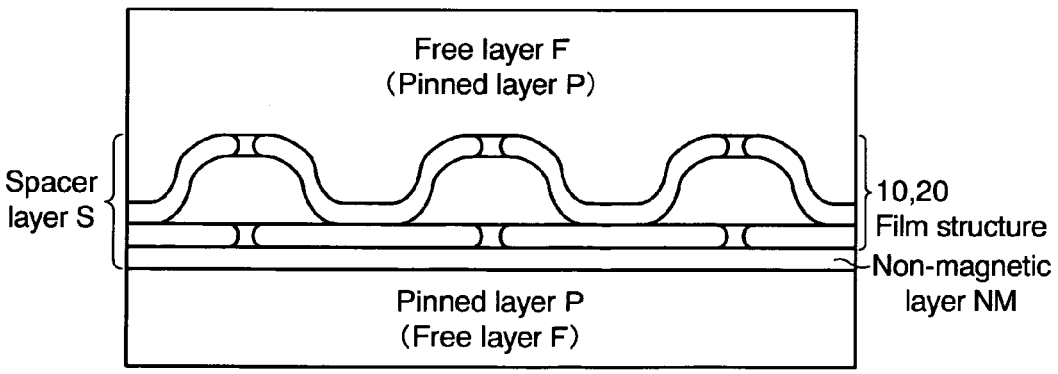
Figure 11D:
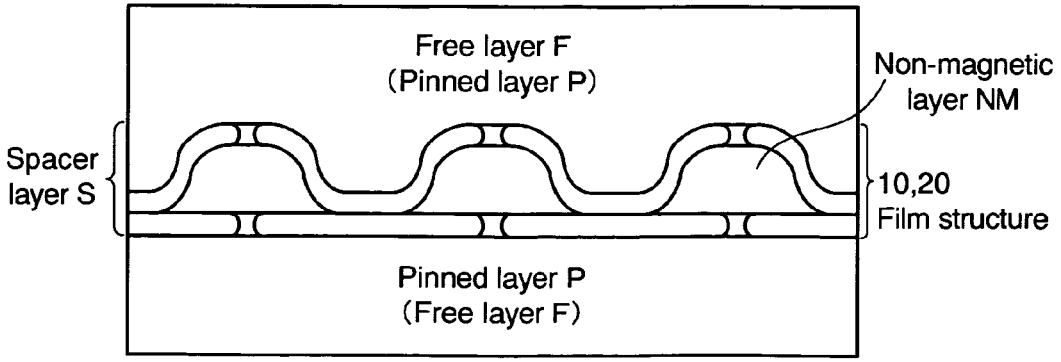

FIG. 11A is a schematic view showing the state where the spacer layer S is made of the non-magnetic layer NM, the film structure 10 or 20 and the non-magnetic layer NM. FIG. 11B is a schematic view showing the state where the spacer layer S is made of the film structure 10 or 20 and the non-magnetic layer FM. FIG. 11C is a schematic view showing the state where the spacer layer S is made of the non-magnetic layer NM and the film structure 10 or 20. FIG. 11D is a schematic view showing the state where the spacer layer S is made of the film structure 10 or 20. In the case that the film structure 10 or 20 is disposed in the spacer layer S, the arrangement relating to the film structure 10 or 20 may be configured as FIGS. 11A to 11D.

FIG. 12 shows the arrangement where the film structure 10 or 20 is disposed over the spacer layer S and the free layer F or the pinned layer P so as to contain the interface between the spacer layer S and the free layer F or the pinned layer P. The concrete structure relating to the film structure 10 or 20 may be configured as FIGS. 1 to 7, but may not be restricted.

In this embodiment, as shown in FIG. 12, since the first conductor 13 of the film structure 10 or 20 is disposed over the spacer layer S and the free layer F or the pinned layer P, the portion of the first conductor 13 located in the spacer layer S is made of non-magnetic metal so as to impart the inherent function as a spacer layer to the spacer layer S and the portion of the first conductor 13 located in the free layer F or the pinned layer P is made of ferromagnetic metal so as to impart the inherent function as a pinned layer or a free layer to the pinned layer P or the free layer F.

The portion of the first conductor 13 located in the spacer layer S may be made of Cu, Au, Ag, Rh, Ru, Mn, Cr, Re, Os, as described above. Among the exemplified materials, Cu, Au and Ag are desirable due to low oxidation energy and high electric conductivity. The portion of the first conductor 13 located in the free layer F or the pinned layer P may be made of the same material and configured as described in the embodiment relating to FIG. 9. Concretely, in order to enhance the spin bulk scattering effect, a multilayered structure made of ferromagnetic layer/non-magnetic layer such as $Fe_{50}Co_{50}$ 1 nm/Cu 0.25 nm/$Fe_{50}Co_{50}$ 1 nm can be employed.

Figure 12A:
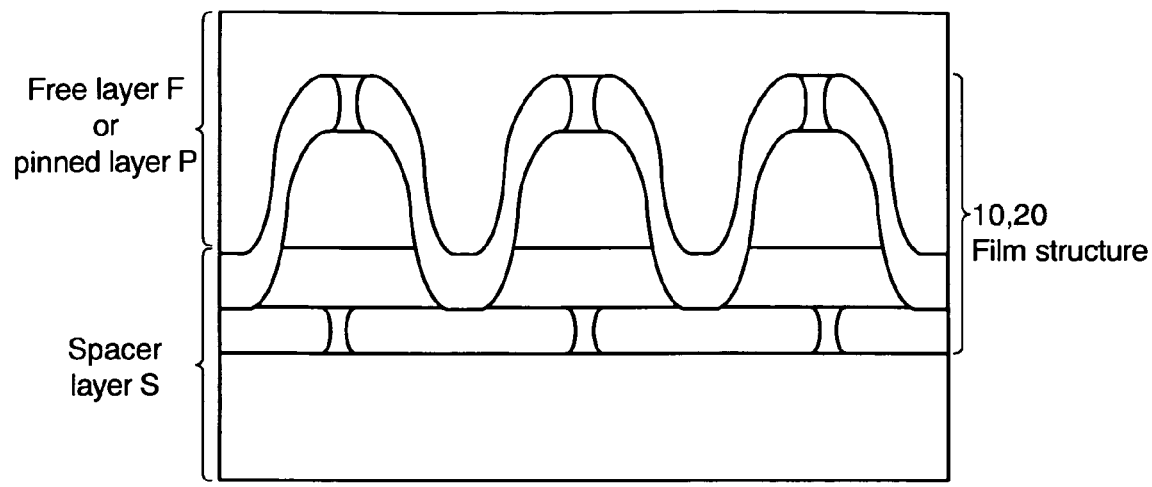
FIG. 12 also relates to structural views showing concrete states where the film structures are incorporated in corresponding magneto-resistance effect films.
Figure 12B:
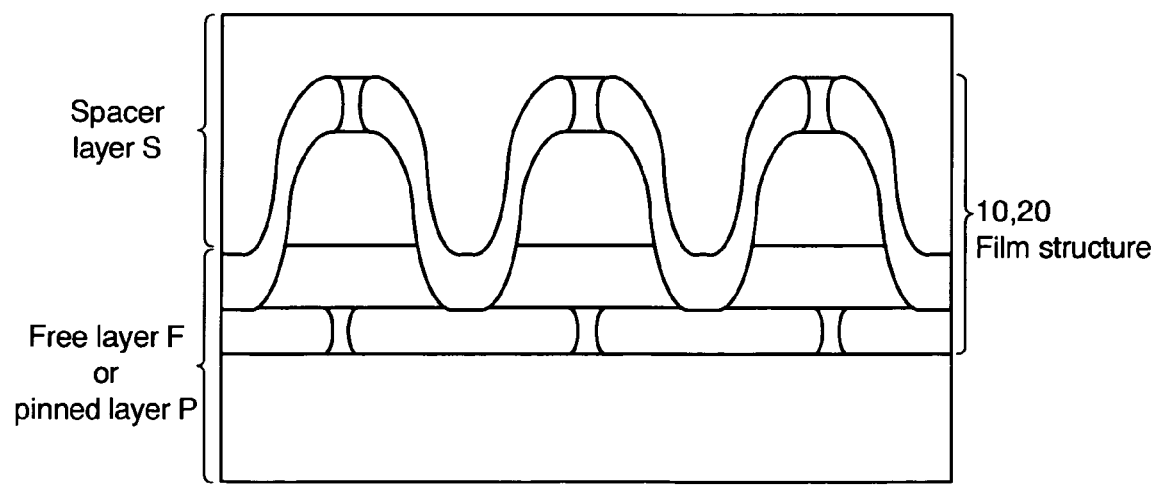

FIG. 12A shows the state where the free layer F or the pinned layer P is disposed on the spacer layer S, and FIG. 12B shows the state where the free layer F or the pinned layer P is disposed under the spacer layer S. In the case that the film structure 10 or 20 is disposed over the spacer layer S and the free layer F or the pinned layer P, the arrangement relating to the film structure 10 or 20 can be configured as shown in FIGS. 12A and 12B.

FIG. 13 shows the arrangement where the film structure 10 or 20 is disposed over the spacer layer S and the free layer F or the pinned layer P so as to contain the interface between the spacer layer S and the free layer F or the pinned layer P. In FIG. 13, the first conductor 13 of the film structure 10 or 20 is entirely contained in the free layer F or the pinned layer P. In FIGS. 13A and 13B, the first conductor 13 is contained in the free layer F or the pinned layer P located on the spacer layer S. In FIGS. 13C and 13D, the first conductor 13 is contained in the free layer F or the pinned layer P located under the spacer layer S.

Figure 13A:
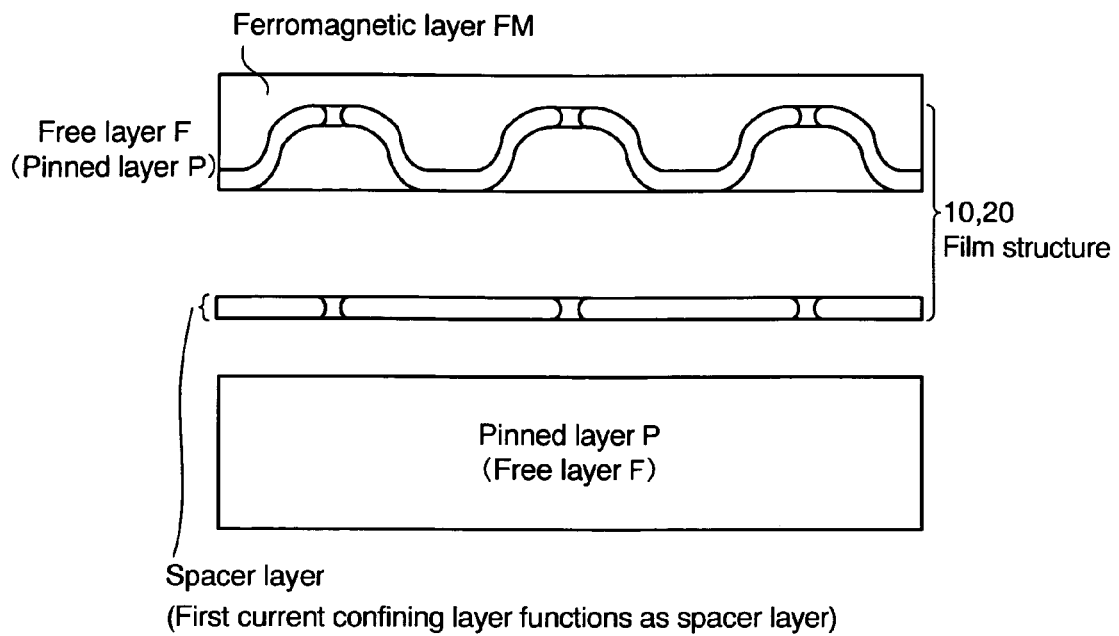
FIG. 13 also relates to structural views showing concrete states where the film structures are incorporated in corresponding magneto-resistance effect films.
Figure 13B:
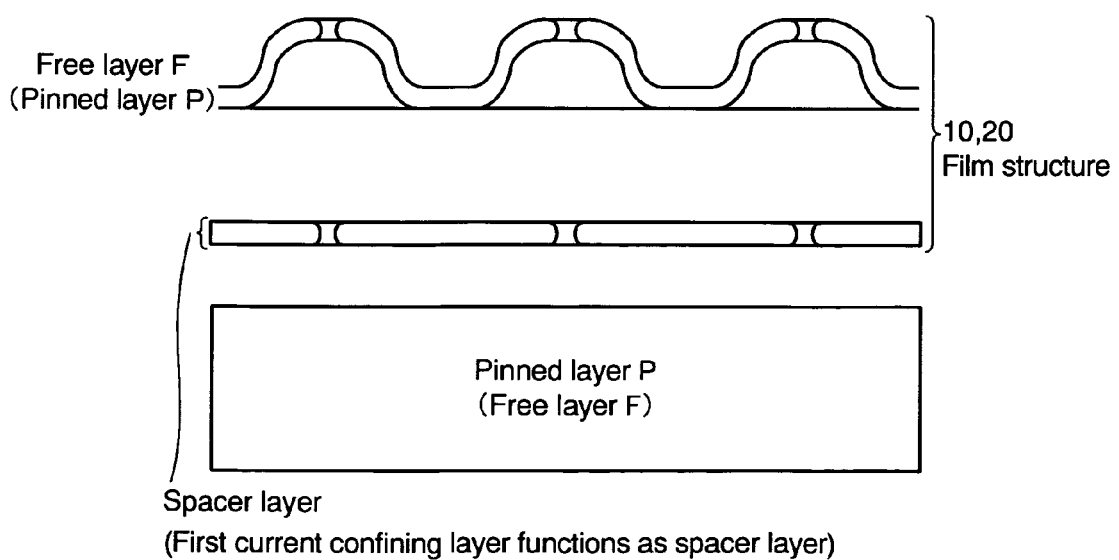
Figure 13C:
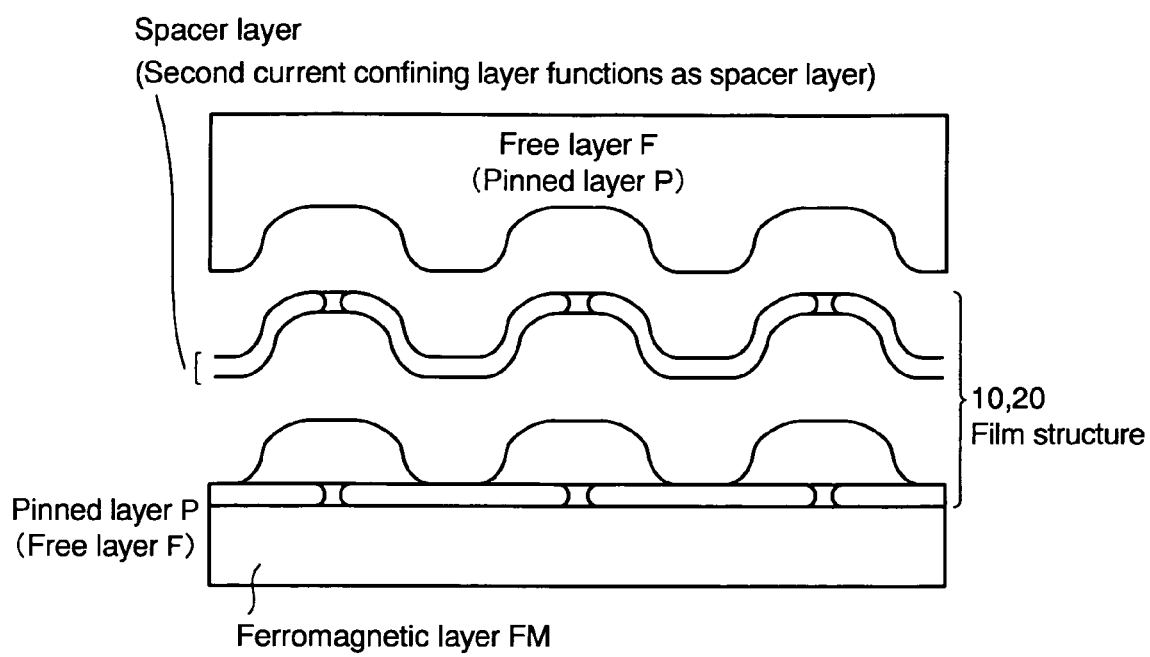
Figure 13D:
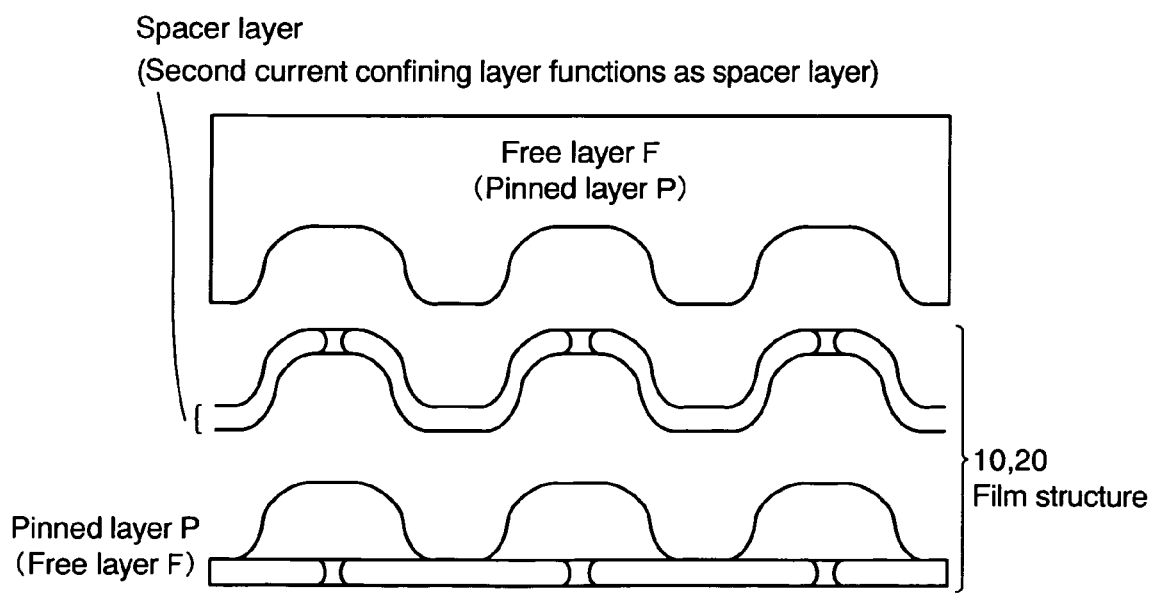

In FIGS. 13A and 13B, the first insulating layer 11 and the second conductor 14 constitute the spacer layer S so that the spacer layer S functions as a current confining layer. In FIGS. 13C and 13D, the second insulating layer 12 and the second conductor 15 constitute the spacer layer S so that the spacer layer S functions as a current confining layer.

In FIG. 13A, the free layer F or the pinned layer P is made of the first conductor 13, the second insulating layer 12, the third conductor 15 in the film structure 10 or 20 and the ferromagnetic layer FM. In FIG. 13B, the free layer F or the pinned layer P is made of the first conductor 13, the second insulating layer 12, and the third conductor 15 in the film structure 10 or 20. In FIG. 13C, the free layer F or the pinned layer P is made of the first conductor 13, the first insulating layer 11, the second conductor 14 in the film structure 10 or 20 and the ferromagnetic layer FM. In FIG. 13D, the free layer F or the pinned layer P is made of the first conductor 13, the first insulating layer 11, and the second conductor 14 in the film structure 10 or 20.

In the case that the film structure 10 or 20 is formed over the free layer F or the pinned layer P, the arrangements relating to the film structure 10 or 20 may be configured as shown in FIGS. 13A to 13D.

Figure 14:
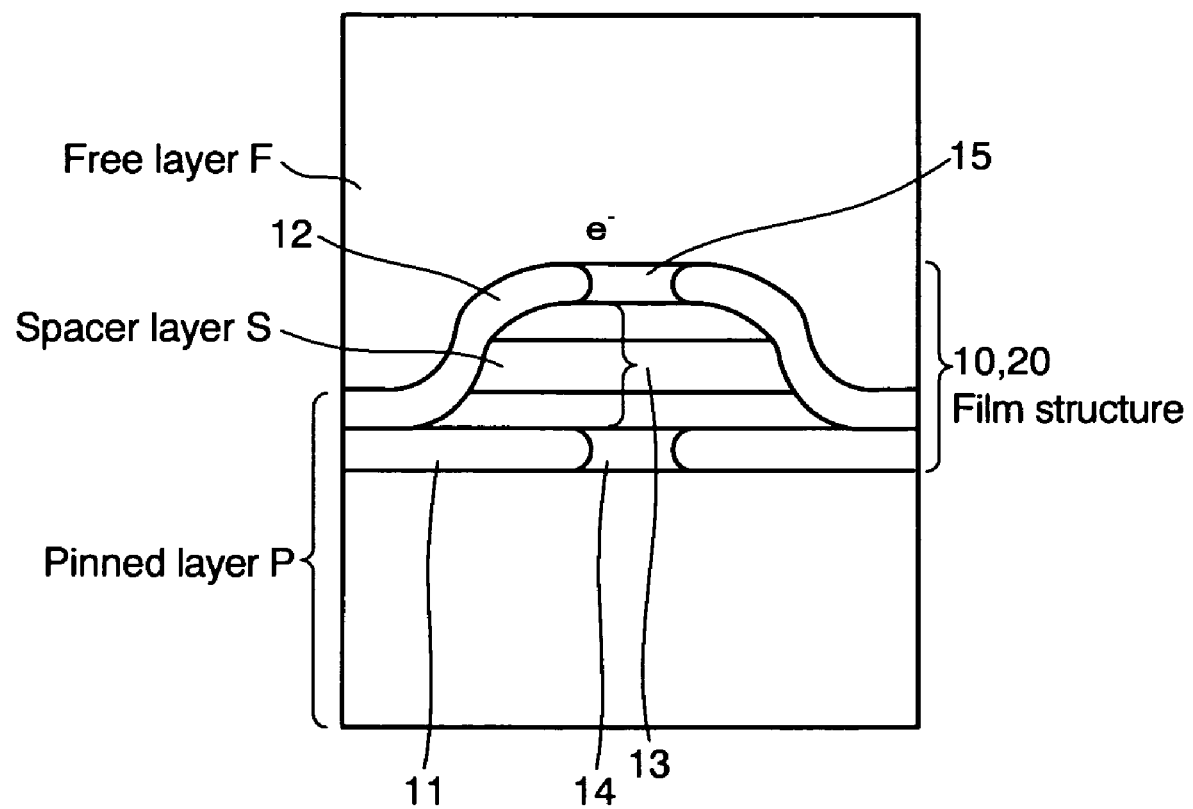
FIG. 14 is a structural view showing another concrete state where the film structure is incorporated in a magneto-resistance effect film.

FIG. 14 shows the state where the film structure 10 or 20 is formed over the spacer layer S and the free layer F or the pinned layer P so as to contain the interfaces there between.

As shown in FIG. 14, in this embodiment, since the first conductor 13 of the film structure 10 or 20 is disposed over the spacer layer S, the free layer F and the pinned layer P, the portion of the first conductor 13 located in the spacer layer S is made of non-magnetic material and the portions of the first conductor 13 located in the free layer F and the pinned layer P are made of ferromagnetic material.

The portion of the first conductor 13 located in the spacer layer S may be made of Cu, Au, Ag, Rh, Ru, Mn, Cr, Re, Os, as described above. Among the exemplified materials, Cu, Au and Ag are desirable due to low oxidation energy and high electric conductivity. The portions of the first conductor 13 located in the free layer F and the pinned layer P may be made of the same material and configured as described in the embodiment relating to FIG. 9. Concretely, in order to enhance the spin bulk scattering effect, a multilayered structure made of ferromagnetic layer/non-magnetic layer such as $Fe_{50}Co_{50}$ 1 nm/Cu 0.25 nm/$Fe_{50}Co_{50}$ 1 nm can be employed.

Figure 15A:
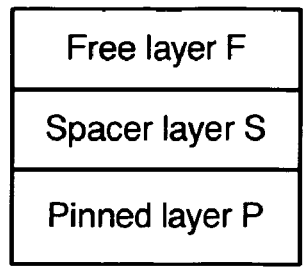
FIG. 15 relates to fundamental structures of magneto-resistance effect elements, respectively.
Figure 15B:
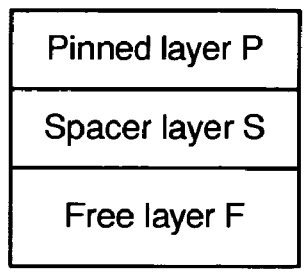

The fundamental structure of the magneto-resistance effect film can be formed as a bottom type magneto-resistance effect film configured such that the free layer F is formed on the spacer layer S and the pinned layer P is formed under the spacer layer S as shown in FIG. 15A. Then, the fundamental structure of the magneto-resistance effect film can be formed as a top type magneto-resistance effect film configured such that the pinned layer P is formed on the spacer layer S and the free layer F is formed under the spacer layer S as shown in FIG. 15B. Then, the fundamental structure of the magneto-resistance effect film can be formed as a dual type magneto-resistance effect film configured such that the free layer F is disposed at the center thereof and the free layer F and pinned layer P are formed on and under the spacer layer S, as shown in FIG. 15C.

Figure 16A:
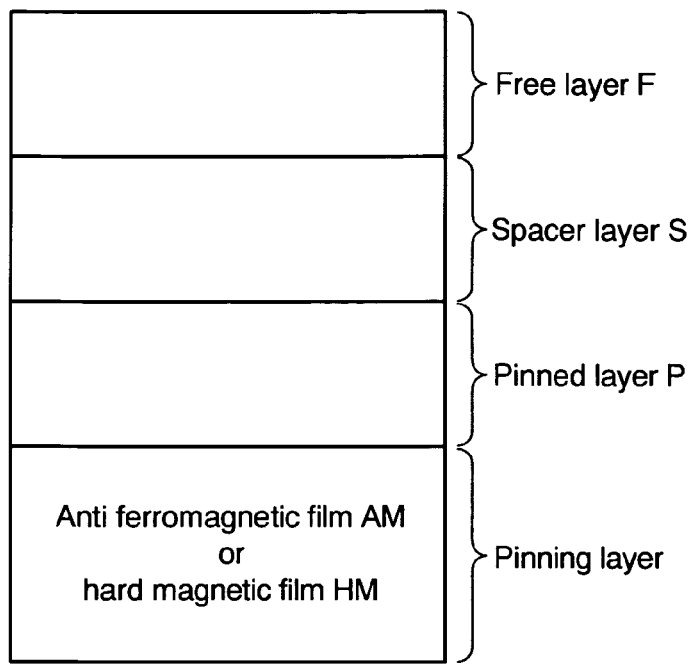
FIG. 16 relates to fundamental structures of magneto-resistance effect elements, respectively.
Figure 16B:
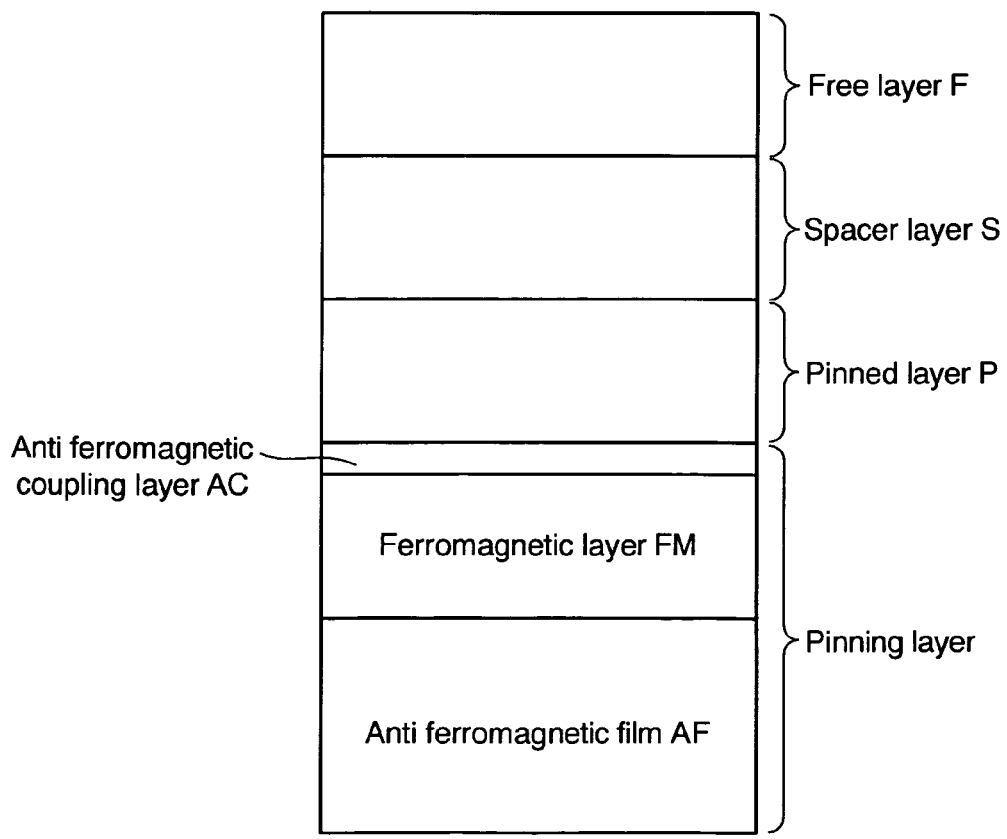

FIG. 16 is a schematic view showing a spin valve structure containing a pinning layer. The pinning layer may be configured as an antiferromagnetic film AF or a hard magnetic film HM so as to directly fix the direction of the magnetization of the pinned layer P as shown in FIG. 16A. The pinning layer may be configured as a synthetic structure as shown in FIG. 16B. In the latter case, the magnetization of the ferromagnetic layer FM is antiferromagnetically fixed with the antiferromagnetic film AF so that the direction of the magnetization of the pinned layer P can be fixed with the ferromagnetic layer FM via an antiferromagnetic coupling film AC made of Ru or the like.

Figure 15C:
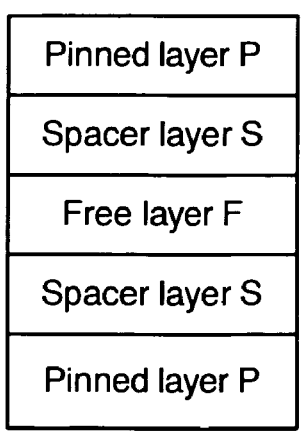

In FIG. 16, the pinning layer is incorporated in the bottom type magneto-resistance effect film as shown in FIG. 15A, but may be in the top and dual type magneto-resistance effect films as shown in FIGS. 15B and 15C, respectively.

(Mechanism Causing High MR Ratio)

Then, the physical mechanism causing high MR ratio in the magneto-resistance effect film containing the film structure 10 or 20 as shown in FIGS. 8 to 14 will be described. At present, however, the physical mechanism is not cleared entirely.

A. Mechanism (1) Causing High MR Ratio

First of all, the mechanism causing MR effect in a conventional CPP-GMR film without the film structure 10 or 20. GMR effect means that the electric resistance of the CPP-GMR film is changed in accordance with the change in relative angle between two or more ferromagnetic layers which are stacked one another via (a) non-magnetic layer(s). The GMR effect can be explained by a two-current model which is defined as electrons with upward spins and downward spins independently contribute the electric conduction of the CPP-GMR film. In this case, when the electrons are passed through the ferromagnetic layer, the electrons with spins which are directed in the same direction of the spins relating to the magnetization of the ferromagnetic layer are scattered in the ferromagnetic layer different from the electrons with spins which are directed in the opposite direction of the spins relating to the magnetization of the ferromagnetic layer. Herein, the former electrons are called as majority spin electrons and the latter electrons are called as minority spin electrons. Namely, the difference in spin scattering between the electrons with upward spins and the electrons with downward spins through the ferromagnetic layer, which is called as spin dependent scattering, is considered as the origin for the GMR effect.

If the two-current model is applied to the CPP-GMR film so as to consider the change in resistance the CPP-GMR film due to the spin dependent scattering, it is required that both of spin dependent bulk scattering and spin dependent interface scattering are considered. The spin dependent bulk scattering means a spin dependent scattering in the ferromagnetic layer and the spin dependent interface scattering means a spin dependent scattering at the interface between the ferromagnetic layer and the adjacent non-magnetic layer.

First of all, the spin dependent bulk scattering will be considered. The bulk resistivity $\rho F\uparrow$ of the majority spin electron in the ferromagnetic layer and the bulk resistivity $\rho F\downarrow$ of the minority spin electron in the ferromagnetic layer can be represented by the following equations:

$$\rho F\uparrow = 2\rho F/(1+\beta)$$

$$\rho F\downarrow = 2\rho F/(1-\beta).$$

Herein, $\rho F$ means a resistivity of the ferromagnetic layer, and $\beta$ means a spin dependent bulk scattering parameter. The difference between the bulk resistivity $\rho F\uparrow$ of the majority spin electron and the bulk resistivity $\rho F\downarrow$ of the minority spin electron becomes large as the absolute value of the spin dependent bulk scattering parameter is increased. In view of the bulk scattering, the bulk resistance $AR_F\uparrow$ and the bulk resistance $AR_F\downarrow$, corresponding to the resistivity $\rho Ft$ and the bulk resistivity $\rho F\downarrow$, can be obtained by multiplying the resistivity $\rho F\uparrow$ and the bulk resistivity $\rho F\downarrow$ by the thickness of the ferromagnetic layer as follows:

$$AR_F\uparrow = \rho F\uparrow \cdot tF = 2\rho F\cdot tF/(1+\beta)$$

$$AR_F\downarrow = \rho F\downarrow \cdot tF = 2\rho F/(1-\beta).$$

Then, the spin dependent interface scattering will be considered. The spin dependent interface scattering can be considered in the same manner as the spin dependent bulk scattering. The interface resistivity $AR_{F/S}\uparrow$ of the majority spin electron at the interface between the ferromagnetic layer and the spacer layer and the interface resistivity $AR_{F/S}\downarrow$ of the minority spin electron at the interface between the ferromagnetic layer and the spacer layer can be represented by the following equations:

$$AR_{F/S}\uparrow = 2AR_{F/S}/(1+\alpha)$$

$$AR_{F/S}\downarrow = 2AR_{F/S}/(1-\alpha).$$

Herein, $AR_{F/S}$ means an interface resistivity between the ferromagnetic layer and the spacer layer and $\alpha$ means a spin dependent interface scattering parameter. The difference between the interface resistivity $AR_{F/S}\uparrow$ and the interface resistivity $AR_{F/S}\downarrow$ becomes large as the absolute value of the spin dependent bulk scattering parameter $\alpha$ is increased.

The difference between the bulk resistance $AR_F\uparrow$ and the bulk resistance $AR_F\downarrow$ and the difference between the interface resistivity $AR_{F/S}\uparrow$ and the interface resistivity $AR_{F/S}\downarrow$ are the origin for the MR effect of the CPP-GMR film. The MR ratio becomes large as the difference between the bulk resistance $AR_F\uparrow$ and the bulk resistance $AR_F\downarrow$ and the difference between the interface resistivity $AR_{F/S}\uparrow$ and the interface resistivity $AR_{F/S}\downarrow$ are increased.

If the difference between the spin dependent bulk resistivities $\rho F\uparrow$ and $\rho F\downarrow$ is set larger, the MR ratio can be increased. Namely, if the material with a high spin dependent bulk parameter $\beta$ is employed, the MR ratio can be increased. Similarly, if the difference between the interface resistivities $AR_{F/S}\uparrow$ and $AR_{F/S}\downarrow$ is set larger, the MR ratio can be increased. Namely, if the material with a high spin dependent interface parameter $\alpha$ is employed, the MR ratio can be increased. The spin dependent bulk parameter $\beta$ and the spin dependent interface parameter $\alpha$ depend on the sort of the material of the ferromagnetic layer. In this point of view, examination is intensely conducted for finding a new material to develop the spin dependent bulk parameter $\beta$ and the spin dependent interface parameter $\alpha$. However, it is difficult to find out the new material while the characteristics of the magneto-resistance effect element with a spin valve structure as described above can be maintained.

Therefore, such an attempt is made as increasing the thickness $t_F$ of the ferromagnetic layer so as to develop the spin dependent bulk scattering. In this case, however, since the total thickness of the magneto-resistance effect film containing the ferromagnetic layer is increased so that the gap length of the reading head is also increased. Moreover, if the thickness of the pinned layer is increased originated from the increase of the ferromagnetic layer, the fixing for the pinned layer may be weakened. Furthermore, if the thickness of the free layer is increased originated from the increase of the ferromagnetic layer, the reading sensitivity may be deteriorated.

Moreover, such an attempt is made as increasing the number of interface between the ferromagnetic layer and the spacer layer so as to develop the spin dependent interface scattering. In this case, however, the total number of interface is limited to four by forming a multilayered structure of pinned layer/spacer layer/free layer/pinned layer in view of the magneto-resistance effect film of dual spin valve structure. With the dual spin valve structure, two thinner pinning layer are additionally required so as to increase the total thickness of the magneto-resistance effect film of the dual spin valve structure, and thus, cause the disadvantages as increasing the thickness $t_F$ of the ferromagnetic layer.

Figure 17:
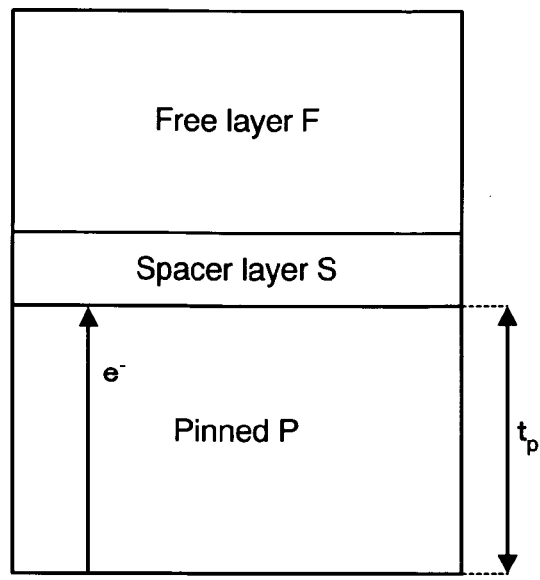
FIG. 17 is a schematic view for explaining the mechanism of high MR ratio of the magneto-resistance effect film with the film structure according to the embodiment.
Figure 18:
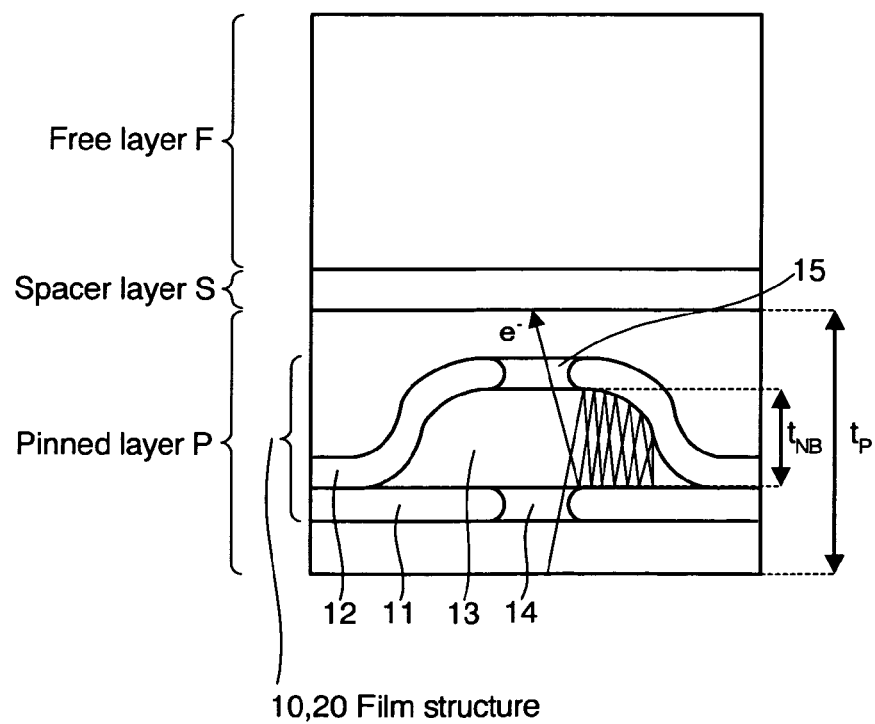
FIG. 18 is also a schematic view for explaining the mechanism of high MR ratio of the magneto-resistance effect film with the film structure according to the embodiment.
Figure 19:
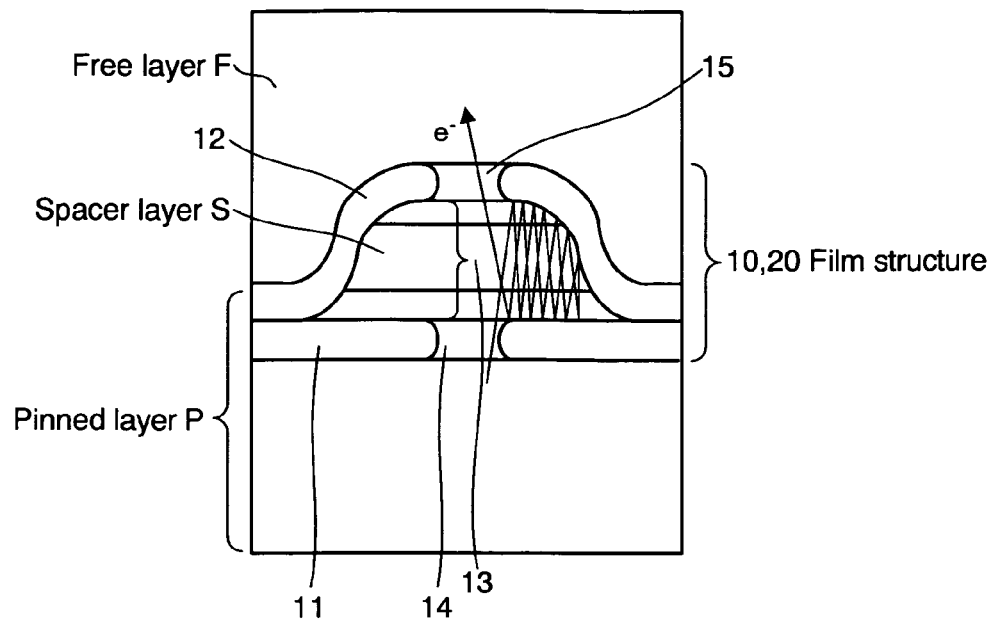
FIG. 19 is also a schematic view for explaining the mechanism of high MR ratio of the magneto-resistance effect film with the film structure according to the embodiment.

Then, a magneto-resistance effect film with the film structure 10 or 20 will be considered. FIGS. 17 to 19 are schematic views for explaining the mechanism causing the high MR ratio in the magneto-resistance effect film with the film structure 10 or 20. In FIGS. 17 to 19, only the spin dependent scattering unit made of the pinned layer P, the spacer layer S and the free layer F is shown. FIG. 17 shows the state where no film structure is formed. FIG. 18 shows the state where the film structure 10 or 20 is disposed in the pinned layer P. FIG. 19 shows the state where the film structure 10 or 20 is disposed over the pinned layer P/the spacer layer S/the free layer F. In figures, the film structure 20 is typically employed, but the film structure 10 may be also employed instead of the film structure 20.

When a current is flowed from the free layer F to the pinned layer P, the electrons relating to the current are passed through the second conductor 14, the first conductor 13 and the third conductor 15. In the case that the thickness $t_{NB}$ of the second conductor 13 of the film structure 20 (10) is set smaller than the mean free path of each of the electrons, the electrons are collided with the inner wall of the insulating material and thus, reflected. Herein, the mean free path means a distance the electron can travel under no scattering. Suppose that the average reflection number of electron at the inner wall of the insulating material is set to "N" until the electron is passed through the third conductor 15 after the electron is taken in via the second conductor 14, the traveling distance of the electron in the first conductor 13 can be defined as $(N+1)\cdot t_{NB}$. Namely, it is expected that the traveling distance of the electron in the ferromagnetic layer can be increased while the physical thickness of the ferromagnetic layer is maintained thinner.

In FIG. 18, the film structure 20 (10) is disposed in the pinned layer P, and the first conductor 13, the second conductor 14 and the third conductor 15 are made of the same ferromagnetic material as the ferromagnetic layer FM of the pinned layer P. In FIG. 18, the traveling distance $t_F^{\mathit{eff}}$ when the electron is passed through the pinned layer P can be represented by "$t_{pin} - t_{NB} + (N+1)\cdot t_{NB}$" ($t_{pin}$: thickness of pinned layer P) in view of the reflection at the inner wall. Therefore, the bulk resistance $AR_F\uparrow$ of majority spin electron and the bulk resistance $AR_F\downarrow$ of minority spin electron can be represented by the following equation:

$$AR_F\uparrow = \rho F\uparrow \cdot t_F^{\mathit{eff}}$$
$$= 2\rho F \cdot \{t_{pin} - t_{NB} + (N+1)\cdot t_{NB}\}/(1+\beta)$$

$$AR_F\downarrow = \rho F\downarrow \cdot t_F^{\mathit{eff}}$$
$$= 2\rho F \cdot \{t_{pin} - t_{NB} + (N+1)\cdot t_{NB}\}/(1-\beta).$$

On the other hand, if no film structure is disposed as shown in FIG. 17, the traveling distance is almost equal to the thickness $t_{pin}$ of the pinned layer P. Therefore, although the physical thickness of the pinned layer P in FIG. 17 is almost equal to the physical thickness of the pinned layer P in FIG. 18, the traveling distance of the electron in FIG. 18 becomes larger than the traveling distance of the electron in FIG. 17 with the film structure 20 (10) so that the difference between the bulk resistances $AR_F\uparrow$ and $AR_F\downarrow$ becomes large, thereby increasing the MR ratio.

In FIG. 19, the film structure 20 (10) is disposed over the pinned layer P, the spacer layer S and the free layer F. The second conductor 14 is made of the same ferromagnetic material as the pinned layer P and the third conductor 15 is made of the same ferromagnetic material as the free layer F. The first conductor 13 is made of the multilayered structure of the pinned layer P/the spacer layer S/the free layer F. In FIG. 19, since the interfaces between the pinned layer P and the spacer layer S and between the spacer layer S and the free layer F are disposed in the first conductor 13, the passage number of the electron through the interfaces can be increased by the reflection of the electron at the inner wall of the insulating material. Therefore, the passage number of the electron through the spin dependent scattering interface can be increased while the physical thickness of the ferromagnetic layer such as the pinned layer P and the free layer F is maintained, thereby increasing the MR ratio.

Then, since the first conductor 13 contains the pinned layer P and the free layer F, the difference between the bulk resistances $AR_F\uparrow$ and $AR_F\downarrow$ becomes large in the same manner as in FIG. 18.

B. Mechanism (1) Causing High MR Ratio

The mechanism (1) causing high MR ratio described in Section A is considered on semiclassical theory. On the other hand, the dimension of the film structure 20 (10) is set in the order of nano-meter, the electron passing through the film structure 20 (10) may exhibit quantum conduction. Herein, the combination of the electron conduction on semiclassical theory and the electron conduction on quantum theory is called as mesoscopic conduction.

FIG. 20 relates to schematic views for explaining the mesoscopic conduction originated from the size effect of the film structure 20 (10).

Figure 20A:
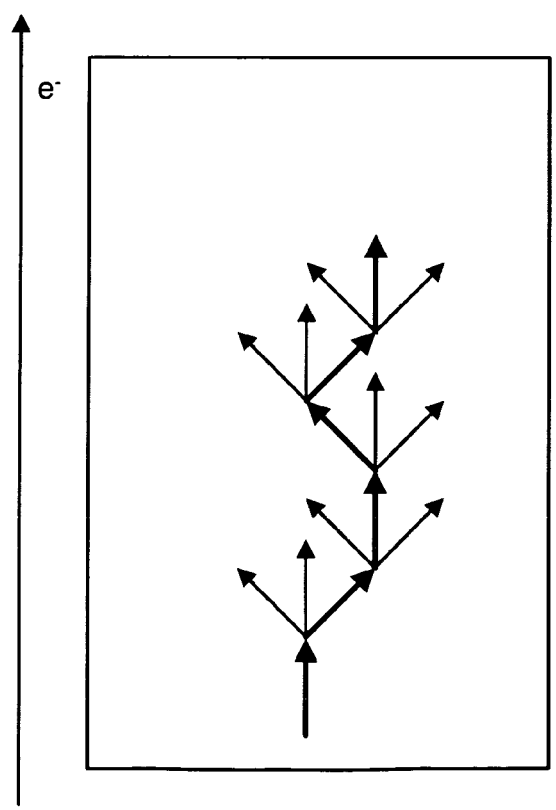
FIG. 20 also relates to schematics view for explaining the mechanism of high MR ratio of the magneto-resistance effect film with the film structure according to the embodiment.
Figure 20B:
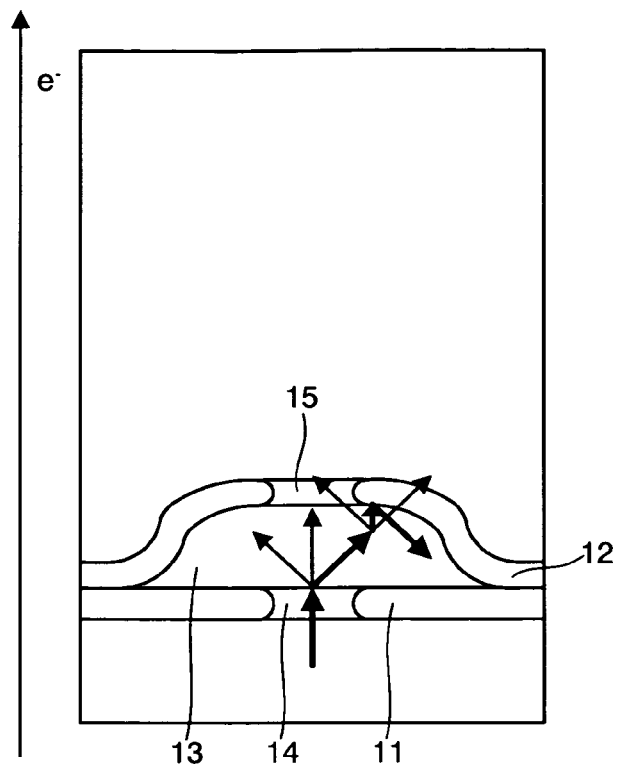

As shown in FIG. 20B, for example, in the case that the dimension of the film structure 20 (10) is set sufficiently larger than the mean free path of each of the electrons passing through the ferromagnetic layers and the non-magnetic layer in the film structure 20 (10), the electric conduction relating to the electrons can be considered on the statistical average during scattering, and thus, similar to the electric conduction in the structure without the film structure 20 (10) as shown in FIG. 20A.

Figure 20C:
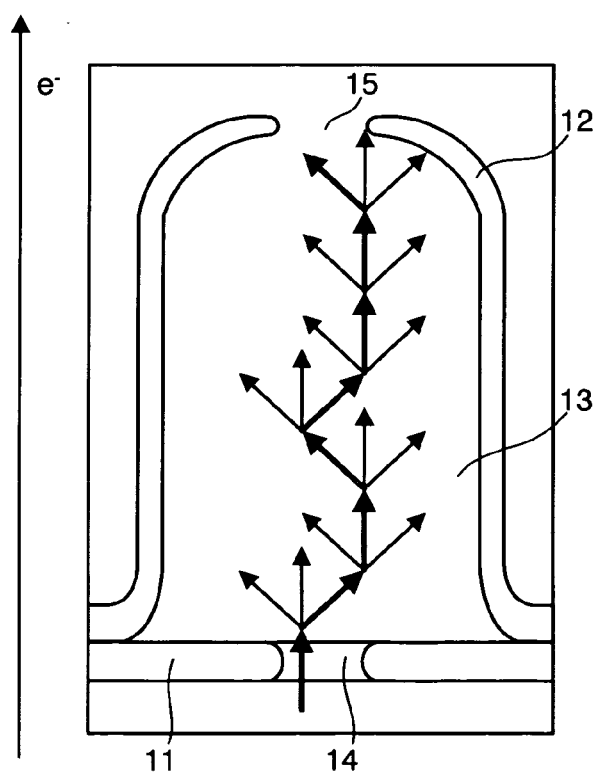

According to an embodiment of the present invention, as shown in FIG. 20C, in the case that the dimension of the film structure 20 (10) is not set sufficiently larger than the mean free path of each of the electrons passing through the ferromagnetic layers and the non-magnetic layer in the film structure 20 (10), since the scattering number of each of the electrons is small so that the scattering processes of the electrons are not averaged, the electric conduction relating to the electrons is affected by the shapes of the first conductor 13, the second conductor 14 and the third conductor 15. In the latter case relating to FIG. 20 C, if the film structure 20 (10) is disposed in a magneto-resistance effect film (e.g., CPP-GMR film), the quantum MR effect originated from the shape of the film structure 20 (10) is expected in addition to the statistical MR effect originated from the statistical average of the majority spin electrons and the minority spin electrons during scattering as in a conventional CPP-GMR film.

Suppose that the film structure 20 (10) is disposed in the pinned layer P and the first conductor 13 of the film structure 20 (10) is made of ferromagnetic material. In view of the mean free path of each of the majority spin electrons and the mean free path of each of the minority spin electrons, the resistivity $\rho F\uparrow$ of each of the majority spin electrons becomes larger than the resistivity $\rho F\downarrow$ of each of the minority spin electrons when the spin dependent bulk scattering parameter $\beta$ is positive. Namely, the mean free path $\lambda F\uparrow$ of each of the majority spin electrons becomes larger than the mean free path $\lambda F\downarrow$ of each of the minority spin electrons.

In the case that the size of the film structure 20 (10) (the thickness of the first conductor 13) is not set sufficiently larger than the mean free path of each of the electrons in the ferromagnetic layer of the first conductor 13, it may be that the scattering probability of each of the majority spin electrons becomes different from the scattering probability of each of the minority spin electrons in the ferromagnetic layer. Concretely, the majority spin electrons are unlikely to be scattered in the film structure 20 (10) and thus, passed through the film structure 20 (10). On the other hand, the electrons scattered in the film structure 20 (10) are likely to be collided with the inner wall of the film structure 20 (10) and thus, scattered again. As a result, the difference in resistance caused when the majority spin electrons and the minority spin electrons pass through the film structure 20 (10) may becomes larger than the difference in resistance when the majority spin electrons and the minority spin electrons pass through the ferromagnetic layer with the same thickness as the film structure 20 (10).

In the case that the scattering probability of each of the majority spin electrons becomes different from the scattering probability of each of the minority spin electrons and the majority spin electrons are unlikely to be scattered in the film structure 20 (10) and thus, passed through the film structure 20 (10), it is considered that the number of majority spin electron passing through the film structure 20 (10) becomes more than the number of minority spin electron passing through the film structure 20 (10). For example, when the film structure 20 (10) is disposed in the pinned layer P and a current is flowed so that the electrons originated from the current are passed through the pinned layer P, the spacer layer S and the free layer F in turn, the shift in number between the upward spin electrons and the downward spin electrons, originated from that the number of majority spin electron passing through the film structure 20 (10) becomes more than the number of minority spin electron structure passing through the film structure 20 (10), is reflected in the free layer F under no spin-flip so that the MR ratio, ordinarily determined by the relative angle in magnetization between the pinned layer P and the free layer F, may be enhanced.

Then, suppose that the film structure 20 (10) is disposed in the spacer layer S and the first conductor 13 of the film structure 20 (10) is made of non-magnetic material. In a conventional CPP-GMR film, the scattering of electron in the non-magnetic layer NM of the spacer layer S is not desired because the resistance not depending on spin is increased. When the electrons are scattered in the non-magnetic layer NB, spin-flip is caused between upward spin electrons and the downward spin electrons of the scattered electrons so that the electrons through the pinned layer P lose the spin information until the electrons reach the free layer F, thereby deteriorating the MR effect.

In this case, when the electrons pass through the film structure 20 (10), some electrons not scattered in the non-magnetic layer NM of the film structure 20 (10) travel in the film structure 20 (10), and other electrons scattered in the non-magnetic layer NM of the film structure 20 (10) collide against the inner wall of the film structure 20 (10), and thus, are also scattered by the film structure 20 (10). The passage ratio of the scattered electrons may be decreased. Since the not scattered electrons do not lose the spin information and thus, desirably contribute to the enhancement of the MR ratio, the MR ratio may be enhanced by the not scattered electrons.

In this embodiment, since the dimension of the film structure 20 (10) is set in the order of nano-meter and not sufficiently larger than the mean free path of each of the electrons in the ferromagnetic layer, the MR ratio may be enhanced by the mesoscopic effect as described above.

(Method for Forming Film Structure)

Then, the method for forming the film structure 10 or 20. First of all, the first current confining layer is formed. The metallic layer m11 constituting the matrix of the second conductor 14 is formed, and the metallic layer m12 to be converted into the first insulating layer 11 is formed. The metallic layer m11 may be made of non-magnetic material such as Cu or ferromagnetic material such as Co. The metallic layer m12 may be made of Al or the like.

Then, surface oxidizing treatment or surface nitriding treatment is conducted for the metallic layer m12 so as to partially form the first current confining layer. In this case, the metallic layer m11 is partially pumped up into the metallic layer m12 while the metallic layer m12 is converted into the first insulating layer. In order to pump up the portion of the metallic layer m11 into the metallic layer m12, concretely, it is required to supply atom moving energy to the metallic layer m11. In the surface oxidizing treatment and the surface nitriding treatment, in this point of view, it is desired that ionized gas or plasma gas is supplied to the metallic layer m11 instead of simple natural oxidation or natural nitriding through the oxygen gas flow or nitrogen gas flow. The energized surface oxidizing treatment and surface nitriding treatment using the ionized gas or the plasma gas is desired to convert the metallic layer m12 into the insulating layer with high insulation made of oxide, nitride or oxynitride.

Therefore, it is desired that the surface oxidizing treatment and the surface nitriding treatment are conducted by ionizing gas such as Ar, Kr, He or rendering the same gas plasma, and then, using the thus obtained ionized gas or plasma gas as energy assist.

In order to conduct the energy assist effectively and efficiently in the surface oxidizing treatment and the surface nitriding treatment, it is desired that the ionized gas or the plasma gas is supplied onto the metallic layer m12 after or before the surface oxidizing treatment and the surface nitriding treatment. When the ionized gas or the plasma gas is supplied onto the metallic layer m12 after the surface oxidizing treatment or the surface nitriding treatment, the surface oxidizing treatment or the surface nitriding treatment can be assisted afterward so that the first conductor 13 can be formed separated from the first insulating layer 11 under good condition. When the ionized gas or the plasma gas is supplied onto the metallic layer m12 before the surface oxidizing treatment or the surface nitriding treatment, the atom moving energy can be supplied to the metallic layer m12 in advance so that the second conductor 14 can be formed under good condition through post-oxidation.

The ionized gas or the plasma gas may be supplied after and before the surface oxidizing treatment and the surface nitriding treatment.

In the surface oxidizing treatment, the ionized gas or the plasma gas is supplied under the condition that the accelerating voltage is set within a range of +40 to +200 V and the beam current Ib is set within a range of 30 to 300 mA.

Then, the first conductor 13 is formed on the resultant current confining layer. When the first conductor 13 is made of a multilayered structure, the constituent layers of the first conductor 13 are subsequently formed.

Then, the second current confining layer is formed on the first conductor 13. First of all, the metallic layer m21 constituting the matrix of the third conductor 15 is formed, and the metallic layer m22 to be converted into the second insulating layer 12 is formed. The metallic layer m21 may be made of non-magnetic material such as Cu or ferromagnetic material such as Co. The metallic layer m22 may be made of Al or the like. Then, surface oxidizing treatment or surface nitriding treatment is conducted in the same manner as the formation of the first current confining layer.

In the formation process, when the first conductor 13 is formed thicker, the film structure 10 is formed as shown in FIG. 1, and when the first conductor 13 is formed thinner, the film structure 20 is formed as shown in FIG. 2.

(Components of Magneto-Resistance Effect Element Except Film Structure)

Figure 21:
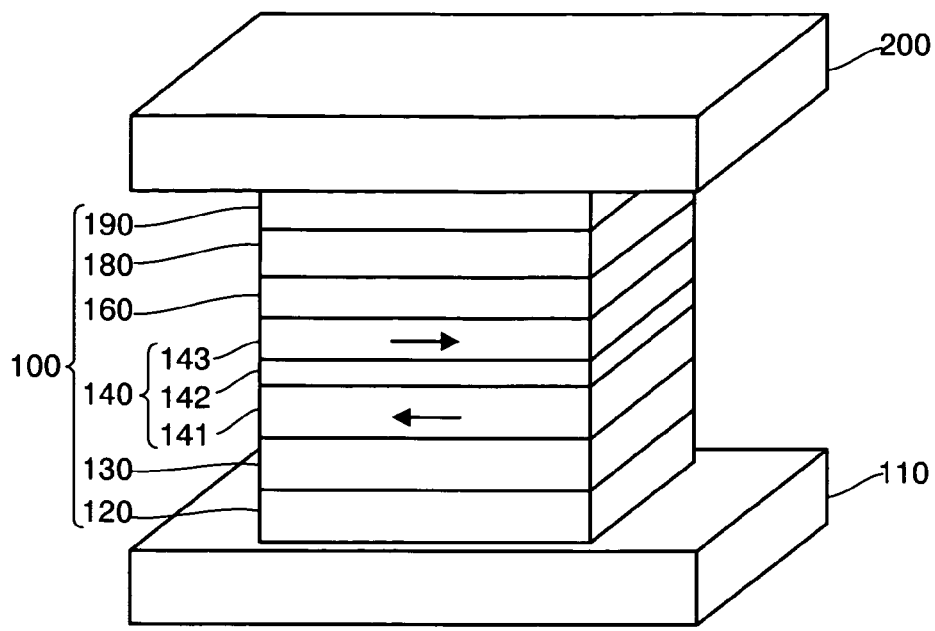
FIG. 21 is a perspective view showing the structure of a magneto-resistance effect.

Then, a typical structure of a magneto-resistance effect film will be described in reference to the structure of the film structure 10 or 20. FIG. 21 is a perspective view illustrating a magneto-resistance effect element. The magneto-resistance effect element 100 illustrated in FIG. 21 includes a top electrode 110, an under layer 120, a pinning layer 130, a pinned layer 140, a spacer layer 160, a free layer 180, a cap layer 190 and a top electrode 200 which are subsequently stacked on a substrate (not shown). The pinned layer 140, the spacer layer 160 and the free layer 180 constitute a spin valve film (spin dependent scattering unit) which is ordinarily configured as sandwiching a spacer layer by two ferromagnetic layers.

The bottom electrode 110 functions as an electrode for flowing a current in the direction perpendicular to the magneto-resistance effect film 100. In real, the current can be flowed through the magneto-resistance effect film 100 in the direction perpendicular to the film surface thereof by applying a voltage between the bottom electrode 110 and the top electrode 200. The change in resistance of the spin valve film originated from the magneto-resistance effect film can be detected by utilizing the current. In other words, the magnetization detection can be realized by the current flow. The bottom electrode 110 is made of a metallic layer with a relatively small electric resistance for flowing the current to the magneto-resistance effect film sufficiently.

The under layer 120 may be composed of a buffer layer 120a and a seed layer 120b. The buffer layer 120a can be employed for the compensation of the surface roughness of the bottom electrode 110. The seed layer 120b can be employed for controlling the crystalline orientation and the crystal grain size of the spin valve film (magneto-resistance effect film 100) to be formed on the under layer 120.

The buffer layer 120a may be made of Ta, Ti, W, Zr, Hf, Cr or an alloy thereof. The thickness of the buffer layer 120a is preferably set within 2 to 10 nm, more preferably set within 3 to 5 nm. If the buffer layer 120a is formed too thin, the buffer layer 120a can not exhibit the inherent buffering effect. If the buffer layer 120a is formed too thick, the Series resistance not contributing to the MR ratio is increased. If the seed layer 120b can exhibit the buffering effect, the buffer layer 120a may be omitted. In a preferable example, the buffer layer 120a is made of a Ta layer with a thickness of 3 nm.

The seed layer 120b may be made of any material controllable for the crystalline orientation of (a) layer(s) to be formed thereon. For example, the seed layer 120b may be made preferably of a metallic layer with a fcc structure (face-centered cubic structure), a hcp structure (hexagonal close-packed structure) or a bcc structure (body-centered cubic structure). Concretely, the seed layer 120b may be made of Ru with hcp structure or NiFe with fcc structure so that the crystalline orientation of the spin valve film to be formed thereon can be rendered an fcc (111) faced orientation. The crystalline orientation of the pinning layer 130 (e.g., made of PtMn) can be rendered an fct (111)-structure (face-centered tetragonal structure)-regulated orientation.

In order to exhibit the inherent seeding function of the seed layer 120b of enhancing the crystalline orientation sufficiently, the thickness of the seed layer 120b is set preferably within 1 to 5 nm, more preferably within 1.5 to 3 nm. In a preferable example, the seed layer 120b may be made of a Ru layer with a thickness of 2 nm. The crystalline orientation for the spin valve film and the pinning layer 130 can be measured by means of X-ray diffraction. For example, the FWHMs (full width at half maximum) in X-ray rocking curve of the fcc (111) peak of the spin valve film, the fct (111) peak or the bcc (110) peak of the pinning layer 130 (PtMn) can be set within a range of 3.5 to 6 degrees, respectively under good crystallinity. The dispersion of the orientation relating to the spin valve film and the pinning layer can be recognized by means of diffraction spot using cross section TEM.

The seed layer 120b may be made of a NiFe-based alloy (e.g., $Ni_xFe_{100-x}$: X=90 to 50%, preferably 75 to 85%) layer of a NiFe-based non-magnetic (($Ni_xFe_{100-x})_{100-y}X_y$: X=Cr, V, Nb, Hf, Zr, Mo)) layer. In the latter case, the addition of the third element "X" renders the seed layer 120b non-magnetic. The crystalline orientation of the seed layer 120b of the NiFe-based alloy can be enhanced easily so that the FWHM in X-ray rocking curve can be rendered within a range of 3 to 5 degrees.

The seed layer 120b functions not only as the enhancement of the crystalline orientation, but also as the control of the crystal grain size of the spin valve film. Concretely, the crystal grain size of the spin valve film can be controlled within a range of 5 to 40 nm so that the fluctuation in performance of the magneto-resistance effect element can be prevented, and thus, the high MR ratio can be realized even though the magneto-resistance effect element is downsized.

The crystal grain size of the spin valve film can be determined on the crystal grain size of the layer formed between the seed layer 120b and the spacer layer 160 by means of cross section TEM. In the case of a bottom type spin valve film where the pinned layer 14 is located below the spacer layer 160, the crystal grain size of the spin valve film can be determined on the crystal grain size of the pinning layer 130 (antiferromagnetic layer) or the pinned layer 140 (fixed magnetization layer) to be formed on the seed layer 120b.

With a reproducing head in view of high recording density, the element size is set to 100 nm or below, for example. Therefore, if the crystal grain size is set larger for the element size, the element characteristics may be fluctuated. In this point of view, it is not desired that the crystal grain size of the spin valve film is set larger than 40 nm. Concretely, the crystal grain size is preferably set within a range of 5 to 40 nm, more preferably within a range of 5 to 20 nm.

Too large crystal grain size may cause the decrease of the number of crystal grain per element surface so as to cause fluctuation in characteristics of the reproducing head. Therefore, it is not desired to increase the crystal grain size than a prescribed grain size. Particularly, too large crystal grain size is not desired in the magneto-resistance effect film containing the film structure 10 or 20 with the current confining paths. In contrast, too small crystal grain size may deteriorate the crystalline orientation. In this point of view, the preferable range of the crystal grain size of the spin valve film is within a range of 5 to 20 nm in view of the upper limited value and the lower limited value thereof.

With MRAM, the element size may be set to 100 nm or more. In this case, if the crystal grain size of the spin valve film is set to about 40 nm, the above-described problems may not occur. Namely, too large crystal grain size may not cause the above-described problems by using the seed layer 120b.

In order to set the crystal grain size within 5 to 20 nm, the seed layer 120b may be made of a Ru layer with a thickness of 2 nm or a NiFe-based non-magnetic $((Ni_XFe_{100-X})_{100-Y}X_Y$: X=Cr, V, Nb, Hf, Zr, Mo, preferably y=0 to 30%)) layer.

In the case that the crystal grain size is set to 40 nm or more, the content of the third element "X" is preferably increased. When the seed layer 120 bis made of NiFeCr, the content of Cr is set within a range of 35 to 45%. In this case, the composition of the NiFeCr is set to a composition of the boundary phase between the fcc phase and the bcc phase so that the NiFeCr layer has a bcc structure.

As described above, the thickness of the seed layer 120b is preferably set within a range of 1 to 5 nm, more preferably within a range of 1.5 to 3 nm. Too thin seed layer 120b may deteriorate the controllability of the crystal orientation. Too thick seed layer 120b may cause the increase of the Series resistance and rough the interface of the spin valve film.

The pinning layer 130 functions as applying the unidirectional anisotropy to the ferromagnetic layer to be the pinned layer 140 on the pinning layer 130 and fixing the magnetization of the pinned layer 140. The pinning layer 130 may be made of an antiferromagnetic material such as PtMn, PdPtMn, IrMn, RuRhMn, FeMn, NiMn. In view of the use of the element as a high density recording head, the pinning layer 130 is preferably made of IrMn because the IrMn layer can apply the unidirectional anisotropy to the pinned layer 140 in comparison with the PtMn layer even though the thickness of the IrMn layer is smaller than the thickness of the PtMn layer. In this point of view, the use of the IrMn layer can reduce the gap width of the intended element for high density recording.

In order to apply the unidirectional anisotropy with sufficient intensity, the thickness of the pinning layer 130 is appropriately controlled. In the case that the pinning layer 130 is made of PtMn or PdPtMn, the thickness of the pinning layer 130 is set preferably within 8 to 20 nm, more preferably within 10 to 15 nm. In the case that the pinning layer 13 is made of IrMn, the unidirectional anisotropy can be applied even though the thickness of the pinning layer 130 of IrMn is set smaller than the thickness of the pinning layer 130 of PtMn. In this point of view, the thickness of the pinning layer 130 of IrMn is set preferably within 4 to 18 nm, more preferably within 5 to 15 nm. In a preferred embodiment, the thickness of the IrMn pinning layer 13 is set to 7 nm.

The pinning layer 130 may be made of a hard magnetic layer instead of the antiferromagnetic layer. For example, the pinning layer 130 may be made of CoPt (Co=50 to 85%), $(CoPt_{100-X})_{100-Y}Cr_Y$: X=50 to 85%, Y=0 to 40%) or FePt (Pt=40 to 60%). Since the hard magnetic layer has a smaller specific resistance, the Series resistance and the area resistance RA of the element can be reduced.

The pinned layer 140 is formed as a synthetic pinned layer composed of the bottom pinned layer 141 (e.g., $Co_{90}Fe_{10}$ 3.5 nm), the magnetic coupling layer 142 (e.g., Ru) and the top pinned layer 143 (e.g., $Fe_{50}Co_{50}$ 1 nm/Cu 0.25 nm×2/ $Fe_{50}Co_{50}$ 1 nm). The pinning layer 130 (e.g., IrMn layer) is coupled via magnetic exchange with the bottom pinned layer 141 formed on the pinning layer 130 so as to apply the unidirectional anisotropy to the bottom pinned layer 141. The bottom pinned layer 141 and the top pinned layer 143 which are located under and above the magnetic coupling layer 142, respectively, are strongly magnetically coupled with one another so that the direction of magnetization in the bottom pinned layer 141 becomes anti-paralleled to the direction of magnetization in the top pinned layer 143.

The bottom pinned layer 141 may be made of $Co_XFe_{100-X}$ alloy (X=0 to 100), $Ni_XFe_{100-X}$ (X=0 to 100) or an alloy thereof containing a non magnetic element. The bottom pinned layer 141 may be also made of a single element such as Co, Fe, Ni or an alloy thereof. It is desired that the magnetic thickness (saturated magnetization Bs×thickness t (Bs·t)) of the bottom pinned layer 141 is set almost equal to the one of the top pinned layer 143. Namely, it is desired that the magnetic thickness of the top pinned layer 143 corresponds to the magnetic thickness of the bottom pinned layer 141. For example, when the top pinned layer 143 of $Fe_{50}Co_{50}$ 1 nm/Cu 0.25 nm×2/$Fe_{50}Co_{50}$ 1 nm is employed, the magnetic thickness of the top pinned layer 143 is set to 2.2 T×3 nm=6.6 Tnm because the saturated magnetization of the top pinned layer 143 is about 2.2 T. When the bottom pinned layer 141 of $Co_{90}Fe_{10}$ is employed, the thickness of the bottom pinned layer 141 is set to 6.6 Tnm/1.8 T=3.66 nm for the magnetic thickness of 6.6Tnm because the saturated magnetization of $Co_{90}Fe_{10}$ is about 1.8 T. Therefore, the thickness of the bottom pinned layer 141 is preferably set to about 3.6 nm.

The thickness of the bottom pinned layer 141 is preferably set within 2 to 5 nm in view of the magnetic strength of the unidirectional anisotropy relating to the pinning layer 130 (e.g., IrMn layer) and the magnetic strength of the antiferromagnetic coupling between the bottom pinned layer 141 and the top pinned layer 143 via the magnetic coupling layer 142 (e.g., Ru layer). Too thin bottom pinned layer 141 causes the decrease of the MR ratio. In contrast, too thick bottom pinned layer 141 causes the difficulty of obtaining the unidirectional anisotropy magnetic field requiring for the operation of the element. In a preferred embodiment, the bottom pinned layer 141 may be made of a $CO_{75}Fe_{25}$ layer with a thickness of 3.4 nm.

The magnetic coupling layer 142 (e.g., Ru layer) causes the antiferromatic coupling between the bottom pinned layer 141 and the top pinned layer 143 which are located under and above the magnetic coupling layer 142, thereby constituting the synthetic pinned structure. In the case that the magnetic coupling layer 142 is made of the Ru layer, the thickness of the Ru layer is preferably set within 0.8 to 1 nm. Only if the antiferromagnetic coupling between the pinned layers located under and above the magnetic coupling layer 142 can be generated, the magnetic coupling layer 142 may be made of another material except Ru or the thickness of the magnetic coupling layer 142 may be varied within 0.3 to 0.6 nm instead of the thickness range of 0.8 to 1 nm. The former thickness range of 0.3 to 0.6 nm corresponds to the first peak of RKKY (Runderman-Kittel-Kasuya-Yoshida), and the latter thickness range of 0.8 to 1 nm corresponds to the second peak of RKKY. In an embodiment, the thickness of the Ru layer may be set to 0.9 nm so as to enhance the reliability of the antimagnetic coupling between the bottom pinned layer 141 and the top pinned layer 143.

Then, in the case of the top pinned layer 143 of the $Fe_{50}Co_{50}$ layer with bcc structure, since the spin dependent interface scattering is enhanced, the MR ratio can be enhanced. As the FeCo-based alloy with bcc structure, a $Co_XFe_{100-X}$ alloy (X=30 to 100) or a similar CoFe-based alloy containing an additive element can be exemplified. Among them, a $Fe_{40}CO_{60}$ alloy through a $Fe_{80}CO_{20}$ alloy may be employed in view of the above-described requirements.

In the case that the top pinned layer 143 is made of the magnetic layer with bcc structure easily exhibiting high MR ratio, the thickness of the top pinned layer 143 is preferably set to 1.5 nm or more so as to maintain the bcc structure thereof stably. Since the spin valve film is made mainly of a metallic material with fcc structure or fct structure, only the top pinned layer 143 may have the bcc structure. In this point of view, too thin top pinned layer 143 can not maintain the bcc structure thereof stably so as not to obtain the high MR ratio.

Herein, the top pinned layer 143 is made of the $Fe_{50}Co_{50}$ layers and the extremely thin Cu layers. The total thickness of the FeCo layers is 3 nm and the Cu layer is formed on the lower FeCo layer with a thickness of 1 nm. The thickness of the Cu layer is 0.25 nm and the total thickness of the top pinned layer 143 is 3.5 nm.

The thickness of the top pined layer 143 is set to preferably to 5 nm or less so as to cause a large fixing (pinning) magnetic field. The thickness range of the top pinned layer 143 is set preferably within 2 to 4 nm so as to realize the large fixing magnetic field and the stability of the bcc structure thereof.

The top pinned layer 143 may be made of a $Co_{90}Fe_{10}$ alloy with fcc structure or a Co alloy with hcp structure which used to be widely employed for a conventional magneto-resistance effect element, instead of the magnetic material with the bcc structure. The top pinned layer 143 can be made of a single element such as Co, Fe, Ni or an alloy containing at least one element selected from the group consisting of Co, Fe, Ni. In view of the high MR ratio of the top pinned layer 143, the FeCo alloy with the bcc structure, the Co alloy containing Co element of 50% or more and the Ni alloy containing Ni element of 50% or more are in turn preferable.

In this embodiment, the top pinned layer 143 is made of the magnetic layers (FeCo layers) and the non magnetic layers (extremely thin Cu layers) which are alternately stacked respectively. In this case, the top pinned layer 143 can enhance the spin dependent bulk scattering effect originated from the extremely thin Cu layers.

In view of the development of the spin dependent bulk scattering effect, the thickness of the thin Cu layer is set preferably within 0.1 to 1 nm, more preferably within 0.2 to 0.5 nm. Too thin Cu layer can not develop the spin dependent bulk scattering effect sufficiently. Too thick Cu layer may reduce the spin dependent bulk scattering effect and weaken the magnetic coupling between the magnetic layers via the non magnetic Cu layer, thereby deteriorating the property of the pinned layer 140. In a preferred embodiment, in this point of view, the thickness of the non-magnetic Cu layer is set to 0.25 nm.

The non-magnetic layer sandwiched by the magnetic layers may be made of Hf, Zr, Ti instead of Cu. In the case that the pinned layer 140 contains the non-magnetic layer(s), the thickness of one of the magnetic layers such as FeCo layers which are separated by the non-magnetic layer is set preferably within 0.5 to 2 nm, more preferably within 1 to 1.5 nm.

In this embodiment, the top pinned layer 143 is constituted of the alternately stacking structure of FeCo layer and Cu layer, but may be made of an alloy layer of FeCo and Cu. The composition of the resultant FeCoCu alloy may be set to $((Fe_XCo_{100-X})_{100-Y}Cu_Y$: X=30 to 100%, Y=3 to 15%), but set to another composition range. The third element to be added to the matrix of FeCo may be selected from Hf, Zr, Ti instead of Cu.

The top pinned layer 143 may be also made of a single element such as Co, Fe, Ni or an alloy thereof. In a simplified embodiment, the top pinned layer 143 may be made of an $Fe_{90}Co_{10}$ layer with a thickness of 2 to 4 nm, as occasion demands, containing a third additive element.

The spacer layer 160 magnetically separates the pinned layer 140 and the free layer 180. The spacer layer 160 may be made of Cu, Au, Ag, Rh, Ru, Mn, Cr, Re, Os, Ir or Pd. Among the exemplified materials, Cu, Au and Ag are desirable due to low oxidation energy and high electric conductivity. It is required that the thickness of the spacer layer 160 is set smaller than the spin diffusion length in the pinned layer 140 and the free layer 180. For example, the spin diffusion length of the NiFe is about 5 nm. In this point of view, it is desired that the spacer layer 160 is formed thinner.

It is also required that the magnetic coupling between the pinned layer 140 and the free layer 180 can be magnetically separated under no practical issue so as not to change the direction of the magnetization of the pinned layer 140 when the direction of the magnetization of the free layer 180 is changed in accordance with an external magnetic field. Therefore, the thickness of the spacer layer 160 must be set to a prescribed thickness.

When the spacer layer 160 is made of metal, the lower limited value of the thickness of the spacer layer 160 is about 1.5 nm. Therefore, the thickness of the spacer layer 160 is set preferably within a range of 1.5 to 5 nm, more preferably within a range of 2 to 4 nm.

As described later, the spacer layer 160 may be configured as a CCP structure. The CCP structure means the structure where conductors are formed two-dimensionally passing through the insulating layer so as to confine the current flowed perpendicular to the CCP structure. In this case, the spin dependent interface scattering effect can be utilized so as to enhance the MR effect. With the CCP structure, the magnetic coupling between the pinned layer 140 and the free layer 180 is likely to be magnetically separated by the oxide layer of the CCP structure. The oxide layer can exhibit the CPP effect (current confining effect) of the CCP structure. Therefore, the thickness of the spacer layer 160 can be set less than 1.5 nm. With the CCP structure, the CCP structure may be sandwiched by the Cu layers so as to form the multilayered structure of Cu layer/CCP structure/Cu layer. The thickness of each Cu layer is set preferably within a range of 0 to 1 nm.

The oxide layer of the CCP structure may be made of oxide containing at least one selected from the group consisting of Ta, Cr, Ti, Zr, Hf, Al, Si, Mg, V, W and Mo. The thickness of the oxide layer is preferably set within a range of 1 to 3 nm. The spacer layer 160 may be formed as a magnetic spacer.

The free layer 180 is a ferromagnetic layer of which the direction of magnetization is changed in accordance with an external magnetic field. For example, the free layer 180 is made of a double-layered structure of $Co_{90}Fe_{10}$ 1 nm/$Ni_{83}Fe_{17}$ 3.5 nm. The layered structure is formed by disposing the CoFe layer at the interface between the NiFe layer and the spacer layer 160. Moreover, it is desired that the CoFe layer is formed in the vicinity of the spacer layer 160 in comparison that the NiFe layer is formed in the vicinity of the spacer layer 160. In order to realize the high MR ratio, the selection of magnetic material of the free layer 180 in the vicinity of the spacer 160, that is, at the interface there between is important. The free layer 180 may be made of a single $Co_{90}Fe_{10}$ layer with a thickness of 4 nm without a NiFe layer or a triple-layered structure of CoFe/NiFe/CoFe.

Among CoFe alloys, the $Co_{90}Fe_{10}$ layer is preferably employed in view of the stable soft magnetic property. If a CoFe alloy similar in composition to the $Co_{90}Fe_{10}$ alloy is employed, it is desired that the thickness of the resultant CoFe alloy layer is set within 0.5 to 4 nm. Moreover, the free layer 180 may be made of $Co_xFe_{100-X}$ (X=70 to 90%).

Then, the free layer 180 is made of an alternately stacking structure of CoFe layers or Fe layers with a thickness of 1 to 2 nm and extremely thin Cu layers with a thickness of 0.1 to 0.8 nm.

In the case that the spacer layer 160 is made of the Cu layer, it is desired that the FeCo layer with bcc structure is employed as the interface material thereof for the spacer layer 160 so as to enhance the MR ratio in the same manner as the pinned layer 140. As the FeCo layer with bcc structure, the $Fe_XCo_{100-X}$ (X=30 to 100) or, as occasion demands, containing a third additive element, may be employed. In a preferred embodiment, a $Co_{90}Fe_{10}$ 1 nm/$Ni_{83}Fe_{17}$ 3.5 nm may be employed. Instead of the FeCo layer with bcc structure, a CoFe layer with fcc structure may be employed.

The cap layer 190 functions as protecting the spin valve film. The cap layer 190 may be made of a plurality of metallic layers, e.g., a double-layered structure of Cu 1 nm/Ru 10 nm. The layered turn of the Cu layer and the Ru layer may be switched so that the Ru layer is located in the side of the free layer 180. In this case, the thickness of the Ru layer is set within 0.5 to 2 nm. The exemplified structure is particularly desired for the free layer 190 of NiFe because the magnetostriction of the interface mixing layer formed between the free layer 180 and the cap layer 190 can be lowered due to the non-solution between Ru and Ni.

When the cap layer 190 is made of the Cu/Ru structure or the Ru/Cu structure, the thickness of the Cu layer is set within 0.5 to 10 nm and the thickness of the Ru layer is set smaller, e.g., within 0.5 to 5 nm due to the large specific resistance.

The cap layer 190 may be made of another metallic layer instead of the Cu layer and/or the Ru layer. The structure of the cap layer 190 is not limited only if the cap layer 190 can protect the spin valve film. If the protective function of the cap layer 190 can be exhibited, the cap layer 190 may be made of still another metal. Attention should be paid to the metallic layer because the kind of material of the cap layer may change the MR ratio and the long reliability. In view of the stable MR ratio and long reliability, the Cu layer and/or the Ru layer is preferable for the cap layer.

The top electrode 200 functions as an electrode for flowing a current in the direction perpendicular to the magneto-resistance effect film 100. In real, the current can be flowed through the magneto-resistance effect film 100 in the direction perpendicular to the film surface thereof by applying a voltage between the bottom electrode 110 and the top electrode 200. The top electrode 200 is made of a metallic layer with a relatively small electric resistance for flowing the current to the magneto-resistance effect film sufficiently.

As described above, in this embodiment, the magneto-resistance effect film 100 is configured as a synthetic spin valve structure, and the film structure 10 or 20 may be disposed in at least one of the pinned layer 140, the spacer layer 160 and the free layer 180. The film structure 10 or 20 may be contained in the pinned layer 140, the spacer layer 160 and/or the free layer 180. Alternatively, the film structure 10 or 20 may be formed over the pinned layer 140 and the spacer layer 160 or the spacer layer 160 and the free layer 180. Furthermore, the film structure 10 or 20 may be formed over the pinned layer 140, the spacer layer 160 and the free layer 180.

(High Frequency Oscillator Containing Film Structure)

The film structure 10 or 20 can be applied for a high frequency oscillator. The structure relating to the magneto-resistance effect element as shown in FIG. 21 can be diverted to the structure of the high frequency oscillator. In this case, however, the free layer 180 is substituted with a magnetic oscillating layer 181.

Figure 22:
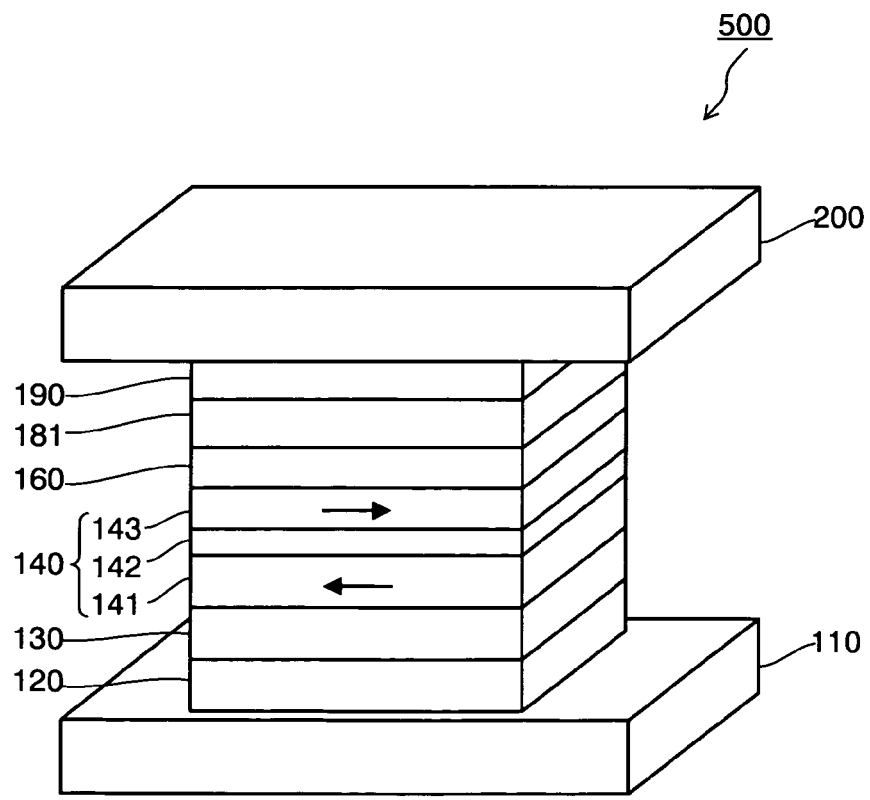
FIG. 22 is a perspective view showing the structure of a high frequency oscillator.

In FIG. 22, the top electrode 110, the under layer 120, the pinning layer 130, the pinned layer 140, the spacer layer 160, the magnetic oscillating layer 181, the cap layer 190 and the top electrode 200 are subsequently formed on a substrate (not shown), thereby constituting a high frequency oscillator 500. When a current is flowed to the stacking structure containing pinned layer 140, the spacer layer 160 and the magnetic oscillating layer 181 in the direction perpendicular to the film surface thereof by applying a voltage between the bottom electrode 110 and the top electrode 200, spin wave excitation (precessional motion of magnetization) is caused in the magnetic oscillating layer 181 originated from spin transfer, thereby generating a high frequency wave with a predetermined frequency.

As described above, the structure of the magneto-resistance effect element can be diverted to the high frequency oscillator 500 except that the free layer 180 is substituted with the magnetic oscillating layer 181. Therefore, the film structure 10 or 20 as shown in FIGS. 1 to 7 can be diverted to the high frequency oscillator 500. The arrangement relating to the film structure 10 or 20 as shown in FIGS. 8 to 14 can be diverted to the high frequency oscillator 500 by substituting the free layer 180 with the magnetic oscillating layer 181.

In the high frequency oscillator 500 of this embodiment, the oscillating operation of the high frequency oscillator 500 becomes more efficient than a conventional CPP oscillator originated from the specific current conduction using the shape effect of nano-meter in the film structure 10 or 20. Particularly, when the film structure 10 or 20 is contained in the magnetic oscillating layer 181, the oscillating operation of the high frequency oscillator 500 becomes much more efficient because the first conductor 13 functions as a magnetic oscillating portion.

EXAMPLES

Hereinafter, concrete examples of the present invention will be described.

Example 1

The structure of a magneto-resistance effect film in this example will be described below.
  Bottom electrode
  Under layer (buffer layer/seed layer): Ta 1 nm/Ru 2 nm
  Pinning layer
  Antiferromagnetic layer AC: IrMn 7 nm
  Ferromagnetic layer FM: $Co_{75}Fe_{25}$ 3.4 nm
  Antiferromagnetic coupling layer AC: Ru 0.85 nm
  Pinned layer P: $Co_{50}Fe_{50}$ 0.5 nm/film structure 20/$Fe_{50}Co_{50}$ 0.5 nm
  Spacer layer S: Cu 3 nm
  Free layer F: $Co_{90}Fe_{10}$ 1.0 nm/$Ni_{83}Fe_{17}$ 3.5 nm
  Cap layer: Cu 1 nm/Ta 5 nm
  Then, the film structure 20 is configured as shown in Table 1.

TABLE 1

| First current confining layer | First insulating layer Al—O [1.5 nm] containing second conductor of $Fe_{50}Co_{50}$ |
|---|---|
| First conductor | $Fe_{50}Co_{50}$[1 nm]/Cu[0.25 nm]/$Fe_{50}Co_{50}$[1 nm] |
| Second current confining layer | Second insulating layer Al—O [1.5 nm] containing third conductor of $Fe_{50}Co_{50}$ |

Figure 10A:
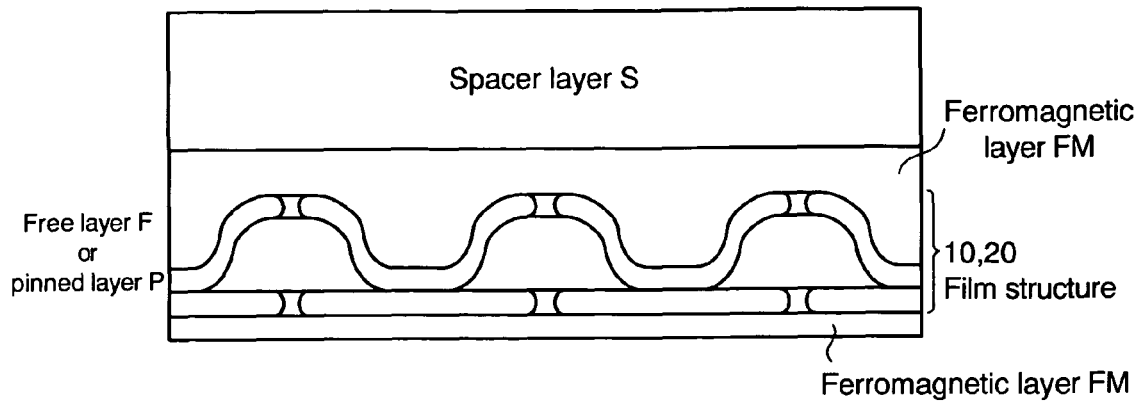
FIG. 10 also relates to structural views showing concrete states where the film structures are incorporated in corresponding magneto-resistance effect films.
Figure 10B:
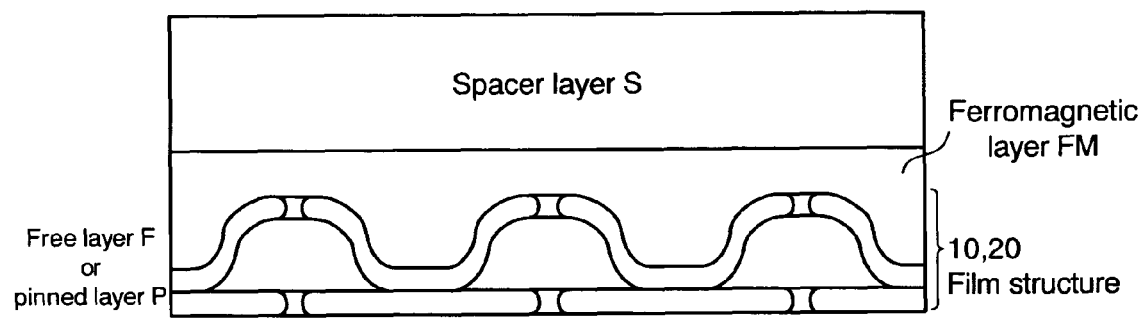
Figure 10C:
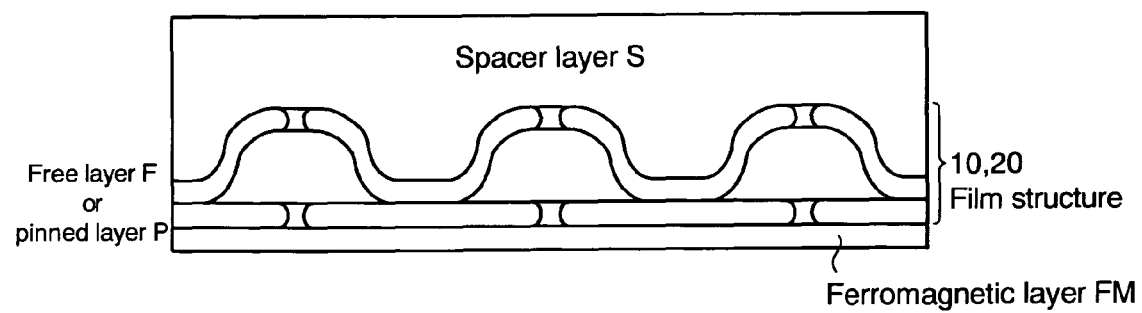
Figure 10D:
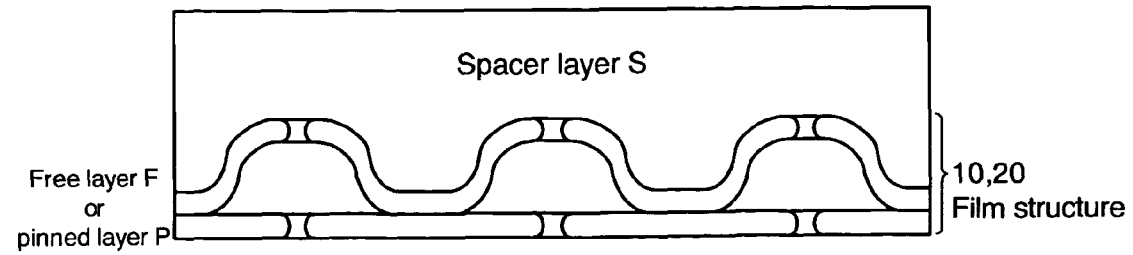

In this example, the film structure 20 is contained in the pinned layer P as shown in FIG. 10A. In this example, since the film structure 20 is disposed in the magneto-resistance effect film, the MR ratio can be enhanced in comparison with a conventional one with no film structure.

Example 2

The structure of a magneto-resistance effect film in this example will be described below.
  Bottom electrode
  Under layer (buffer layer/seed layer): Ta 1 nm/Ru 2 nm
  Pinning layer
  Antiferromagnetic layer AC: IrMn 7 nm
  Ferromagnetic layer FM: $Co_{75}Fe_{25}$ 3.4 nm
  Antiferromagnetic coupling layer AC: Ru 0.85 nm
  Pinned layer P/Spacer layer S: $Co_{50}Fe_{50}$ 1.0 nm/film structure 20
  Free layer F: $Co_{90}Fe_{10}$ 1.0 nm/$Ni_{83}Fe_{17}$ 3.5 nm
  Cap layer: Cu 1 nm/Ta 5 nm
  Then, the film structure 20 is configured as shown in Table 2.

TABLE 2

| First current confining layer | First insulating layer Al—O [1.5 nm] containing second conductor of $Fe_{50}Co_{50}$ |
|---|---|
| Third conductor | $Fe_{50}Co_{50}$[1 nm]/Cu[0.25 nm]/$Fe_{50}Co_{50}$[1 nm]/Cu[0.5 nm] |
| Second current confining layer | Second insulating layer Al—O [1.5 nm] containing third conductor of Cu |
| Non-magnetic layer NM on second current confining layer | Cu[0.4 nm] |

In this example, the magneto-resistance effect film contains the film structure 20 configured such that the first conductor 13 functions as the pinned layer P and the second current confining layer functions as the spacer layer S as shown in FIG. 13C. Therefore, the MR ratio of the magneto-resistance effect film can be enhanced in comparison with a conventional one with no film structure.

Example 3

The structure of a magneto-resistance effect film in this example will be described below.
  Bottom electrode
  Under layer (buffer layer/seed layer): Ta 1 nm/Ru 2 nm
  Pinning layer
  Antiferromagnetic layer AC: IrMn 7 nm
  Ferromagnetic layer FM: $Co_{75}Fe_{25}$ 3.4 nm
  Antiferromagnetic coupling layer AC: Ru 0.85 nm
  Pinned layer P: $Co_{50}Fe_{50}$ 1.5 nm/Cu 0.25 nm/$Fe_{50}Co_{50}$ 1.5 nm
  Spacer layer S: Cu 3 nm
  Free layer F: film structure 20/$Ni_{83}Fe_{17}$ 3.5 nm
  Cap layer: Cu 1 nm/Ta 5 nm
  Then, the film structure 20 is configured as shown in Table 3.

TABLE 3

| First current confining layer | First insulating layer Al—O [1.5 nm] containing second conductor of Cu |
|---|---|
| First conductor | $Co_{90}Fe_{10}$[2 nm] |
| Second current confining layer | Second insulating layer Al—O [1.5 nm] containing third conductor of $Co_{90}Fe_{10}$ |

In this example, the film structure 20 is contained in the free layer S as shown in FIG. 9B. In this example, since the film structure 20 is disposed in the magneto-resistance effect film, the MR ratio can be enhanced in comparison with a conventional one with no film structure.

Example 4

The structure of a magneto-resistance effect film in this example will be described below.
  Bottom electrode
  Under layer (buffer layer/seed layer): Ta 1 nm/Ru 2 nm
  Pinning layer
  Antiferromagnetic layer AC: IrMn 7 nm
  Ferromagnetic layer FM: $Co_{75}Fe_{25}$ 3.4 nm
  Antiferromagnetic coupling layer AC: Ru 0.85 nm
  Pinned layer P: $Co_{50}Fe_{50}$ 1.5 nm/Cu 0.25 nm/$Fe_{50}Co_{50}$ 1.5 nm
  Spacer layer S/Free layer F: film structure 20/$Ni_{83}Fe_{17}$ 3.5 nm
  Cap layer: Cu 1 nm/Ta 5 nm
  Then, the film structure 20 is configured as shown in Table 4.

TABLE 4

| Non-magnetic layer under first current confining layer | Cu[0.6 nm] |
|---|---|
| First current confining layer | First insulating layer Al—O [1.5 nm] containing second conductor of Cu |
| First conductor | Cu[0.25 nm]/$Co_{90}Fe_{10}$[2 nm] |

TABLE 4-continued

| | |
|---|---|
| Second current confining layer | Second insulating layer Al—O [1.5 nm] containing third conductor of $Co_{90}Fe_{10}$ |

In this example, the magneto-resistance effect film contains the film structure 20 configured such that the first conductor 13 functions as the free layer F and the first current confining layer functions as the spacer layer S as shown in FIG. 13A. Therefore, the MR ratio of the magneto-resistance effect film can be enhanced in comparison with a conventional one with no film structure.

In this example, the magneto-resistance effect film contains the film structure 20 configured such that the first conductor 13 functions as the pinned layer P and the second current confining layer functions as the spacer layer S as shown in FIG. 13A. Therefore, the MR ratio of the magneto-resistance effect film can be enhanced in comparison with a conventional one with no film structure.

Example 5

The structure of a magneto-resistance effect film in this example will be described below.
Bottom electrode
Under layer (buffer layer/seed layer): Ta 1 nm/Ru 2 nm
Pinning layer
Antiferromagnetic layer AC: IrMn 7 nm
Ferromagnetic layer FM: $CO_{75}Fe_{25}$ 3.4 nm
Antiferromagnetic coupling layer AC: Ru 0.85 nm
Pinned layer P: $Co_{50}Fe_{50}$ 1.5 nm/Cu 0.25 nm/$Fe_{50}Co_{50}$ 1.5 nm
Spacer layer S: Cu 0.5 nm/film structure 20/Cu 0.5 nm
Free layer F: $Co_{90}Fe_{10}$ 1.0 nm/$Ni_{83}Fe_{17}$ 3.5 nm
Cap layer: Cu 1 nm/Ta 5 nm
Then, the film structure 20 is configured as shown in Table 5.

TABLE 5

| | |
|---|---|
| First current confining layer | First insulating layer Al—O [1.5 nm] containing second conductor of Cu |
| First conductor | Cu[2 nm] |
| Second current confining layer | Second insulating layer Al—O [1.5 nm] containing third conductor of Cu |

In this example, the film structure 20 is contained in the spacer layer S as shown in FIG. 11A. In this example, since the film structure 20 is disposed in the magneto-resistance effect film, the MR ratio can be enhanced in comparison with a conventional one with no film structure.

Figure 23A:
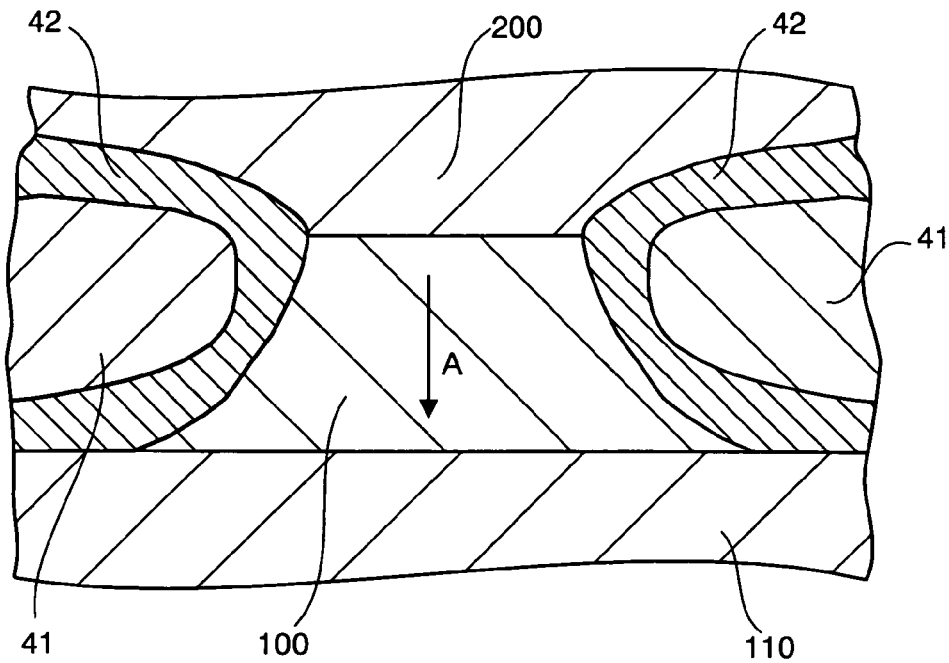
FIG. 23 relates to a cross sectional view showing the state where the magneto-resistance effect element according to the embodiment is incorporated in a magnetic head and cross sectional TEM images.
Figure 23B:
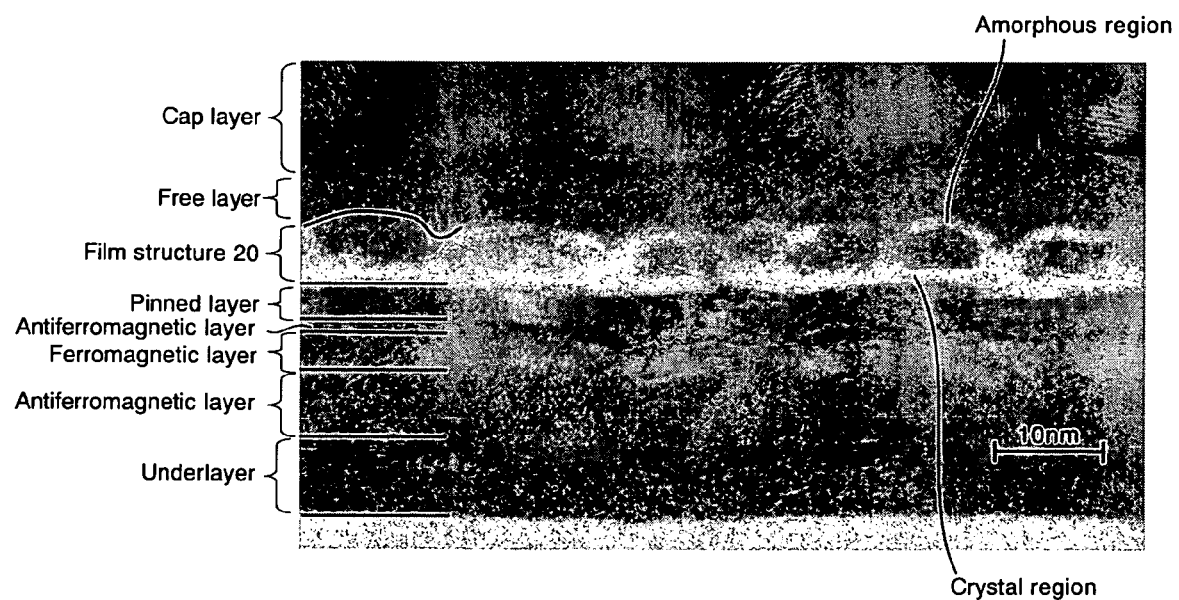
Figure 23C:
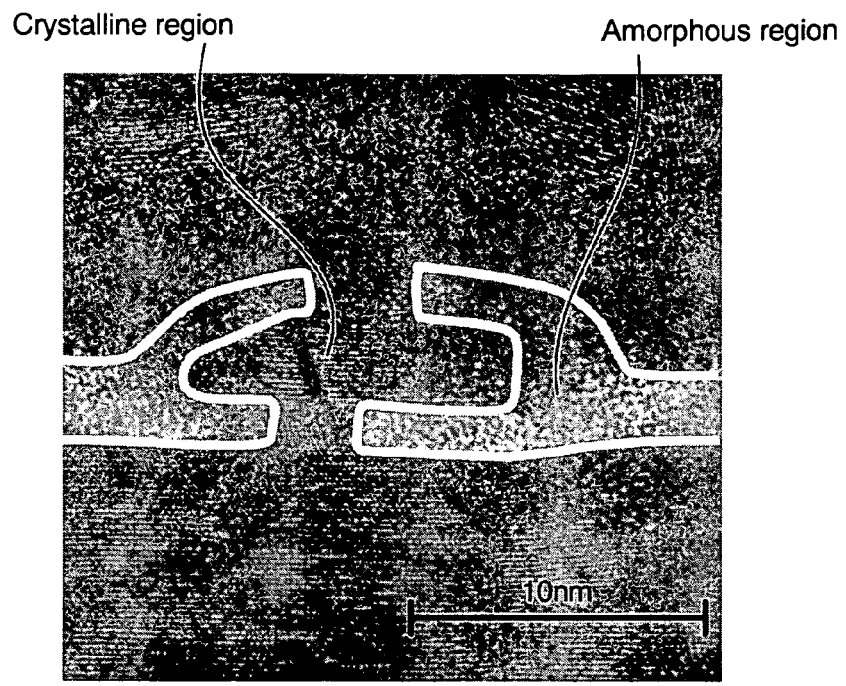

FIGS. 23B and 23C show the cross-sectional TEM images of the magneto-resistance effect film in this example. In FIG. 23B, the multilayer structure of this example is clearly observed. The film structure 20 can be seen between the pinned layer and the free layer. There are the crystalline regions surrounded by insulator and they are formed uniformly in film in-plane direction. In the film structure 20, the crystalline region is mainly composed of Cu and the amorphous region is mainly composed of Al2O3.

FIG. 23C is an enlarged TEM image of the film structure 20. As seen by FIG. 23C, it is confirmed that the crystalline region penetrates through the amorphous region in perpendicular direction. The lattice of the crystalline region is heteroepitaxially connected to lattices of the pinned layer and the free layer. First conductor Cu is three-dimensionally surrounded by $Al_2O_3$ insulator, but the $Al_2O_3$ insulator is opened only in film perpendicular direction. When current flows in CPP geometry, conduction electron expects to flow in Cu conductor three-dimensionally surrounded by the $Al_2O_3$. Here, the size of the first conductor in the in-plane direction and the perpendicular is about 10 nm, 4 nm, respectively.

As FIGS. 23B and 23C, the film structure 20 can be confirmed by the cross-sectional TEM analysis.

Example 6

The structure of a magneto-resistance effect film in this example will be described below.
Bottom electrode
Under layer (buffer layer/seed layer): Ta 1 nm/Ru 2 nm
Pinning layer
Antiferromagnetic layer AC: IrMn 7 nm
Ferromagnetic layer FM: $CO_{75}Fe_{25}$ 3.4 nm
Antiferromagnetic coupling layer AC: Ru 0.85 nm
Pinned layer P/Spacer layer S: $Co_{50}Fe_{50}$ 1.0 nm/film structure 20/$Fe_{50}Co_{50}$ 1.0 nm
Free layer F: $Co_{90}Fe_{10}$ 1.0 nm/$Ni_{83}Fe_{17}$ 3.5 nm
Cap layer: Cu 1 nm/Ta 5 nm
Then, the film structure 20 is configured as shown in Table 6.

TABLE 6

| | |
|---|---|
| First current confining layer | First insulating layer Al—O [1.5 nm] containing second conductor of $Fe_{50}Co_{50}$ |
| First conductor | $Fe_{50}Co_{50}$[1.5 nm]/Cu[1.5 nm] |
| Second current confining layer | First insulating layer Al—O [1.5 nm] containing third conductor of Cu |

In this example, the magneto-resistance effect film contains the film structure 20 configured such that the first conductor 13 functions as the pinned layer P and the spacer layer S by disposing the film structure 20 over the pinned layer P and the spacer layer S as shown in FIG. 12B. Therefore, the MR ratio of the magneto-resistance effect film can be enhanced in comparison with a conventional one with no film structure.

Example 7

The structure of a magneto-resistance effect film in this example will be described below.
Bottom electrode
Under layer (buffer layer/seed layer): Ta 1 nm/Ru 2 nm
Pinning layer
Antiferromagnetic layer AC: IrMn 7 nm
Ferromagnetic layer FM: $CO_{75}Fe_{25}$ 3.4 nm
Antiferromagnetic coupling layer AC: Ru 0.85 nm
Pinned layer P/Spacer layer S/Free layer F: $Co_{50}Fe_{50}$ 2.0 nm/film structure 20/$Ni_{83}Fe_{17}$ 3.5 nm
Cap layer: Cu 1 nm/Ta 5 nm
Then, the film structure 20 is configured as shown in Table 7.

TABLE 7

| | |
|---|---|
| First current confining layer | First insulating layer Al—O [1.5 nm] containing second conductor of $Fe_{50}Co_{50}$ |

TABLE 7-continued

| First conductor | $Fe_{50}Co_{50}$[1 nm]/Cu[2 nm]/ $Co_{90}Fe_{10}$[1 nm] |
|---|---|
| Second current confining layer | Second insulating layer Al—O [1.5 nm] containing third conductor of $Co_{90}Fe_{10}$ |

In this example, the magneto-resistance effect film contains the film structure 20 configured such that the first conductor 13 functions as the pinned layer P, the spacer layer S and the free layer F by disposing the film structure 20 over the pinned layer P, the spacer layer S and the free layer F as shown in FIG. 14. Therefore, the MR ratio of the magneto-resistance effect film can be enhanced in comparison with a conventional one with no film structure.

Example 8

The structure of a magneto-resistance effect film in this example will be described below.
  Bottom electrode
  Under layer (buffer layer/seed layer): Ta 1 nm/Ru 2 nm
  Pinning layer
  Antiferromagnetic layer AC: IrMn 7 nm
  Ferromagnetic layer FM: $CO_{75}Fe_{25}$ 3.4 nm
  Antiferromagnetic coupling layer AC: Ru 0.85 nm
  Pinned layer P: $Co_{50}Fe_{50}$ 0.5 nm/film structure 20/$Fe_{50}Co_{50}$ 0.5 nm
  Spacer layer S: Cu 0.6 nm/Al—O insulating layer containing Cu path/Cu 0.4 nm
  Free layer F: $Co_{90}Fe_{10}$ 1.0 nm/$Ni_{83}Fe_{17}$ 3.5 nm
  Cap layer: Cu 1 nm/Ta 5 nm
  Then, the film structure 20 is configured as shown in Table 8.

TABLE 8

| First current confining layer | First insulating layer Al—O [1.5 nm] containing second conductor of $Fe_{50}Co_{50}$ |
|---|---|
| First conductor | $Fe_{50}Co_{50}$ [1 nm]/Cu[0.25 nm]/ $Fe_{50}Co_{50}$[1 nm] |
| Second current confining layer | First insulating layer Al—O [1.5 nm] containing third conductor of $Fe_{50}Co_{50}$ |

In this example, the film structure 20 is contained in the pinned layer P as shown in FIG. 10A and the spacer layer S contains the current confining structure for controlling the resistance of the magneto-resistance effect film. In this example, since the film structure 20 is disposed in the magneto-resistance effect film, the MR ratio can be enhanced in comparison with a conventional one with no film structure.
(Application of Magneto-Resistance Effect Element)

The application of the magneto-resistance effect element according to this embodiment will be described herein after.

In view of high density recording, the element resistance RA is set preferably to 500 m$\Omega\mu m^2$ or less, more preferably to 300 m$\Omega\mu m^2$ or less. In the calculation of the element resistance RA, the effective area A in current flow of the spin valve film is multiplied to the resistance R of the spin valve film. Herein, the element resistance R can be directly measured, but attention should be paid to the effective area A because the effective area A depends on the element structure.

If the whole area of the spin valve film is effectively sensed by current through patterning, the whole area of the spin valve film corresponds to the effective area A. In this case, the whole area of the spin valve film is set to 0.04 $\mu m^2$ or less in view of the appropriate element resistance, and to 0.02 $\mu m^2$ or less in view of the recording density of 200 Gbpsi or more.

If the area of the bottom electrode 11 or the top electrode 20 is set smaller than the whole area of the spin valve film, the area of the bottom electrode 11 or the top electrode 20 corresponds to the effective area A. If the area of the bottom electrode 11 is different from the area of the top electrode 20, the smaller area of either of the bottom electrode 11 or the top electrode 20 corresponds to the effective area A. As described above, the smaller area is set to 0.04 $\mu m^2$ or less in view of the appropriate element resistance.

Figure 24:
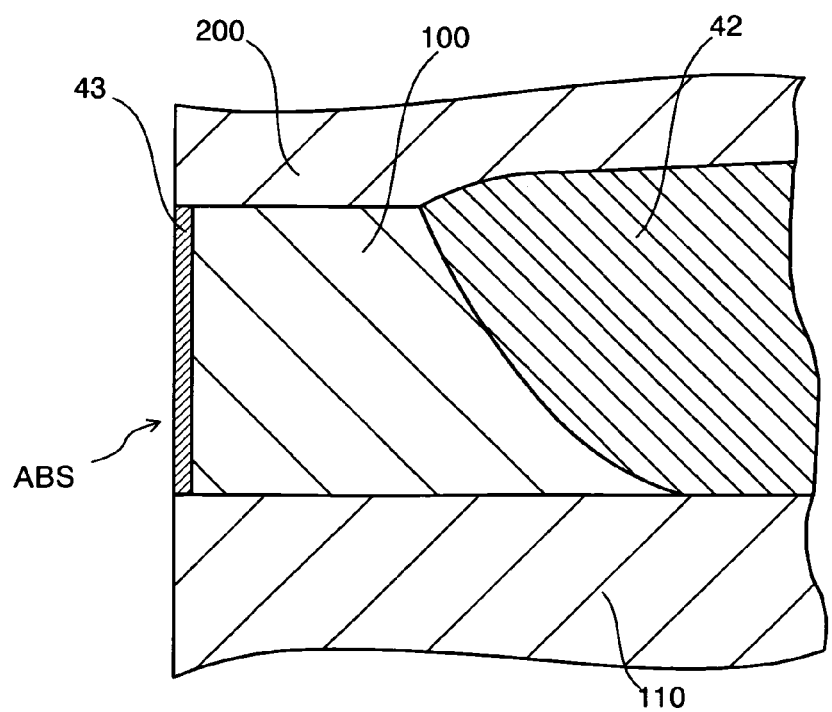
FIG. 24 is also a cross sectional view showing the state where the magneto-resistance effect element according to the embodiment is incorporated in a magnetic head.

Referring to FIGS. 23A and 24, since the smallest area of the spin valve film 10 corresponds to the contacting area with the top electrode 20 as apparent from FIG. 23A, the width of the smallest area can be considered as a track width Tw. Then, since the smallest area of the spin valve film 10 in MR height direction also corresponds to the contacting area with the top electrode 20 as apparent from FIG. 24, the width of the smallest are can be considered as a height length D. In this case, the effective area A can be calculated on the equation of A=Tw×D.

In the magneto-resistance effect element according to this embodiment, the resistance R between the electrodes can be reduced to 100$\Omega$ or less, which corresponds to the resistance between the electrode pads in the reproducing head attached to the forefront of a head gimbal assembly (HGA), for example.

It is desired that the magneto-resistance effect element is structured in fcc (111) orientation when the pinned layer 140 or the free layer 180 has the fcc structure. It is also desired that the magneto-resistance effect element is structured in bcc (100) orientation when the pinned layer 140 or the free layer 180 has the bcc structure. It is also desired that the magneto-resistance effect element is structured in hcp (001) orientation or hcp (110) orientation when the pinned layer 140 or the free layer 180 has the hcp structure.

The crystalline orientation of the magneto-resistance effect element according to this embodiment is preferably 4.0 degrees or less, more preferably 3.5 degrees or less and particularly 3.0 degree or less in view of the dispersion of orientation. The crystalline orientation can be measured from the FWHM of X-ray rocking curve obtained from the 0-20 measurement in X-ray diffraction. The crystalline orientation can be also measured by the spot scattering angle originated from the nano-diffraction spots of the element cross section.
(Magnetic Head)

FIGS. 23 and 24 are cross sectional views showing the state where the magneto-resistance effect element is incorporated in a magnetic head. FIG. 23A is a cross sectional view showing the magneto-resistance effect element, taken on the surface almost parallel to the ABS (air bearing surface) opposite to a (not shown) magnetic recording medium. FIG. 24 is a cross sectional view showing the magneto-resistance effect element, taken on the surface almost perpendicular to the ABS.

The magnetic head shown in FIGS. 23 and 24 has a so-called hard abutted structure. The bottom electrode 11 and the top electrode 20 are provided on the top surface and the bottom surface of the magneto-resistance effect film 100, respectively. In FIG. 24, the biasing magnetic applying films 41 and the insulating films 42 are formed at both sides of the magneto-resistance effect film 100. In FIG. 24, the protective layer 43 is formed on the ABS of the magneto-resistance effect film 100.

The sense current is flowed along the arrow A through the magneto-resistance effect film 100 between the bottom electrode 110 and the top electrode 200, that is, in the direction perpendicular to the film surface of the magneto-resistance effect film 100. Moreover, a given biasing magnetic field is applied to the magneto-resistance effect film 100 from the biasing magnetic field applying films 41 so as to render the magnetic domain of the free layer 180 of the film 100 a single domain through the control of the magnetic anisotropy of the free layer 180 and stabilize the magnetic domain structure of the free layer 180. In this case, the Barkhausen noise due to the shift of magnetic wall in the magneto-resistance effect film 100 can be prevented.

Since the S/N ratio of the magneto-resistance effect film 100 is enhanced, the magnetic head including the magneto-resistance effect film 100 can realize the high sensitive magnetic reproduction.

(Magnetic Head and Magnetic Recording/Reproducing Device)

The magnetic head as shown in FIGS. 23 and 24 can be incorporated in an all-in-one magnetic head assembly allowing both the recording/reproducing, and mounted as the head assembly at the magnetic recording/reproducing device.

Figure 25:
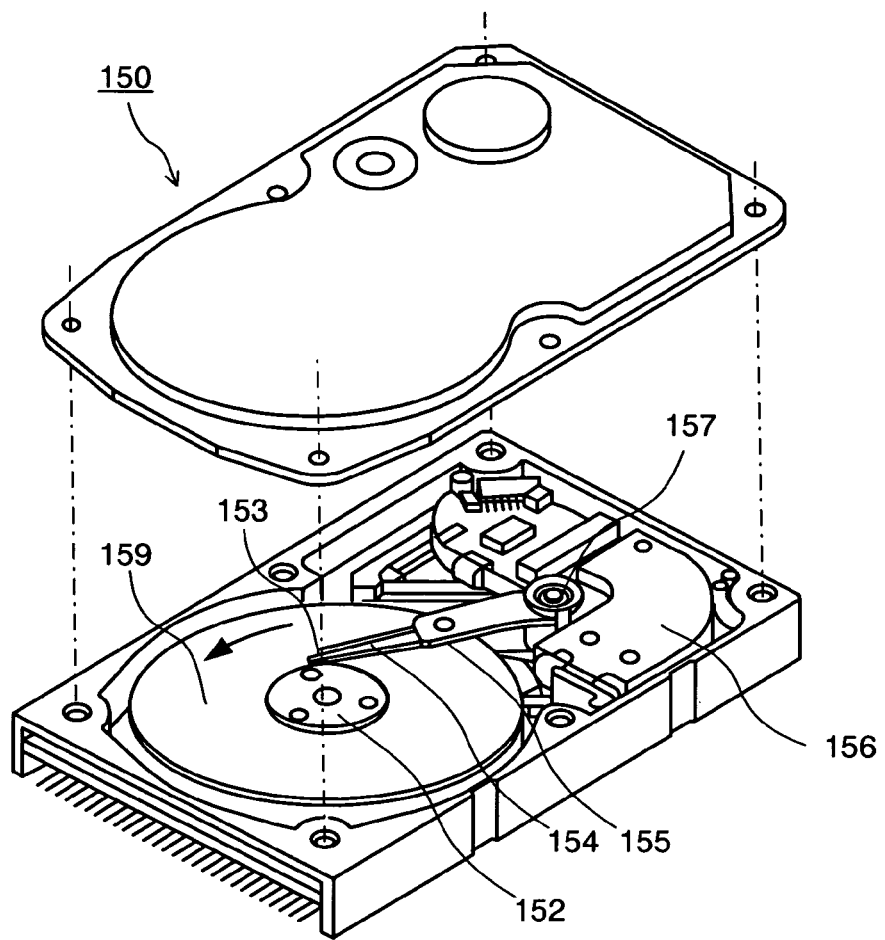
FIG. 25 is a perspective view illustrating an essential part of a magnetic recording/reproducing device according to an embodiment.

FIG. 25 is a perspective view illustrating the schematic structure of the magnetic recording/reproducing device. The magnetic recording/reproducing device 150 illustrated in FIG. 25 constitutes a rotary actuator type magnetic recording/reproducing device. In FIG. 25, a magnetic recording disk 159 is mounted to a spindle 152 to be turned in the direction designated by the arrow A by a motor (not shown) which is driven in response to control signals from a drive unit controller (not shown). In FIG. 25, the magnetic recording/reproducing apparatus 150 may be that provided with a single magnetic recording disk 159, but with a plurality of magnetic recording disks 159

A head slider 153 recording/reproducing information to be stored in the magnetic recording disk 159 is mounted on a tip of a suspension 154 of a thin film type. The head slider 153 mounts at the tip of the magnetic head containing the magnetic resistance effect element as described in above embodiments.

When the magnetic recording disk 159 is rotated, such a surface (ABS) of the head slider 153 as being opposite to the magnetic recording disk 159 is floated from on the main surface of the magnetic recording disk 159. Alternatively, the slider may constitute a so-called "contact running type" slider such that the slider is in contact with the magnetic recording disk 159.

The suspension 154 is connected to one edge of the actuator arm 155. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 26:
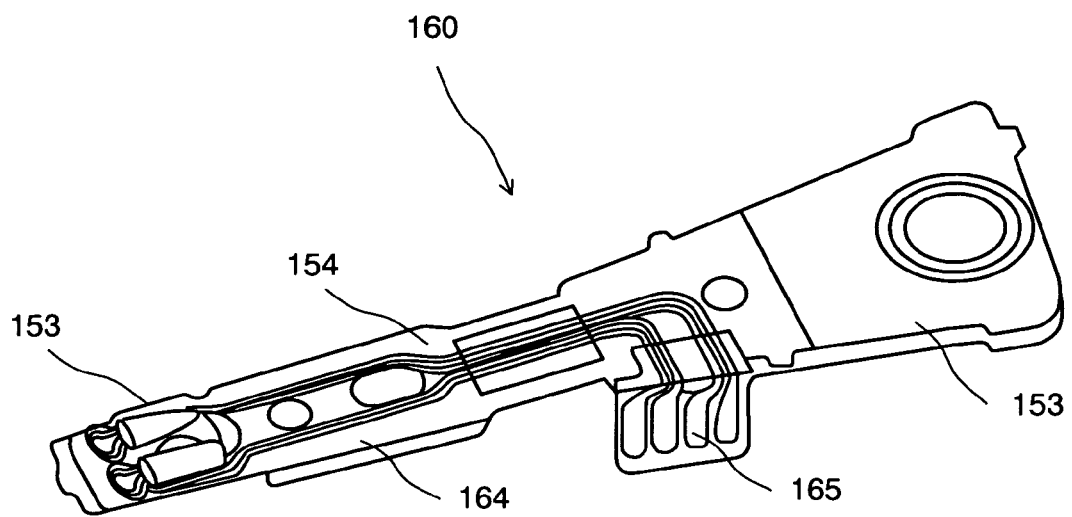
FIG. 26 is an enlarged perspective view illustrating the magnetic head assembly located forward from the actuator arm of the magnetic recording/reproducing device as viewed from a disk.

FIG. 26 is an enlarged perspective view illustrating a portion of the magnetic head assembly positioned at the tip side thereof from the actuator arm 155, as viewed from the side of the magnetic recording disk 159. As illustrated in FIG. 26, the magnetic head assembly 160 has the actuator arm 155. The suspension 154 is connected with the one edge of the actuator arm 155. Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 25 and 26, since the magneto-resistance effect element as described in the above embodiments is installed, the information magnetically recorded in the magnetic recording disk 159 can be read out properly.

(Magnetic Memory)

The magneto-resistance effect element as described above can constitute a magnetic memory such as a magnetic random access memory (MRAM) where memory cells are arranged in matrix.

Figure 27:
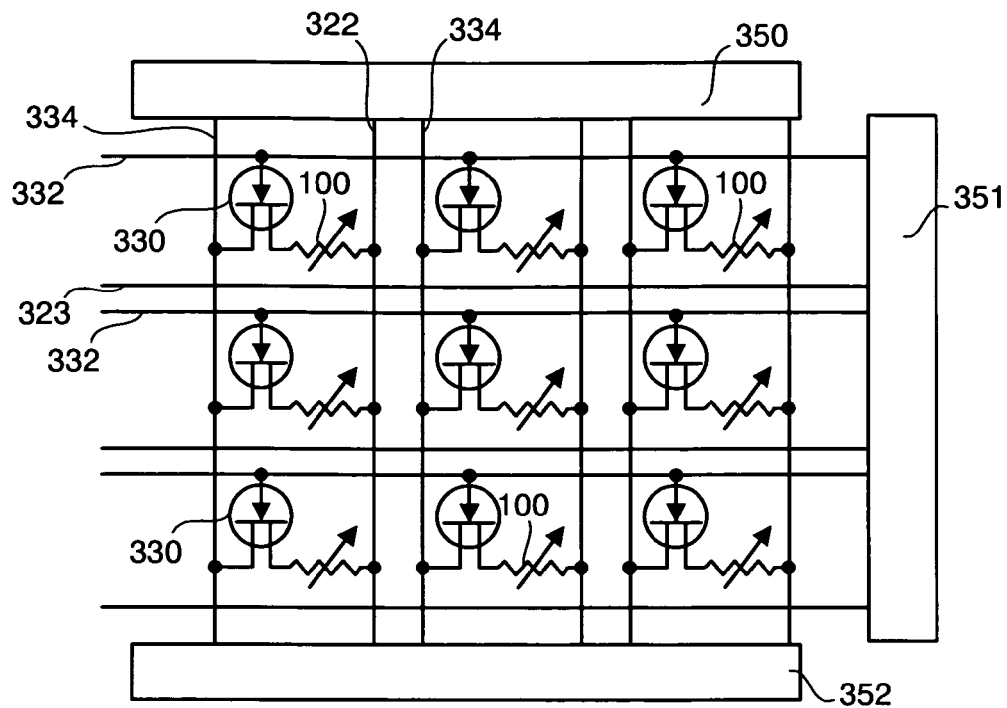
FIG. 27 is a view illustrating a magnetic memory matrix according to an embodiment.

FIG. 27 is a view illustrating an embodiment of the magnetic memory matrix according to an embodiment. This drawing shows a circuit configuration when the memory cells are arranged in an array. In order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 100 can be read out by being detected by a sense amplifier 352. In order to write the bit information, a writing current is flowed in a specific write word line 323 and a bit line 322 to generate a magnetic field for writing.

Figure 28:
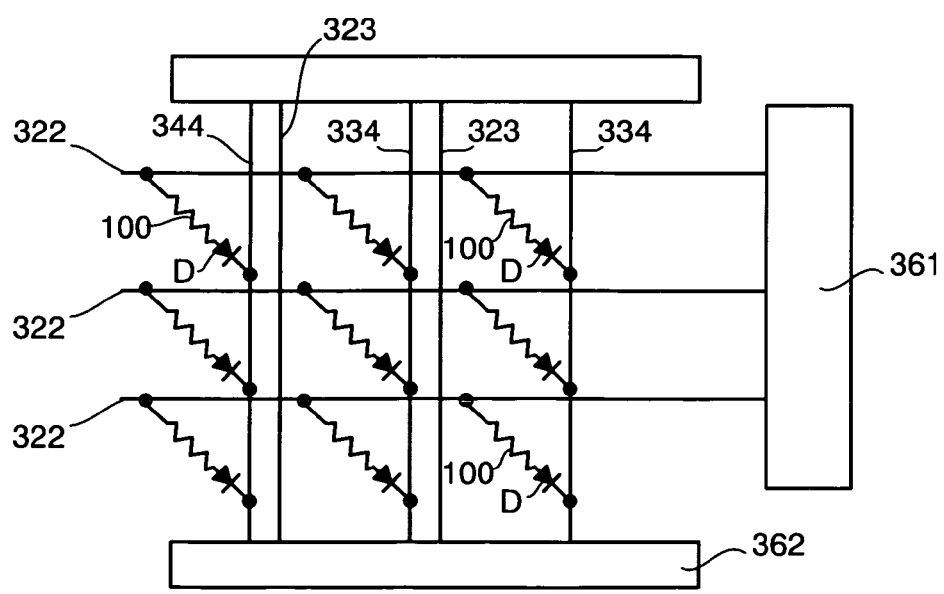
FIG. 28 is a view illustrating another magnetic memory matrix according to an embodiment.

FIG. 28 is a view illustrating another embodiment of the magnetic memory matrix according to an embodiment. In this case, a bit line 322 and a word line 334 which are arranged in matrix are selected by decoders 360, 361, respectively, so that a specific memory cell in the array is selected. Each memory cell is configured such that the magneto-resistance effect film 100 and a diode D is connected in series. Here, the diode D plays a role of preventing a sense current from detouring in the memory cell other than the selected magneto-resistance effect film 100. A writing is performed by a magnetic field generated by flowing the writing current in the specific bit line 322 and the word line 323, respectively.

Figure 29:
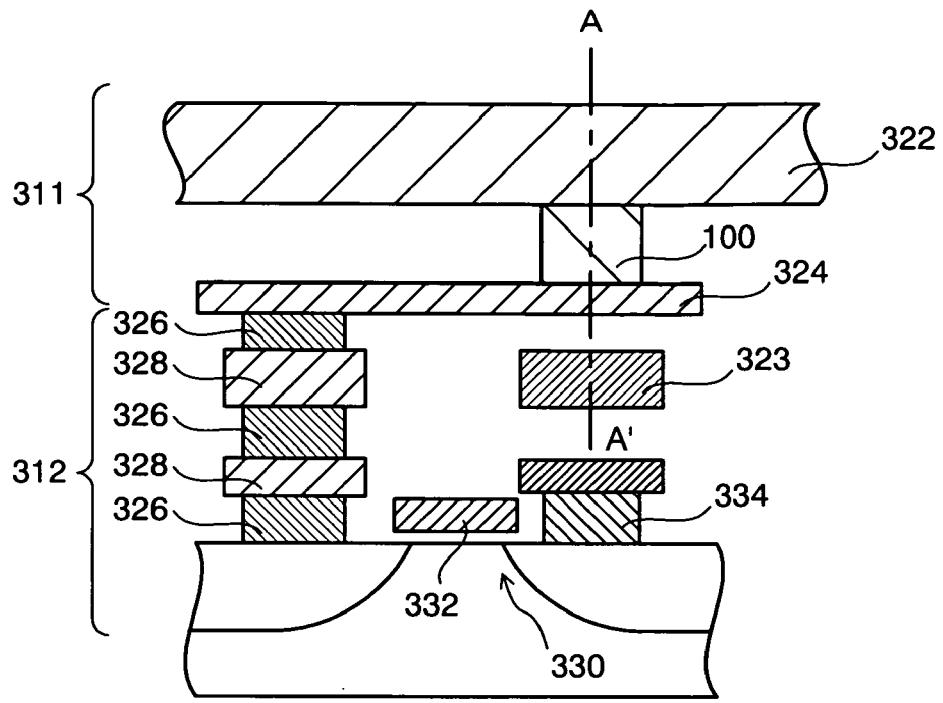
FIG. 29 is a cross sectional view illustrating an essential part of the magnetic memory.
Figure 30:
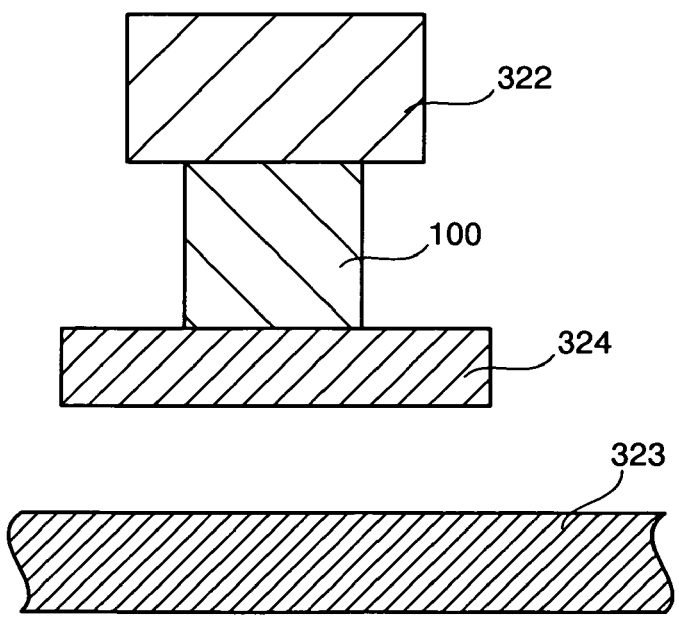
FIG. 30 is a cross sectional view of the magnetic memory illustrated in FIG. 29, taken on line "A-A".

FIG. 29 is a cross sectional view illustrating a substantial portion of the magnetic memory in an embodiment according to the present invention. FIG. 30 is a cross sectional view of the magnetic memory illustrated in FIG. 29, taken on line "A-A". The configuration shown in these drawings corresponds to a 1-bit memory cell included in the magnetic memory shown in FIG. 27 or FIG. 28. This memory cell includes a memory element part 311 and an address selection transistor part 312.

The memory element part 311 includes the magneto-resistance effect film 100 and a pair of wirings 322, 324 connected to the magneto-resistance effect film 100. The magneto-resistance effect film 100 is the magneto-resistance effect element (CCP-CPP element) as described in the above embodiments.

Meanwhile, in the address selection transistor part 312, a transistor 330 having connection therewith via a via 326 and an embedded wiring 328 is provided. The transistor 330 performs switching operations in accordance with voltages applied to a gate 332 to control the opening/closing of the current confining path between the magneto-resistance effect film 100 and the wiring 334.

Further, below the magneto-resistance effect film 100, a write wiring 323 is provided in the direction substantially orthogonal to the wiring 322. These write wirings 322, 323 can be formed of, for example, aluminum (Al), copper (Cu), tungsten (W), tantalum (Ta) or an alloy containing any of these elements.

In the memory cell of such a configuration, when writing bit information into the magneto-resistance effect element 100, a writing pulse current is flowed in the wirings 322, 323, and a synthetic magnetic field induced by the writing current is applied to appropriately invert the magnetization of a recording layer of the magneto-resistance effect element 100.

Further, when reading out the bit information, a sense current is flowed through the magneto-resistance effect element 100 including the magnetic recording layer and a lower electrode 324 to measure a resistance value of or a fluctuation in the resistance values of the magneto-resistance effect element 100.

The magnetic memory according to the embodiment can assure writing and reading by surely controlling the magnetic domain of the recording layer even though the cell is miniaturized in size, with the use of the magneto-resistance effect element (CCP-CPP element) according to the above-described embodiment.

(Application of High Frequency Oscillator)

Then, the application of the high frequency oscillator will be described.

(High Frequency Integrated Circuit)

Figure 31A:
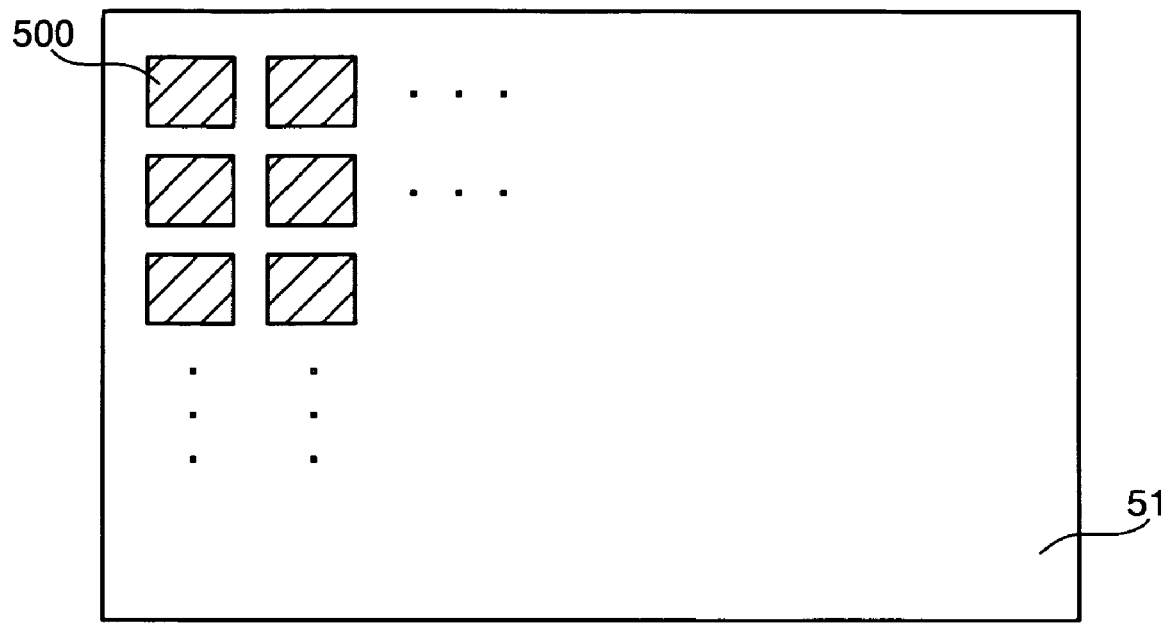
FIG. 31 relates to a plan view and a structural view showing a high frequency integrated circuit including high frequency oscillators according to an embodiment.
Figure 31B:
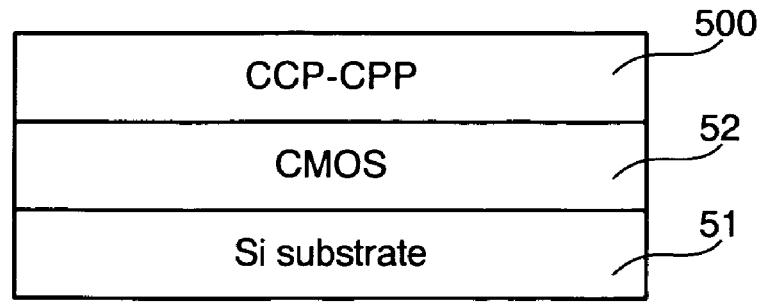

First of all, a high frequency integrated circuit containing a plurality of high frequency oscillators arranged in parallel will be described. FIG. 31A is a plan view showing the high frequency integrated circuit and FIG. 31B is a structural view showing the stacking structure of the high frequency integrated circuit. As shown in FIG. 31B, a CMOS transistor 52 is provided on a Si substrate 51, and a CCP-CPP oscillator 500 is provided on the CMOS transistor 52. As shown in FIG. 31A, the plurality of CCP-CPP oscillators 500 are arranged uniformly. Normally, since the manufacturing process for the CMOS transistor 52 requires higher temperature process than the manufacturing process for the CCP-CPP oscillators 500, the stacking structure as shown in FIG. 31B is employed. Namely, the high frequency oscillator 500 is formed after the CMOS transistor 52 is formed on the Si substrate 51, flattened and electric contacts are formed. According to this embodiment, the intended high frequency system such as a high frequency instrument of millimeter wave or microwave can be fabricated at low cost and thus, can be diffused in civilian use.

Figure 32:
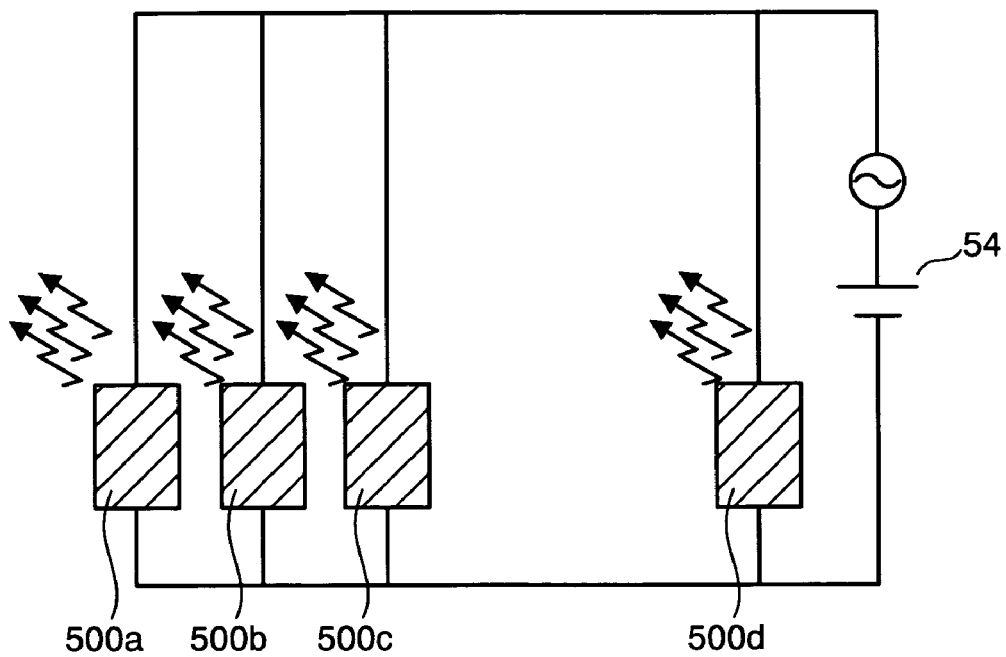
FIG. 32 is a circuit diagram showing a high frequency integrated circuit of parallel connection.

High frequency circuits of parallel connection and series connection will be fabricated utilizing the high frequency integrated circuit as a standard. FIG. 32 is a circuit diagram showing a high frequency integrated circuit of parallel connection. As shown in FIG. 32, the high frequency oscillators 500a, 500b, 500c, 500d and 500e are electrically connected in parallel with an electric power supply 54. Each of the high frequency oscillators 500a through 500e can be configured as in FIGS. 31A and 31B. Namely, CMOS transistors and the CCP-CPP oscillators are subsequently formed on the Si substrate so that the CCP-CPP oscillators can be arranged uniformly on the Si substrate.

Figure 33:
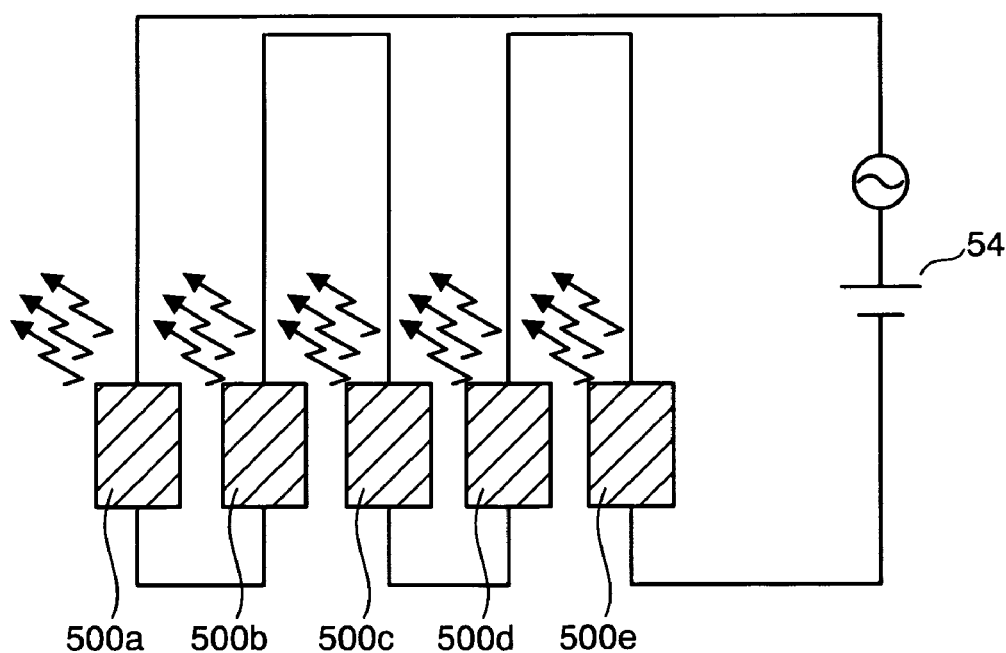
FIG. 33 is a circuit diagram showing a high frequency integrated circuit of series connection.

FIG. 33 is a circuit diagram showing a high frequency integrated circuit of series connection. As shown in FIG. 33, in this case, the high frequency oscillators 500a, 500b, 500c, 500d and 500e are electrically connected in series with the electric power supply 54, thereby forming a high frequency integrated circuit. By electrically connecting in series the plurality of high frequency oscillators, the oscillating output of the resultant high frequency integrated circuit can be increased.

(In-Vehicle Radar and Inter-Vehicle Gap Communication Device)

Figure 34:
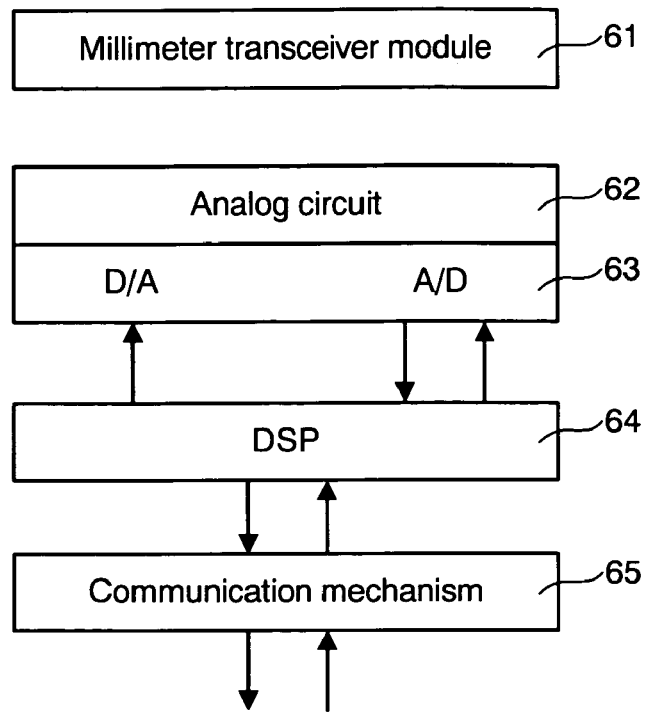
FIG. 34 is a system diagram showing an in-vehicle radar of millimeter waveband including the high frequency oscillator according to an embodiment.

FIG. 34 is a system diagram showing an in-vehicle radar of millimeter wave (microwave) including the high frequency oscillator according to an embodiment. The in-vehicle radar system includes a millimeter transceiver module 61 containing a high frequency oscillator according to an embodiment, an analog circuit 62 for processing signals from the transceiver module 61, a converter for conducting A/D conversion (analog-digital conversion) and D/A conversion (digital-analog conversion), a digital signal processor (DSP) 64 and a communication mechanism 65 for conducting transmission and reception for an external instrument.

Figure 35:
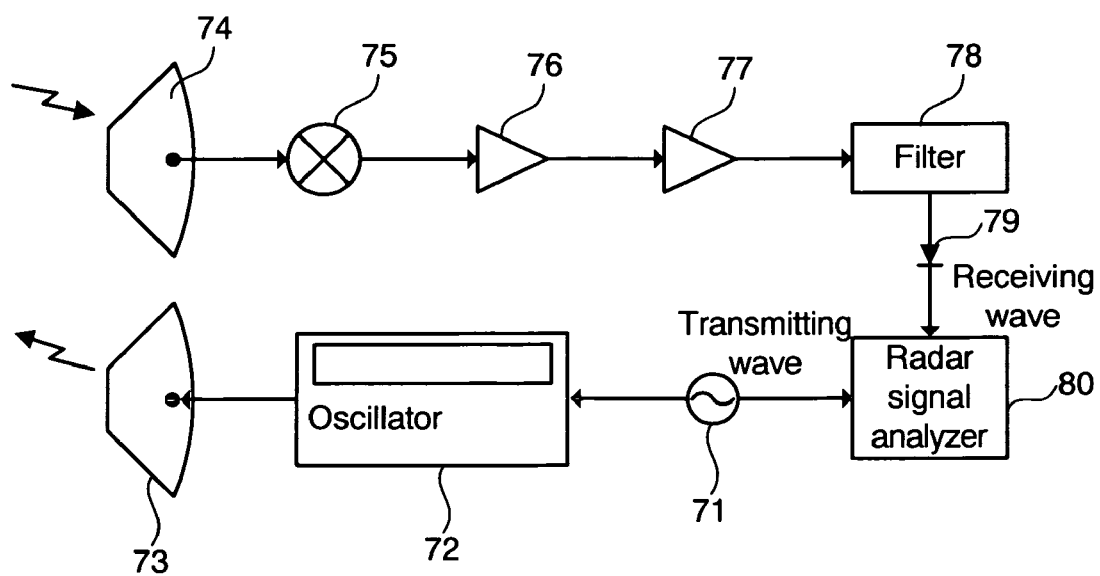
FIG. 35 is a circuit diagram showing an FM-CW radar system including the high frequency oscillator according to an embodiment.
Figure 36:
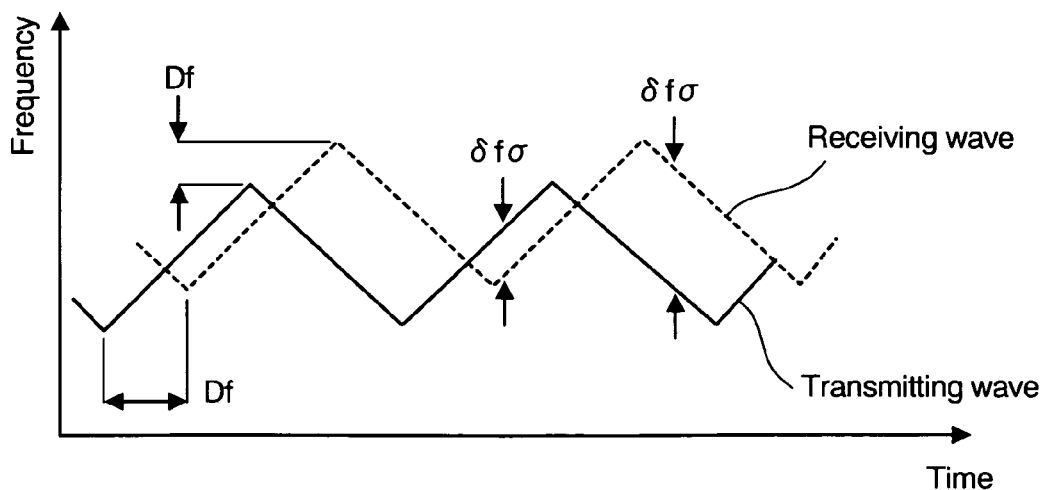
FIG. 36 is a graph showing a signal shape from the radar shown in FIG. 35.

FIG. 35 is a circuit diagram showing an FM-CW radar system including the high frequency oscillator according to the embodiment. FIG. 36 is a graph showing a signal shape from the radar shown in FIG. 35. The signal shape is obtained by assuming that the radar approaches an object.

A transmitting wave from a generator 71 and a carrier wave from an oscillator 72 are radiated as an FM modulation wave of which the amplitude is proportion to the output voltage. The transmitting wave is transmitted to a radar signal analyzer 80. The transmission wave is partially synthesized with a receiving wave, which is reflected by a reflector and received at a receiving antenna 74, at a mixer 75, thereby generating a beat signal. The beat signal is transmitted to the radar signal analyzer 80 via a front amplifier 76, an intermediate frequency amplifier 77, a filter 78 and a wave detector 79 in turn.

The beat signal contains a phase retardation (Dt in FIG. 36) proportion to the distance between the system and the object and a Doppler frequency shift (Df in FIG. 36) caused by the relative velocity between the system and the object. The phase retardation Dt and the Doppler frequency shift Df can be calculated from the difference ($\delta$fu, $\delta$fd) in frequency between the beat signal when the modulating frequency is increased and the beat signal when the modulating frequency is decreased so that the distance between the system and the object and the relative velocity between the system and the object can be obtained.

Figure 37:
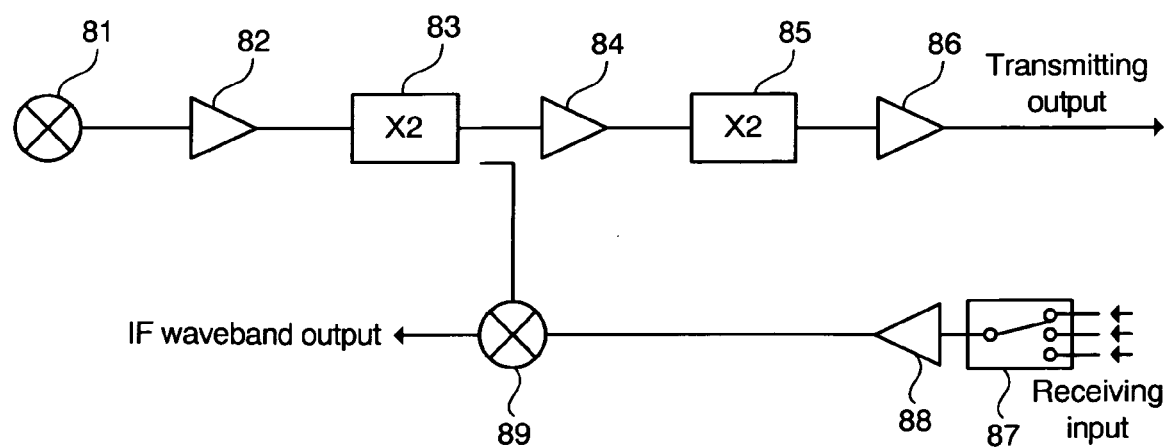
FIG. 37 is a structural view showing the structure of a millimeter waveband in-vehicle radar of FM-CW system.

FIG. 37 is a structural view showing the structure of a millimeter waveband in-vehicle radar of FM-CW system. The FM-CW system is operated under a prescribed frequency. At transmission, a transmitting output is irradiated through an oscillator 81 of 19 GHz waveband, an electric power amplifier 82 of 19 GHz waveband, a frequency attenuator 83 of 19/38 GHz waveband, an electric power amplifier 84 of 38 GHz waveband, a frequency attenuator 85 of 38/76 GHz waveband, and an electric power amplifier 86 of 76 GHz waveband in turn. At reception, an IF waveband output is received at a switch 87 of 76 GHz waveband, and transmitted to a reception mixer 89 via a low noise amplifier 88 of 76 GHz waveband.

Figure 38:
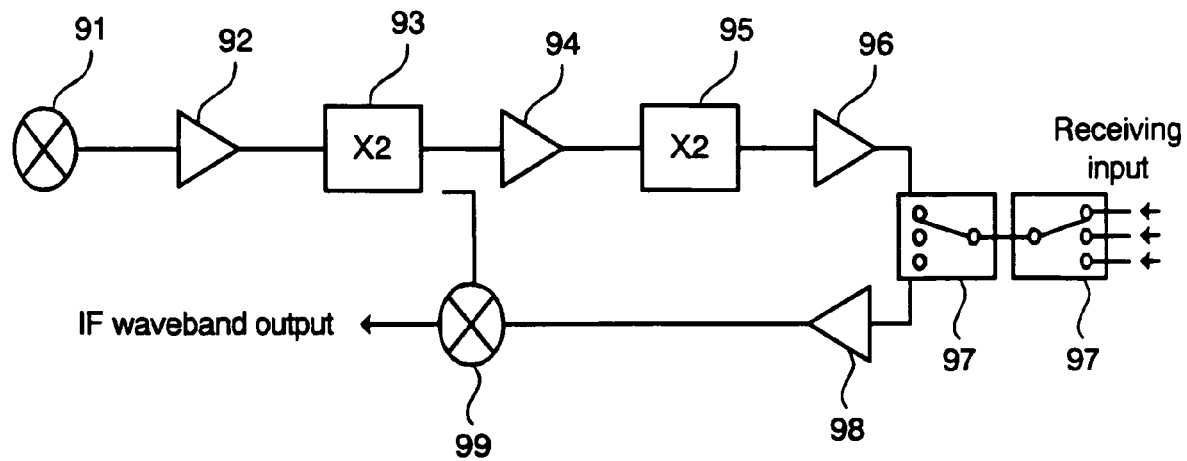
FIG. 38 is a structural view showing the structure of a millimeter waveband in-vehicle radar of pulsed Doppler system.

FIG. 38 is a structural view showing the structure of a millimeter waveband in-vehicle radar of pulsed Doppler system. At transmission, a transmitting output is irradiated through an oscillator 91 of 19 GHz waveband, an electric power amplifier 92 of 19 GHz waveband, a frequency attenuator 93 of 19/38 GHz waveband, an electric power amplifier 94 of 38 GHz waveband, a frequency attenuator 95 of 38/76 GHz waveband, and an electric power amplifier 96 of 76 GHz waveband in turn. At reception, an IF waveband output is received at a switch 97 of 76 GHz waveband, and transmitted to a reception mixer 99 via a low noise amplifier 98 of 76 GHz waveband.

If the oscillators 81 and 91 in FIGS. 37 and 38 are constituted from high frequency oscillators as shown in FIG. 22, respectively, the in-vehicle radars can be simplified, downsized and reduced in cost due to the simplification. The frequency range to be employed is not limited as described in the embodiments, but can be set within a prescribed range of several ten GHz through several hundred GHz to several THz in accordance with the use of the radar.

Figure 39:
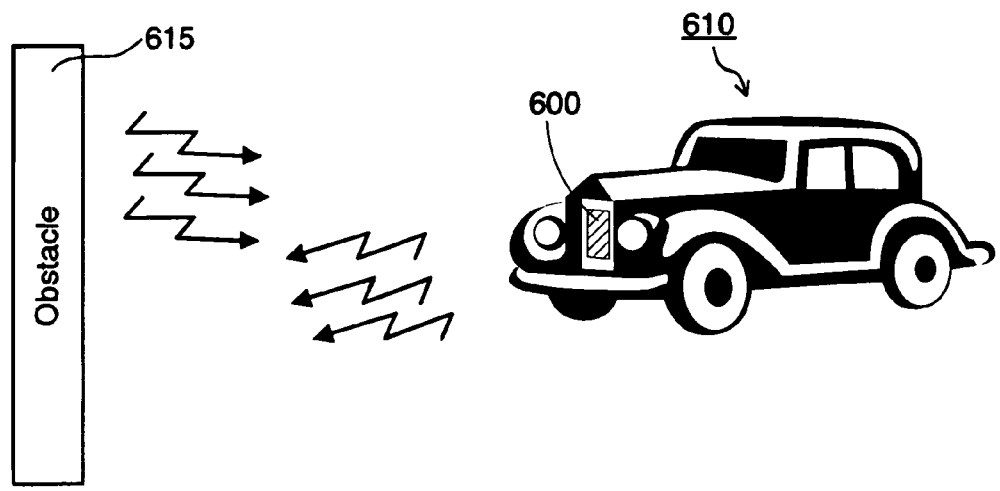
FIG. 39 is a schematic view showing a vehicle with the in-vehicle radar therein according to an embodiment.

FIG. 39 is a schematic view showing a vehicle 600 with the in-vehicle radar 600 therein according to an embodiment. According to the embodiment, the distance between the vehicle 610 and an obstacle 610 and the relative velocity between the vehicle 610 and the obstacle 615 can be obtained.

It is difficult that a conventional in-vehicle radar can be downsized so that the mounting position of the radar is restricted. For example, when the radar is mounted on the front grill of the vehicle, the mounting position of the radar is too low to detect the position of a truck vehicle under good condition. In contrast, the radar according to the embodiment can be downsized so as to be able to be mounted on the front grill, the front bonnet and the front glass of the vehicle. When the radar is mounted in the inside of the vehicle, the radar does not require a specific protective structure for keeping out wind, rain and snow so that the cost of the radar can be reduced remarkably. In this point of view, the radar can be mounted in a low-end car.

Figure 40:
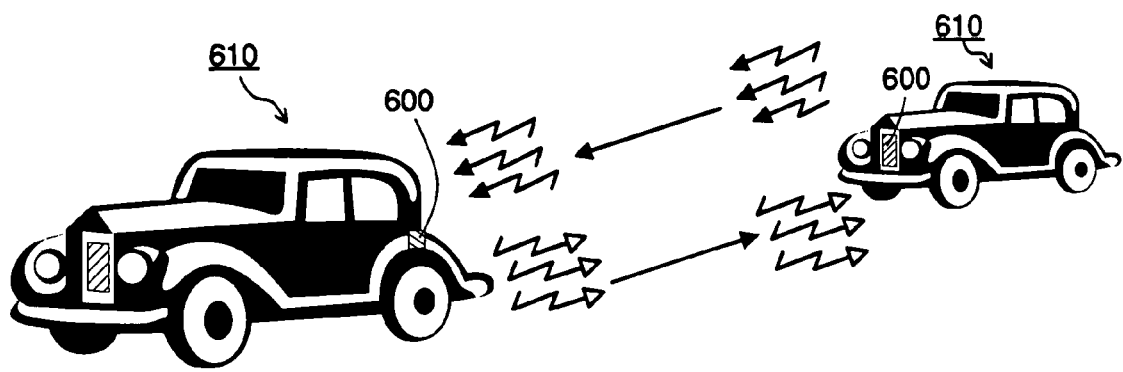
FIG. 40 is a schematic view showing a vehicle with an inter-vehicle gap communication device according to an embodiment.

FIG. 40 is a schematic view showing a vehicle with an inter-vehicle gap communication device according to an embodiment. In this embodiment, the in-vehicle radars 600 are mounted in the front of the backward vehicle 610 and the back of the forward vehicle 610, respectively. In this case, two-way communication can be conducted between the vehicles 610 so that the vehicles 610 can drive under the condition that the distance between the vehicles 610 can be maintained constant, thereby realizing ITS (Intelligent Transport System). Since the communication device can be downsized, the freedom degree of mounting position of the communication device can be enlarged. Then, since the communication device does not require a specific protective structure for keeping out window, rain and snow, the cost of the communication device can be reduced remarkably.

(Inter-Digital Assistant Communication Device)

Figure 41:
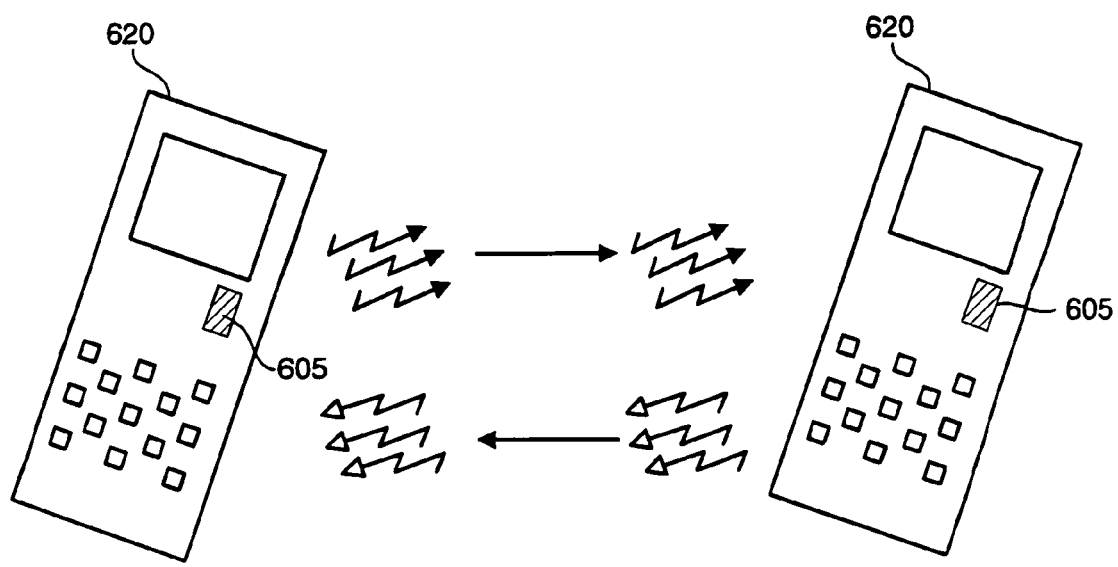
FIG. 41 is a structural view showing an inter-digital assistant communication device.

FIG. 41 is a structural view showing an inter-digital assistant communication device. A transmitter/receiver 605 containing a high frequency oscillator according to the embodiment is mounted on a personal digital assistance 620 so as to conduct easy two-way close range communication. Large amount of information can be transmitted and received by the use of high frequency and high speed wireless communication can be conducted at close range, which is very convenient for users.

(Application of High Frequency Assist Magnetic Head)

The high frequency oscillator according to the embodiment can be applied for a high frequency assist magnetic head. The high frequency assist magnetic head utilizes an assisting magnetic field generated from the high frequency oscillator for an writing magnetic field of a magnetic recording medium (refer to Reference 1).

[Reference 1] The Magnetic Recording Conference (TMRC2007), Session B, Monday PM: Write Heads, B6, Microwave Assisted Magnetic Recording, Jian-Gang ZHU and Xiaochun ZHU Although the present invention was described in detail with reference to the above examples, this invention is not limited to the above disclosure and every kind of variation and modification may be made without departing from the scope of the present invention.

In the embodiment, for example, the first opening 11A of the first insulating layer 11 is disposed opposite to the second opening 12A of the second insulating layer 12, but such an arrangement as shown in the embodiment is not always required. It is not required that the first opening 11A is opposite to the second opening 12A only if the electrons taken in the film structure 10 or 20 via the second conductor 14 formed in the first opening 11A are emitted via the third conductor 15 formed in the second opening 12A.

What is claimed is:

1. A magnetic multilayered film current element, comprising:
   at least one magnetic layer;
   at least one film structure containing a first insulating layer where a first opening is formed, a second insulating layer where a second opening is formed and a conductor disposed between said first insulating layer and said second insulating layer under the condition that a distance "A" between said first insulating layer and a portion of said second insulating layer is set larger than a distance "B" between said first insulating layer and the other portion of said second insulating layer; and
   a pair of electrodes for flowing current to a magnetic multilayered film containing said at least one magnetic layer and said at least one film structure along a stacking direction of said magnetic multilayered film.

2. The magnetic multilayered film current element as set forth in claim 1,
   wherein said distance "A" and said closest distance "B" satisfies a relation of A/2>B.

3. The magnetic multilayered film current element as set forth in claim 1,
   wherein said closest distance "B" is set to zero so that said first insulating layer is partially connected with said second insulating layer.

4. The magnetic multilayered film current element as set forth in claim 1,
   wherein said conductor includes ferromagnetic metal.

5. The magnetic multilayered film structure element as set forth in claim 1,
   wherein said conductor includes non-magnetic metal.

6. The magnetic multilayered film current element as set forth in claim 1,
   wherein said conductor includes a multilayered structure made of a ferromagnetic metal layer and a non-magnetic metal layer.

7. The magnetic multilayered film current element as set forth in claim 1,
   wherein said conductor includes at least one element selected from the group consisting of Co, Fe, Ni, Cu, Au, Ag, Rh, Ru, Mn, Cr, Re, Os, Ir and Pd.

8. The magnetic multilayered film current element as set forth in claim 1,
   wherein said conductor includes crystalline metal.

9. The magnetic multilayered film current element as set forth in claim 1,
   wherein a thickness of said conductor is set to a diffusion length or less of electron in said conductor.

10. The magnetic multilayered film structure as set forth in claim 1,
    wherein said thickness of said conductor is set to 5 nm or less.

11. The magnetic multilayered film current element as set forth in claim 1,
    wherein a diameter of said conductor parallel to a film surface of said conductor is set to 10 nm or less.

12. The magnetic multilayered film current element as set forth in claim 1,
    wherein at least one of said first insulating layer and said second insulating layer includes at least one selected from the group consisting of an oxide, a nitride and an oxynitride which include at least one element selected from the group consisting of Al, Ta, Hf, Cr, Zr, Ti, Si, W, V, Mg, Mo, Fe, Ni and Co.

13. The magnetic multilayered film current element as set forth in claim 1,
wherein a layer containing at least one element selected from the group consisting of Co, Fe, Ni, Cu, Au, Ag, Rh, Ru, Mn, Cr, Re, Os, Ir and Pd is formed in at least one of said first opening and said second opening.

14. The magnetic multilayered film current element as set forth in claim 1,
wherein diameters of said first opening and said second opening are set to 5 nm or less, respectively.

15. The magnetic multilayered film current element as set forth in claim 1,
wherein said at least one magnetic layer includes a first magnetic layer and a second magnetic layer which are subsequently stacked via a spacer layer,
wherein said magnetic multilayered structure includes said first magnetic layer, said second magnetic layer, said spacer layer and said film structure.

16. The magnetic multilayered film current element as set forth in claim 15,
wherein said film structure is disposed in at least a portion of said first magnetic layer, said spacer layer and said second magnetic layer.

17. The magnetic multilayered film current element as set forth in claim 16,
wherein said film structure is disposed in at least one of said first magnetic layer and said second magnetic layer.

18. The magnetic multilayered film current element as set forth in claim 16,
wherein said film structure is disposed in said spacer layer.

19. The magnetic multilayered film current element as set forth in claim 15,
wherein said film structure is disposed over said first magnetic layer and said spacer layer so as to contain an interface there between or over said second magnetic layer and said spacer layer so as to contain an interface there between.

20. A magnetic head comprising a magnetic multilayered film current element as set forth in claim 19 as a magneto-resistance effect element.

21. A magnetic disk device comprising a magnetic head as set forth in claim 20.

22. The magnetic multilayered film current element as set forth in claim 15,
wherein said film structure is disposed over said first magnetic layer, said spacer layer and said second magnetic layer so as to contain interfaces there between.

23. A magnetic head comprising a magnetic multilayered film current element as set forth in claim 22 as a high frequency oscillator.

24. The magnetic multilayered film current element as set forth in claim 15,
wherein one of said first magnetic layer and said second magnetic layer functions as a fixed magnetization layer of which a magnetization is substantially fixed in one direction and the other of said first magnetic layer and said second magnetic layer functions as a free magnetization layer of which a magnetization is changed in accordance with an external magnetic field so that said magnetic multilayered film current element can functions as a magneto-resistance effect element of which a resistance is changed in accordance with an external magnetic field.

25. A magnetic disk device comprising a magnetic head as set forth in claim 24.

26. The magnetic multilayered film current element as set forth in claim 15,
wherein one of said first magnetic layer and said second magnetic layer functions as a fixed magnetization layer of which a magnetization is substantially fixed in one direction and the other of said first magnetic layer and said second magnetic layer functions as a magnetic oscillating layer so as to cause magnetic oscillation by flowing current therein so that said magnetic multilayered film current element can function as high frequency oscillator.

27. A magnetic multilayered film current element, comprising:
at least one magnetic layer;
at least one film structure containing a first insulating layer where a first opening is formed, a second insulating layer where a second opening is formed and a conductor disposed between said first insulating layer and said second insulating layer under the condition that said first insulating layer is partially connected with said second insulating layer and an area of said conductor in a direction parallel to a film surface thereof is set larger than areas of said first opening and said second opening.

* * * * *